(12) United States Patent
Lutgen et al.

(10) Patent No.: US 11,569,091 B2
(45) Date of Patent: Jan. 31, 2023

(54) HYBRID-BONDED AND RUN-OUT COMPENSATED LIGHT EMITTING DIODES

(71) Applicant: Meta Platforms Technologies, LLC, Menlo Park, CA (US)

(72) Inventors: Stephan Lutgen, Dresden (DE); Thomas Lauermann, Cork (IE)

(73) Assignee: Meta Platforms Technologies, LLC, Menlo Park, CA (US)

( * ) Notice: Subject to any disclaimer, the term of this patent is extended or adjusted under 35 U.S.C. 154(b) by 238 days.

(21) Appl. No.: 16/863,572

(22) Filed: Apr. 30, 2020

(65) Prior Publication Data

US 2020/0357972 A1 Nov. 12, 2020

Related U.S. Application Data

(60) Provisional application No. 62/844,558, filed on May 7, 2019.

(51) Int. Cl.
*H01L 21/20* (2006.01)
*H01L 33/62* (2010.01)
(Continued)

(52) U.S. Cl.
CPC ...... *H01L 21/2007* (2013.01); *G02B 27/0172* (2013.01); *H01L 27/156* (2013.01);
(Continued)

(58) Field of Classification Search
CPC ......... H01L 2224/4852; H01L 21/2007; H01L 27/156; H01L 33/0062; H01L 33/0066;
(Continued)

(56) References Cited

U.S. PATENT DOCUMENTS 8,163,581 B1* 4/2012 Or-Bach ............. H01L 31/0725
438/93
8,283,215 B2* 10/2012 Or-Bach ............. H01L 31/1844
438/164

(Continued)

OTHER PUBLICATIONS

A. Jouve et al. ("1μm Pitch direct hybrid bonding with <300nm wafer-to-wafer overlay accuracy," 2017 IEEE SOI-3D-Subthreshold Microelectronics Technology Unified Conference (S3S), 2017, pp. 1-2) (Year: 2017).*

(Continued)

*Primary Examiner* — Stephen M Bradley
(74) *Attorney, Agent, or Firm* — Weaver Austin Villeneuve & Sampson LLP

(57) ABSTRACT

Disclosed herein are techniques for bonding components of LEDs. According to certain embodiments, a device includes a first component and a second component. The first component includes a semiconductor layer stack having an n-side semiconductor layer, an active light emitting layer, and a p-side semiconductor layer. The semiconductor layer stack includes a III-V semiconductor material. The second component includes a passive or an active matrix integrated circuit within a Si layer. A first dielectric material of the first component is bonded to a second dielectric material of the second component. First contacts of the first component are aligned with and bonded to second contacts of the second component. The first contacts of the first component form a first pattern within the first dielectric material of the first component, and the second contacts of the second component form a second pattern within the second dielectric material of the second component.

16 Claims, 37 Drawing Sheets

(51) Int. Cl.
 H01L 33/02 (2010.01)
 H01L 27/15 (2006.01)
 H01L 33/00 (2010.01)
 G02B 27/01 (2006.01)
 H01L 33/32 (2010.01)
 H01L 33/50 (2010.01)
 H01L 33/60 (2010.01)

(52) U.S. Cl.
 CPC ...... *H01L 33/0062* (2013.01); *H01L 33/0066* (2013.01); *H01L 33/0093* (2020.05); *H01L 33/025* (2013.01); *H01L 33/32* (2013.01); *H01L 33/502* (2013.01); *H01L 33/60* (2013.01); *H01L 33/62* (2013.01); *G02B 2027/0116* (2013.01); *G02B 2027/0178* (2013.01); *H01L 2224/4852* (2013.01)

(58) Field of Classification Search
 CPC ... H01L 33/0093; H01L 33/025; H01L 33/32; H01L 33/502; H01L 33/60; H01L 33/62; H01L 33/44; G02B 27/0172; G02B 2027/0116; G02B 2027/0178; G02B 26/0833; G02B 26/101; G02B 27/4272; G02B 2027/0134; G02B 2027/0138; G02B 2027/014; G02B 27/0093
 See application file for complete search history.

(56) References Cited

U.S. PATENT DOCUMENTS

| | | | |
|---|---|---|---|
| 9,197,804 B1* | 11/2015 | Or-Bach | H04N 5/2253 |
| 9,650,723 B1 | 5/2017 | D'Evelyn et al. | |
| 9,941,319 B2* | 4/2018 | Or-Bach | H01L 27/14623 |
| 10,516,076 B2 | 12/2019 | Anderson et al. | |
| 11,031,527 B2 | 6/2021 | Check | |
| 2004/0235212 A1 | 11/2004 | Ishizaki | |
| 2007/0096130 A1* | 5/2007 | Schiaffino | H01L 33/382 257/E33.074 |
| 2010/0317132 A1 | 12/2010 | Rogers et al. | |
| 2011/0096134 A1 | 4/2011 | Kang et al. | |
| 2015/0236201 A1 | 8/2015 | Shepherd | |
| 2016/0197232 A1* | 7/2016 | Bour | H01L 33/44 257/13 |
| 2017/0068362 A1* | 3/2017 | Den Boer | G09G 3/32 |
| 2017/0148777 A1 | 5/2017 | Bono et al. | |
| 2017/0345690 A1* | 11/2017 | Lindner | H01L 21/67092 |
| 2018/0114800 A1 | 4/2018 | Pan | |
| 2019/0057959 A1* | 2/2019 | Or-Bach | H01L 23/481 |
| 2019/0088633 A1 | 3/2019 | Tao et al. | |
| 2019/0189603 A1* | 6/2019 | Wang | H01L 24/83 |
| 2019/0214257 A1 | 7/2019 | Lin | |
| 2019/0355706 A1 | 11/2019 | Enquist et al. | |
| 2020/0058837 A1* | 2/2020 | Gasse | H01L 27/1469 |
| 2020/0168580 A1* | 5/2020 | Zinner | H01L 24/83 |
| 2020/0357952 A1 | 11/2020 | Lutgen et al. | |
| 2020/0357954 A1 | 11/2020 | Lutgen et al. | |
| 2020/0357968 A1 | 11/2020 | Lutgen et al. | |

OTHER PUBLICATIONS

A. W. Topol et al. ("Enabling SOI-based assembly technology for three-dimensional (3d) integrated circuits (ICs)," IEEE International Electron Devices Meeting, 2005. IEDM Technical Digest., 2005, pp. 352-355) (Year: 2005).*
Notice of Allowance dated May 4, 2022 for U.S. Appl. No. 16/863,576, filed Apr. 30, 2020, 09 pages.
Final Office Action dated Apr. 4, 2022 for U.S. Appl. No. 16/863,576, filed Apr. 30, 2020, 16 pages.
U.S. Notice of Allowance dated Jul. 12, 2021 in U.S. Appl. No. 16/863,589.
Non-Final Office Action dated Dec. 8, 2021 for U.S. Appl. No. 16/863,576, filed Apr. 30, 2020, 14 pages.
Notice of Allowance dated Feb. 9, 2022 for U.S. Appl. No. 16/863,579, filed Apr. 30, 2020, 13 Pages.

* cited by examiner

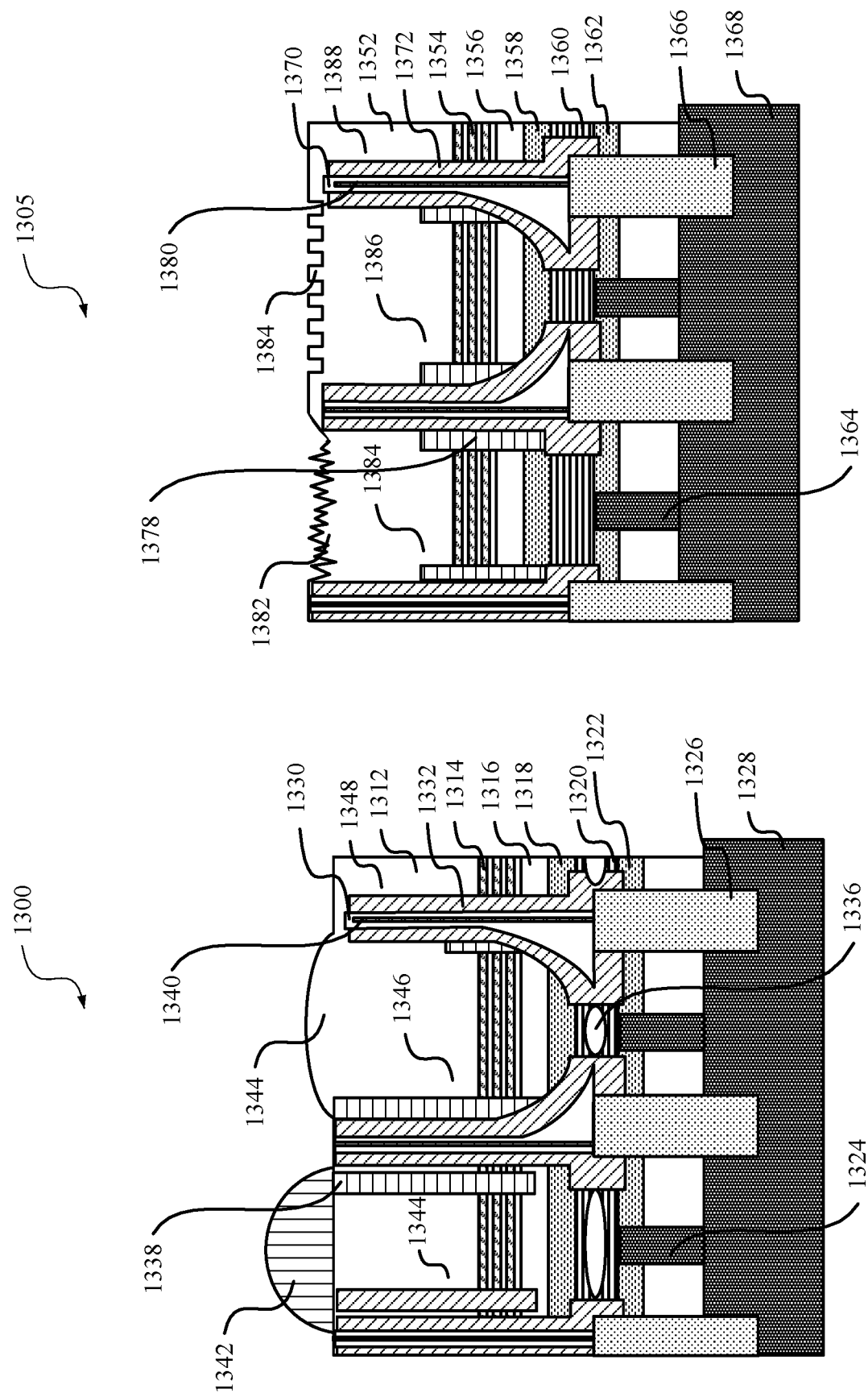

HYBRID-BONDED AND RUN-OUT COMPENSATED LIGHT EMITTING DIODES

CROSS-REFERENCE TO RELATED APPLICATION

This application claims priority under 35 U.S.C. § 119 to U.S. Provisional Patent Application No. 62/844,558, filed on May 7, 2019, the contents of which are hereby incorporated by reference in their entirety for all purposes.

BACKGROUND

Light emitting diodes (LEDs) convert electrical energy into optical energy, and offer many benefits over other light sources, such as reduced size, improved durability, and increased efficiency. LEDs can be used as light sources in many display systems, such as televisions, computer monitors, laptop computers, tablets, smartphones, projection systems, and wearable electronic devices. Micro-LEDs ("µLEDs") based on III-nitride semiconductors, such as alloys of AlN, GaN, InN, and the like, have begun to be developed for various display applications due to their small size (e.g., with a linear dimension less than 100 µm, less than 50 µm, less than 10 µm, or less than 5 µm), high packing density (and hence higher resolution), and high brightness. For example, micro-LEDs that emit light of different colors (e.g., red, green, and blue) can be used to form the sub-pixels of a display system, such as a television or a near-eye display system.

SUMMARY

This disclosure relates generally to LEDs. More specifically, this disclosure relates to methods of bonding components of LEDs, and devices that are formed by the bonding methods. According to some embodiments, a device includes a first component and a second component. The first component includes a semiconductor layer stack having an n-side semiconductor layer, an active light emitting layer, and a p-side semiconductor layer. The semiconductor layer stack includes a III-V semiconductor material. The second component includes a passive or an active matrix integrated circuit within a Si layer. A first dielectric material of the first component is bonded to a second dielectric material of the second component. First contacts of the first component are aligned with and bonded to second contacts of the second component. The first contacts of the first component form a first pattern within the first dielectric material of the first component, and the second contacts of the second component form a second pattern within the second dielectric material of the second component.

A surface of the first contacts, the second contacts, the first dielectric material, and/or the second dielectric material may be planarized. A thickness of the semiconductor layer stack may be less than 2 µm. The first dielectric material of the first component may be bonded to the second dielectric material of the second component by a dielectric bond. The first dielectric material and the second dielectric material may include at least one of SiCN, $SiO_2$, SiN, $Al_2O_3$, $HfO_2$, $ZrO_2$, and/or $Ta_2O_5$.

The first contacts of the first component may be bonded to the second contacts of the second component by a metal-to-metal bond. The first contacts of the first component and the second contacts of the second component may include Cu, Au, Al, W, Mo, Ag, Ni, Ti, Pt, and/or Pd. The semiconductor layer stack may include (AlGaIn)P, (AlGaIn)AsP, (AlGaIn)AsN, (AlGaIn)PAs, (Eu:InGa)N, and/or (AlGaIn)N.

According to some embodiments, a method includes aligning a first component with a second component by aligning first contacts of the first component with second contacts of the second component, and performing hybrid bonding of the first component to the second component. The first component includes a semiconductor layer stack having an n-side semiconductor layer, an active light emitting layer, and a p-side semiconductor layer. The semiconductor layer stack includes a III-V semiconductor material, and the second component includes a passive or an active matrix integrated circuit within a Si layer. The hybrid bonding of the first component to the second component is performed by performing dielectric bonding of a first dielectric material of the first component with a second dielectric material of the second component at a first temperature, and subsequently performing metal bonding of the first contacts of the first component with the second contacts of the second component by annealing the first contacts and the second contacts at a second temperature. The second temperature is higher than the first temperature, the first contacts of the first component form a first pattern within the first dielectric material of the first component, and the second contacts of the second component form a second pattern within the second dielectric material of the second component.

A thermal expansion coefficient of the first contacts may be higher than a thermal expansion coefficient of the first dielectric material, and a thermal expansion coefficient of the second contacts may be higher than a thermal expansion coefficient of the second dielectric material. The method may also include planarizing a surface of the first contacts, the second contacts, the first dielectric material, and/or the second dielectric material before performing the hybrid bonding of the first component to the second component.

An overlay between the first contacts of the first component and the second contacts of the second component may be less than 200 nm. Performing the dielectric bonding may include performing plasma activation of the first dielectric material and the second dielectric material. The first dielectric material and the second dielectric material may include SiCN, $SiO_2$, SiN, $Al_2O_3$, $HfO_2$, $ZrO_2$, and/or $Ta_2O_5$. The first dielectric material and the second dielectric material may have high dangling bond strengths at temperatures equal to or greater than an ambient temperature.

Annealing the first contacts and the second contacts may form a metal-to-metal bond between the first contacts of the first component and the second contacts of the second component. Annealing the first contacts and the second contacts may include performing local area thermo-compression bonding of the first contacts and the second contacts, and the second temperature may be between 150° C. and 250° C.

A p-contact and an n-contact of the second component may be configured to drive a one-dimensional array or a two-dimensional array of micro-LEDs of the first component. The first contacts of the first component and the second contacts of the second component may include Cu, Au, Al, W, Mo, Ag, Ni, Ti, Pt, and/or Pd. The semiconductor layer stack may include (AlGaIn)P, (AlGaIn)AsP, (AlGaIn)AsN, (AlGaIn)PAs, (Eu:InGa)N, and/or (AlGaIn)N. The first component may include a large LED, a mini LED, a micro-LED, a tapered LED, a laser, or a superluminescent diode (SLED), and a first thermal expansion coefficient of the III-V semiconductor material may be different from a second thermal expansion coefficient of the Si layer.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIG. 13A illustrates an example of another LED array that may be formed according to certain embodiments of the hybrid bonding method described herein, and that may include secondary optics such as micro-lenses.

FIG. 13B illustrates an example of another LED array that may be formed according to certain embodiments of the hybrid bonding method described herein, and that may include secondary optics such as AR coatings and gratings.

Figure 1:
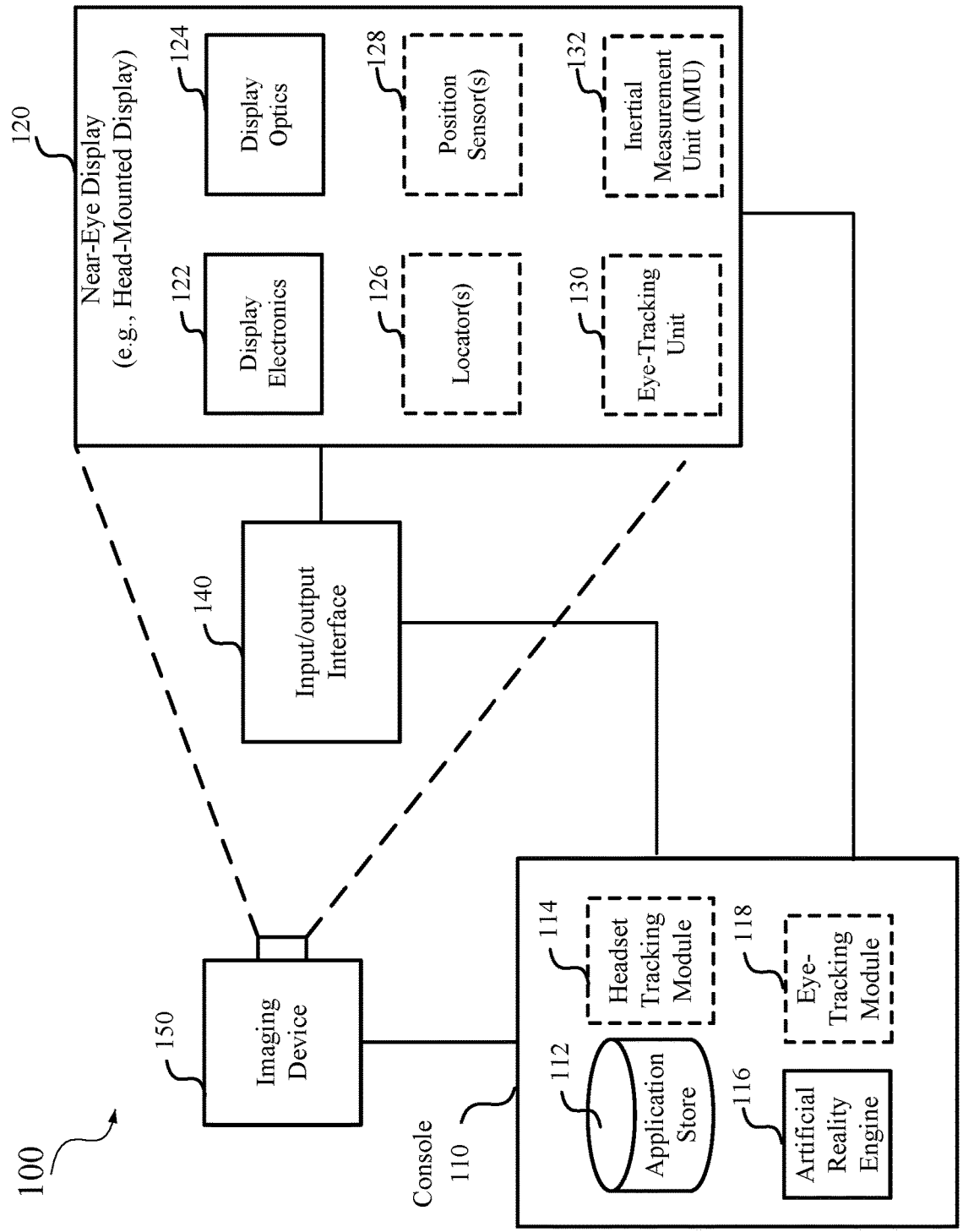
FIG. 1 is a simplified block diagram of an example of an artificial reality system environment including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

The LEDs described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using an LED-based display subsystem.

As used herein, the term "light emitting diode (LED)" refers to a light source that includes at least an n-type semiconductor layer, a p-type semiconductor layer, and a light emitting region (i.e., active region) between the n-type semiconductor layer and the p-type semiconductor layer. The light emitting region may include one or more semiconductor layers that form one or more heterostructures, such as quantum wells. In some embodiments, the light emitting region may include multiple semiconductor layers that form one or more multiple-quantum-wells (MQWs), each including multiple (e.g., about 2 to 6) quantum wells.

As used herein, the term "micro-LED" or "µLED" refers to an LED that has a chip where a linear dimension of the chip is less than about 200 µm, such as less than 100 µm, less than 50 µm, less than 20 µm, less than 10 µm, or smaller. For example, the linear dimension of a micro-LED may be as small as 6 µm, 5 µm, 4 µm, 2 µm, or smaller. Some micro-LEDs may have a linear dimension (e.g., length or diameter) comparable to the minority carrier diffusion length. However, the disclosure herein is not limited to micro-LEDs, and may also be applied to mini-LEDs and large LEDs.

As used herein, the term "bonding" may refer to various methods for physically and/or electrically connecting two or more devices and/or wafers, such as adhesive bonding, metal-to-metal bonding, metal oxide bonding, wafer-to-wafer bonding, die-to-wafer bonding, hybrid bonding, soldering, under-bump metallization, and the like. For example, adhesive bonding may use a curable adhesive (e.g., an epoxy) to physically bond two or more devices and/or wafers through adhesion. Metal-to-metal bonding may include, for example, wire bonding or flip chip bonding using soldering interfaces (e.g., pads or balls), conductive adhesive, or welded joints between metals. Metal oxide bonding may form a metal and oxide pattern on each surface, bond the oxide sections together, and then bond the metal sections together to create a conductive path. Wafer-to-wafer bonding may bond two wafers (e.g., silicon wafers or other semiconductor wafers) without any intermediate layers and is based on chemical bonds between the surfaces of the two wafers. Wafer-to-wafer bonding may include wafer cleaning and other preprocessing, aligning and pre-bonding at room temperature, and annealing at elevated temperatures, such as about 250° C. or higher. Die-to-wafer bonding may use bumps on one wafer to align features of a pre-formed chip with drivers of a wafer. Hybrid bonding may include, for example, wafer cleaning, high-precision alignment of contacts of one wafer with contacts of another wafer, dielectric bonding of dielectric materials within the wafers at room temperature, and metal bonding of the contacts by annealing at, for example, 250-300° C. or higher. As used herein, the term "bump" may refer generically to a metal interconnect used or formed during bonding.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140, each of which may be coupled to an optional console 110. While FIG. 1 shows an example of artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IMU 132, or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (µLED) display, an active-matrix OLED display (AMOLED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or any combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be an LED, a corner cube reflector, a reflective marker, a type of light source that contrasts with an environment in which near-eye display 120 operates, or any combination thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or any combination thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or any combination thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or any combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and an eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or any combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or any combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

Figure 2:
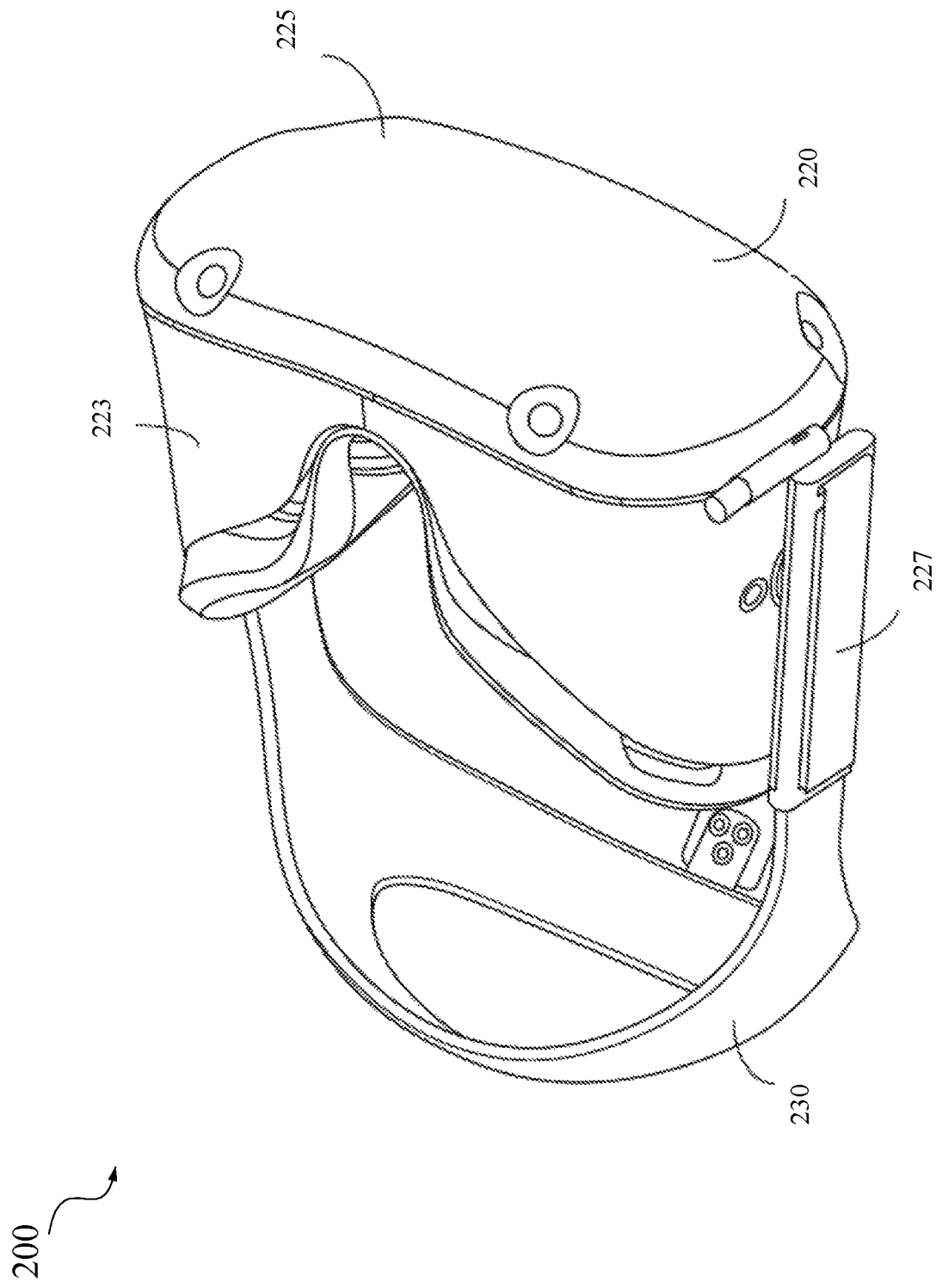
FIG. 2 is a perspective view of an example of a near-eye display in the form of a head-mounted display (HMD) device for implementing some of the examples disclosed herein.

FIG. 2 is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2 shows a bottom side 223, a front side 225, and a left side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 3 below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a μLED display, an AMOLED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
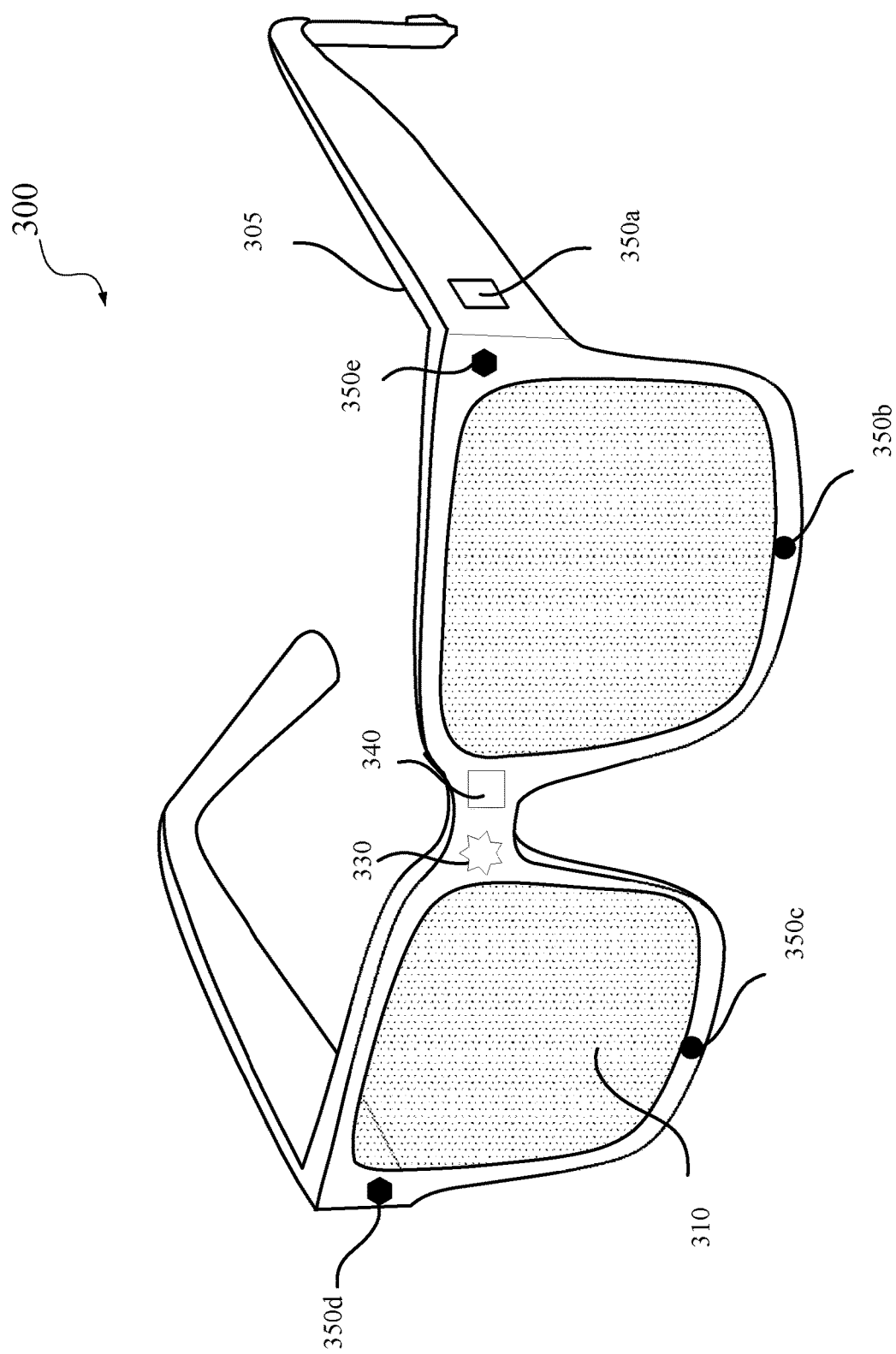
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350a, 350b, 350c, 350d, and 350e on or within frame 305. In some embodiments, sensors 350a-350e may include one or more depth sensors, motion sensors, position sensors, inertial sensors, or ambient light sensors. In some embodiments, sensors 350a-350e may include one or more image sensors configured to generate image data representing different fields of views in different directions. In some embodiments, sensors 350a-350e may be used as input devices to control or influence the displayed content of near-eye display 300, and/or to provide an interactive VR/AR/MR experience to a user of near-eye display 300. In some embodiments, sensors 350a-350e may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light patterns onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

Figure 4:
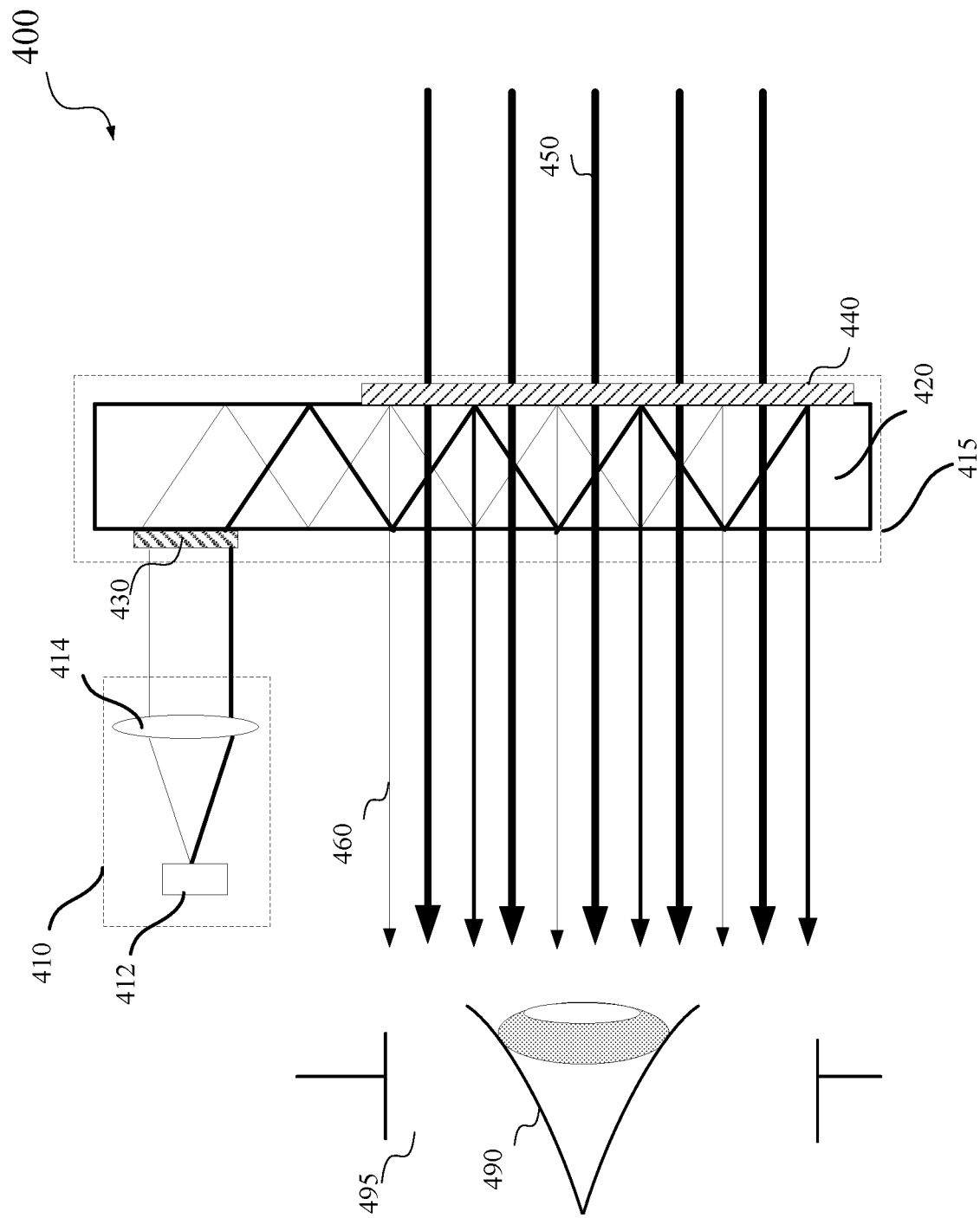
FIG. 4 illustrates an example of an optical see-through augmented reality system including a waveguide display according to certain embodiments.

FIG. 4 illustrates an example of an optical see-through augmented reality system 400 including a waveguide display according to certain embodiments. Augmented reality system 400 may include a projector 410 and a combiner 415. Projector 410 may include a light source or image source 412 and projector optics 414. In some embodiments, light source or image source 412 may include one or more micro-LED devices described above. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, an LED, and/or a micro-LED described above. In some embodiments, image source 412 may include a plurality of light sources (e.g., an array of micro-LEDs described above), each emitting a monochromatic image light corresponding to a primary color (e.g., red, green, or blue). In some embodiments, image source 412 may include three two-dimensional arrays of micro-LEDs, where each two-dimensional array of micro-LEDs may include micro-LEDs configured to emit light of a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. For example, in some embodiments, image source 412 may include one or more one-dimensional arrays or elongated two-dimensional arrays of micro-LEDs, and projector optics 414 may include one or more one-dimensional scanners (e.g., micro-mirrors or prisms) configured to scan the one-dimensional arrays or elongated two-dimensional arrays of micro-LEDs to generate image frames. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Combiner 415 may transmit at least 50% of light in a first wavelength range and reflect at least 25% of light in a second wavelength range. For example, the first wavelength range may be visible light from about 400 nm to about 650 nm, and the second wavelength range may be in the infrared band, for example, from about 800 nm to about 1000 nm. Input coupler 430 may include a volume holographic grating, a diffractive optical element (DOE) (e.g., a surface-relief grating), a slanted surface of substrate 420, or a refractive coupler (e.g., a wedge or a prism). For example, input coupler 430 may include a reflective volume Bragg grating or a transmissive volume Bragg grating. Input coupler 430 may have a coupling efficiency of greater than 30%, 50%, 75%, 90%, or higher for visible light. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 420 may be transparent to visible light.

Substrate 420 may include or may be coupled to a plurality of output couplers 440, each configured to extract at least a portion of the light guided by and propagating within substrate 420 from substrate 420, and direct extracted light 460 to an eyebox 495 where an eye 490 of the user of augmented reality system 400 may be located when augmented reality system 400 is in use. The plurality of output couplers 440 may replicate the exit pupil to increase the size of eyebox 495 such that the displayed image is visible in a larger area. As input coupler 430, output couplers 440 may include grating couplers (e.g., volume holographic gratings or surface-relief gratings), other diffraction optical elements (DOEs), prisms, etc. For example, output couplers 440 may include reflective volume Bragg gratings or transmissive volume Bragg gratings. Output couplers 440 may have different coupling (e.g., diffraction) efficiencies at different locations. Substrate 420 may also allow light 450 from the environment in front of combiner 415 to pass through with little or no loss. Output couplers 440 may also allow light 450 to pass through with little loss. For example, in some implementations, output couplers 440 may have a very low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 in certain desired directions (i.e., diffraction angles) with little loss. As a result, the user may be able to view combined images of the environment in front of combiner 415 and images of virtual objects projected by projector 410.

Figure 5B:
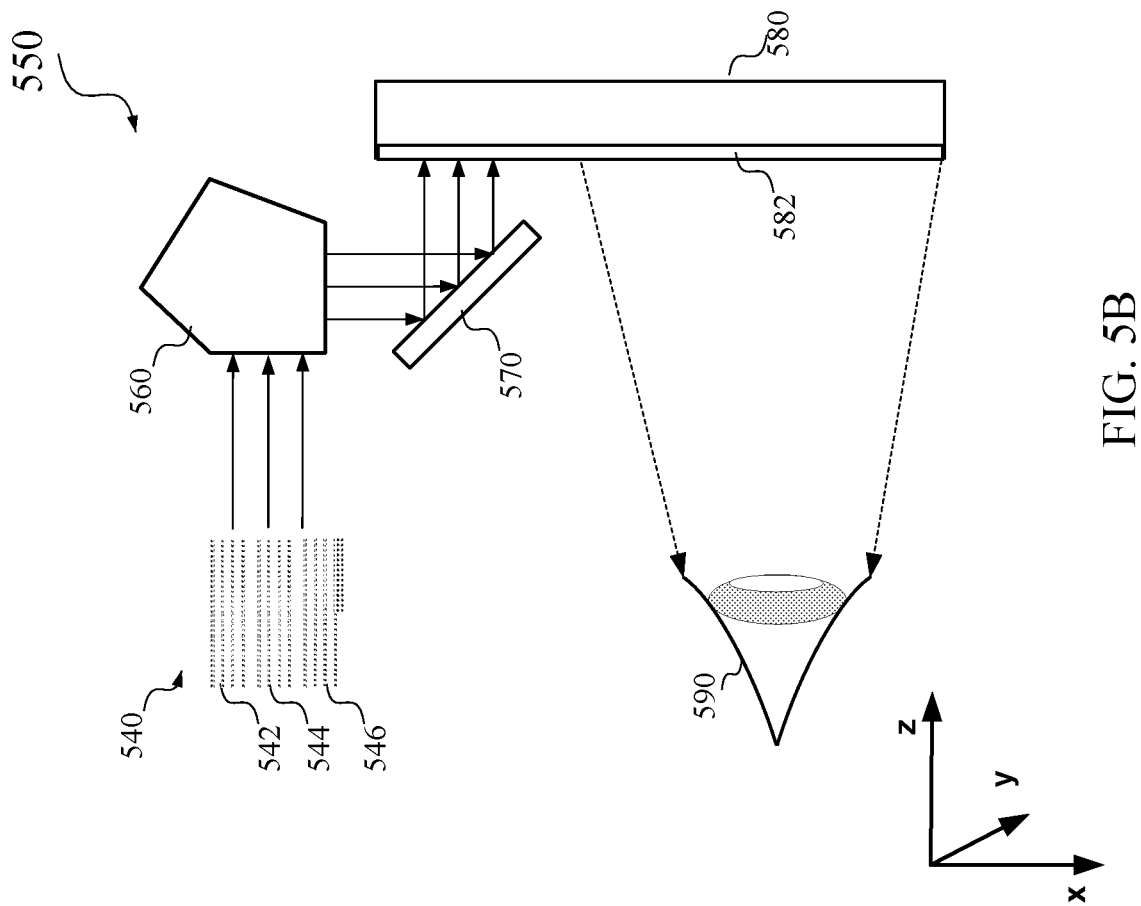
FIG. 5B illustrates an example of a near-eye display device including a waveguide display according to certain embodiments.
Figure 5A:
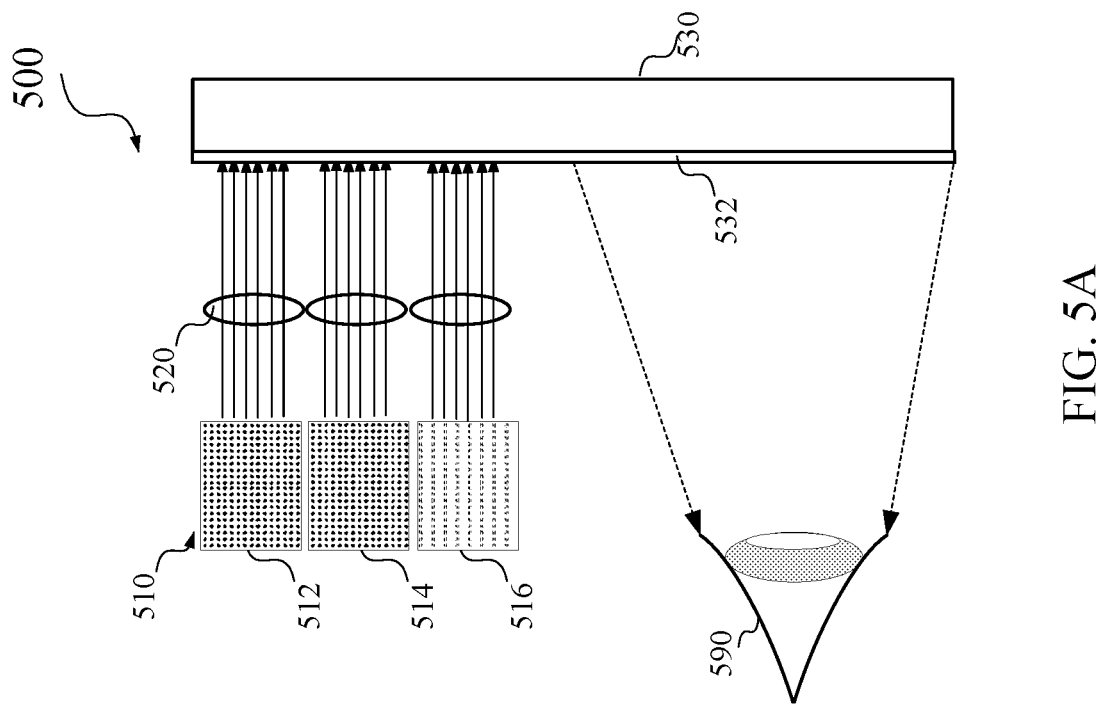
FIG. 5A illustrates an example of a near-eye display device including a waveguide display according to certain embodiments.

FIG. 5A illustrates an example of a near-eye display (NED) device 500 including a waveguide display 530 according to certain embodiments. NED device 500 may be an example of near-eye display 120, augmented reality system 400, or another type of display device. NED device 500 may include a light source 510, projection optics 520, and waveguide display 530. Light source 510 may include multiple panels of light emitters for different colors, such as a panel of red light emitters 512, a panel of green light emitters 514, and a panel of blue light emitters 516. The red light emitters 512 are organized into an array; the green light emitters 514 are organized into an array; and the blue light emitters 516 are organized into an array. The dimensions and pitches of light emitters in light source 510 may be small. For example, each light emitter may have a diameter less than 2 μm (e.g., about 1.2 μm) and the pitch may be less than 2 μm (e.g., about 1.5 μm). As such, the number of light emitters in each red light emitters 512, green light emitters 514, and blue light emitters 516 can be equal to or greater than the number of pixels in a display image, such as 960×720, 1280×720, 1440×1080, 1920×1080, 2160×1080, or 2560×1080 pixels. Thus, a display image may be generated simultaneously by light source 510. A scanning element may not be used in NED device 500.

Before reaching waveguide display 530, the light emitted by light source 510 may be conditioned by projection optics 520, which may include a lens array. Projection optics 520 may collimate or focus the light emitted by light source 510 to waveguide display 530, which may include a coupler 532 for coupling the light emitted by light source 510 into waveguide display 530. The light coupled into waveguide display 530 may propagate within waveguide display 530 through, for example, total internal reflection as described above with respect to FIG. 4. Coupler 532 may also couple portions of the light propagating within waveguide display 530 out of waveguide display 530 and towards user's eye 590.

FIG. 5B illustrates an example of a near-eye display (NED) device 550 including a waveguide display 580 according to certain embodiments. In some embodiments, NED device 550 may use a scanning mirror 570 to project light from a light source 540 to an image field where a user's eye 590 may be located. NED device 550 may be an example of near-eye display 120, augmented reality system 400, or another type of display device. Light source 540 may include one or more rows or one or more columns of light emitters of different colors, such as multiple rows of red light emitters 542, multiple rows of green light emitters 544, and multiple rows of blue light emitters 546. For example, red light emitters 542, green light emitters 544, and blue light emitters 546 may each include N rows, each row including, for example, 2560 light emitters (pixels). The red light emitters 542 are organized into an array; the green light emitters 544 are organized into an array; and the blue light emitters 546 are organized into an array. In some embodiments, light source 540 may include a single line of light emitters for each color. In some embodiments, light source 540 may include multiple columns of light emitters for each of red, green, and blue colors, where each column may include, for example, 1080 light emitters. In some embodiments, the dimensions and/or pitches of the light emitters in light source 540 may be relatively large (e.g., about 3-5 μm) and thus light source 540 may not include sufficient light emitters for simultaneously generating a full display image. For example, the number of light emitters for a single color may be fewer than the number of pixels (e.g., 2560×1080 pixels) in a display image. The light emitted by light source 540 may be a set of collimated or diverging beams of light.

Before reaching scanning mirror 570, the light emitted by light source 540 may be conditioned by various optical devices, such as collimating lenses or a freeform optical element 560. Freeform optical element 560 may include, for example, a multi-facet prism or another light folding element that may direct the light emitted by light source 540 towards scanning mirror 570, such as changing the propagation direction of the light emitted by light source 540 by, for example, about 90° or larger. In some embodiments, freeform optical element 560 may be rotatable to scan the light. Scanning mirror 570 and/or freeform optical element 560 may reflect and project the light emitted by light source 540 to waveguide display 580, which may include a coupler 582 for coupling the light emitted by light source 540 into waveguide display 580. The light coupled into waveguide display 580 may propagate within waveguide display 580 through, for example, total internal reflection as described above with respect to FIG. 4. Coupler 582 may also couple portions of the light propagating within waveguide display 580 out of waveguide display 580 and towards user's eye 590.

Scanning mirror 570 may include a microelectromechanical system (MEMS) mirror or any other suitable mirrors. Scanning mirror 570 may rotate to scan in one or two dimensions. As scanning mirror 570 rotates, the light emitted by light source 540 may be directed to a different area of waveguide display 580 such that a full display image may be projected onto waveguide display 580 and directed to user's eye 590 by waveguide display 580 in each scanning cycle. For example, in embodiments where light source 540 includes light emitters for all pixels in one or more rows or columns, scanning mirror 570 may be rotated in the column or row direction (e.g., x or y direction) to scan an image. In embodiments where light source 540 includes light emitters for some but not all pixels in one or more rows or columns, scanning mirror 570 may be rotated in both the row and column directions (e.g., both x and y directions) to project a display image (e.g., using a raster-type scanning pattern).

NED device 550 may operate in predefined display periods. A display period (e.g., display cycle) may refer to a duration of time in which a full image is scanned or projected. For example, a display period may be a reciprocal of the desired frame rate. In NED device 550 that includes scanning mirror 570, the display period may also be referred to as a scanning period or scanning cycle. The light generation by light source 540 may be synchronized with the rotation of scanning mirror 570. For example, each scanning cycle may include multiple scanning steps, where light source 540 may generate a different light pattern in each respective scanning step.

In each scanning cycle, as scanning mirror 570 rotates, a display image may be projected onto waveguide display 580 and user's eye 590. The actual color value and light intensity (e.g., brightness) of a given pixel location of the display image may be an average of the light beams of the three colors (e.g., red, green, and blue) illuminating the pixel location during the scanning period. After completing a scanning period, scanning mirror 570 may revert back to the initial position to project light for the first few rows of the next display image or may rotate in a reverse direction or scan pattern to project light for the next display image, where a new set of driving signals may be fed to light source 540. The same process may be repeated as scanning mirror 570 rotates in each scanning cycle. As such, different images may be projected to user's eye 590 in different scanning cycles.

Figure 6:
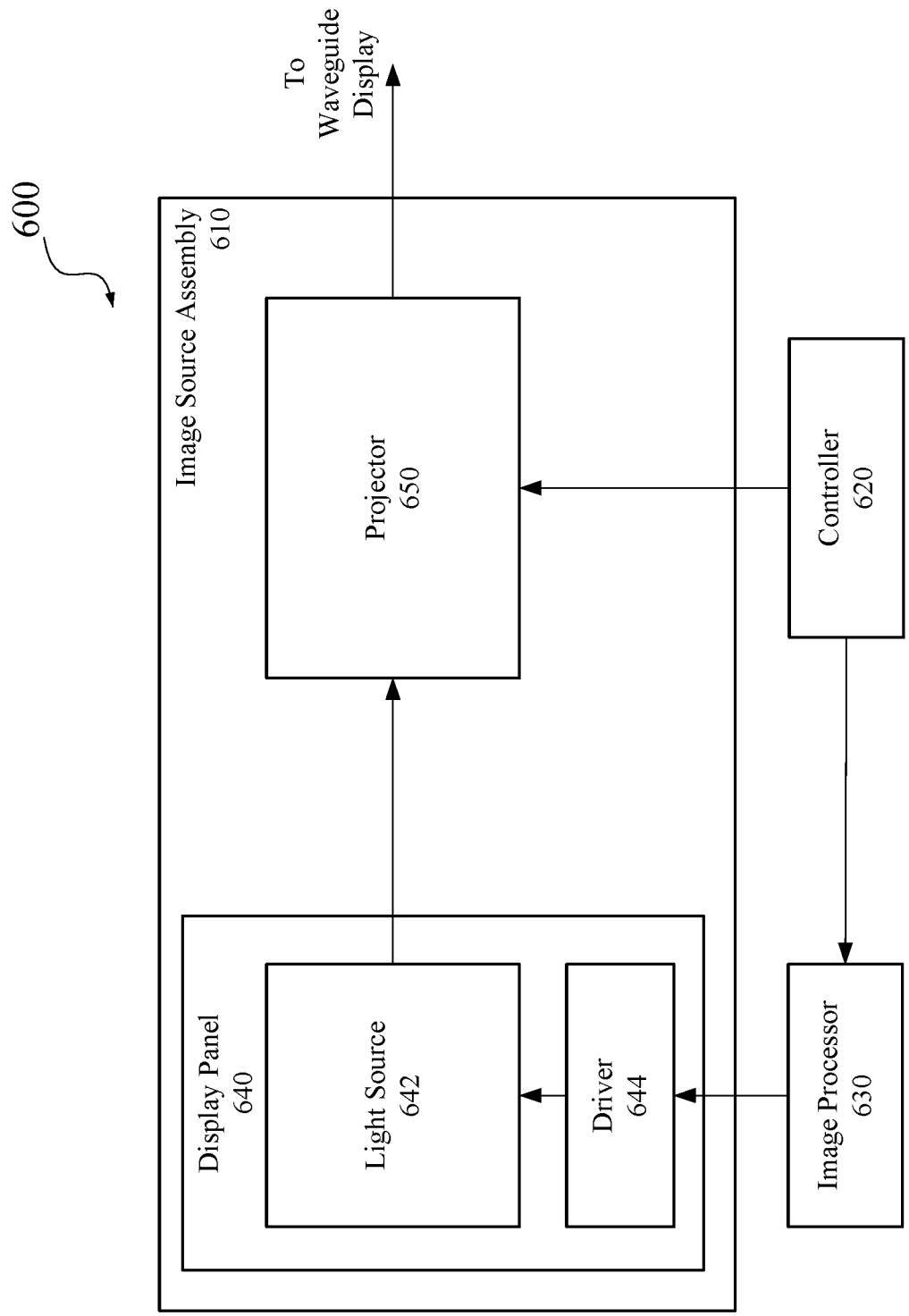
FIG. 6 illustrates an example of an image source assembly in an augmented reality system according to certain embodiments.

FIG. 6 illustrates an example of an image source assembly 610 in a near-eye display system 600 according to certain embodiments. Image source assembly 610 may include, for example, a display panel 640 that may generate display images to be projected to the user's eyes, and a projector 650 that may project the display images generated by display panel 640 to a waveguide display as described above with respect to FIGS. 4-5B. Display panel 640 may include a light source 642 and a driver circuit 644 for light source 642. Light source 642 may include, for example, light source 510 or 540. Projector 650 may include, for example, freeform optical element 560, scanning mirror 570, and/or projection optics 520 described above. Near-eye display system 600 may also include a controller 620 that synchronously controls light source 642 and projector 650 (e.g., scanning mirror 570). Image source assembly 610 may generate and output an image light to a waveguide display (not shown in FIG. 6), such as waveguide display 530 or 580. As described above, the waveguide display may receive the image light at one or more input-coupling elements, and guide the received image light to one or more output-coupling elements. The input and output coupling elements may include, for example, a diffraction grating, a holographic grating, a prism, or any combination thereof. The input-coupling element may be chosen such that total internal reflection occurs with the waveguide display. The output-coupling element may couple portions of the total internally reflected image light out of the waveguide display.

As described above, light source 642 may include a plurality of light emitters arranged in an array or a matrix. Each light emitter may emit monochromatic light, such as red light, blue light, green light, infra-red light, and the like. While RGB colors are often discussed in this disclosure, embodiments described herein are not limited to using red, green, and blue as primary colors. Other colors can also be used as the primary colors of near-eye display system 600. In some embodiments, a display panel in accordance with an embodiment may use more than three primary colors. Each pixel in light source 642 may include three subpixels that include a red micro-LED, a green micro-LED, and a blue micro-LED. A semiconductor LED generally includes an active light emitting layer within multiple layers of semiconductor materials. The multiple layers of semiconductor materials may include different compound materials or a same base material with different dopants and/or different doping densities. For example, the multiple layers of semiconductor materials may include an n-type material layer, an active region that may include hetero-structures (e.g., one or more quantum wells), and a p-type material layer. The multiple layers of semiconductor materials may be grown on a surface of a substrate having a certain orientation. In some embodiments, to increase light extraction efficiency, a mesa that includes at least some of the layers of semiconductor materials may be formed.

Controller 620 may control the image rendering operations of image source assembly 610, such as the operations of light source 642 and/or projector 650. For example, controller 620 may determine instructions for image source assembly 610 to render one or more display images. The instructions may include display instructions and scanning instructions. In some embodiments, the display instructions may include an image file (e.g., a bitmap file). The display instructions may be received from, for example, a console, such as console 110 described above with respect to FIG. 1. The scanning instructions may be used by image source assembly 610 to generate image light. The scanning instructions may specify, for example, a type of a source of image light (e.g., monochromatic or polychromatic), a scanning rate, an orientation of a scanning apparatus, one or more illumination parameters, or any combination thereof. Controller 620 may include a combination of hardware, software, and/or firmware not shown here so as not to obscure other aspects of the present disclosure.

In some embodiments, controller 620 may be a graphics processing unit (GPU) of a display device. In other embodiments, controller 620 may be other kinds of processors. The operations performed by controller 620 may include taking content for display and dividing the content into discrete sections. Controller 620 may provide to light source 642 scanning instructions that include an address corresponding to an individual source element of light source 642 and/or an electrical bias applied to the individual source element. Controller 620 may instruct light source 642 to sequentially present the discrete sections using light emitters corresponding to one or more rows of pixels in an image ultimately displayed to the user. Controller 620 may also instruct projector 650 to perform different adjustments of the light. For example, controller 620 may control projector 650 to scan the discrete sections to different areas of a coupling element of the waveguide display (e.g., waveguide display 580) as described above with respect to FIG. 5B. As such, at the exit pupil of the waveguide display, each discrete portion is presented in a different respective location. While each discrete section is presented at a different respective time, the presentation and scanning of the discrete sections occur fast enough such that a user's eye may integrate the different sections into a single image or series of images.

Image processor 630 may be a general-purpose processor and/or one or more application-specific circuits that are dedicated to performing the features described herein. In one embodiment, a general-purpose processor may be coupled to a memory to execute software instructions that cause the processor to perform certain processes described herein. In another embodiment, image processor 630 may be one or more circuits that are dedicated to performing certain features. While image processor 630 in FIG. 6 is shown as a stand-alone unit that is separate from controller 620 and driver circuit 644, image processor 630 may be a sub-unit of controller 620 or driver circuit 644 in other embodiments. In other words, in those embodiments, controller 620 or driver circuit 644 may perform various image processing functions of image processor 630. Image processor 630 may also be referred to as an image processing circuit.

In the example shown in FIG. 6, light source 642 may be driven by driver circuit 644, based on data or instructions (e.g., display and scanning instructions) sent from controller 620 or image processor 630. In one embodiment, driver circuit 644 may include a circuit panel that connects to and mechanically holds various light emitters of light source 642. Light source 642 may emit light in accordance with one or more illumination parameters that are set by the controller 620 and potentially adjusted by image processor 630 and driver circuit 644. An illumination parameter may be used by light source 642 to generate light. An illumination parameter may include, for example, source wavelength, pulse rate, pulse amplitude, beam type (continuous or pulsed), other parameter(s) that may affect the emitted light, or any combination thereof. In some embodiments, the source light generated by light source 642 may include multiple beams of red light, green light, and blue light, or any combination thereof.

Projector 650 may perform a set of optical functions, such as focusing, combining, conditioning, or scanning the image light generated by light source 642. In some embodiments, projector 650 may include a combining assembly, a light conditioning assembly, or a scanning mirror assembly. Projector 650 may include one or more optical components that optically adjust and potentially re-direct the light from light source 642. One example of the adjustment of light may include conditioning the light, such as expanding, collimating, correcting for one or more optical errors (e.g., field curvature, chromatic aberration, etc.), some other adjustments of the light, or any combination thereof. The optical components of projector 650 may include, for example, lenses, mirrors, apertures, gratings, or any combination thereof.

Projector 650 may redirect image light via its one or more reflective and/or refractive portions so that the image light is projected at certain orientations toward the waveguide display. The location where the image light is redirected toward the waveguide display may depend on specific orientations of the one or more reflective and/or refractive portions. In some embodiments, projector 650 includes a single scanning mirror that scans in at least two dimensions. In other embodiments, projector 650 may include a plurality of scanning mirrors that each scan in directions orthogonal to each other. Projector 650 may perform a raster scan (horizontally or vertically), a bi-resonant scan, or any combination thereof. In some embodiments, projector 650 may perform a controlled vibration along the horizontal and/or vertical directions with a specific frequency of oscillation to scan along two dimensions and generate a two-dimensional projected image of the media presented to user's eyes. In other embodiments, projector 650 may include a lens or prism that may serve similar or the same function as one or more scanning mirrors. In some embodiments, image source assembly 610 may not include a projector, where the light emitted by light source 642 may be directly incident on the waveguide display.

In semiconductor LEDs, photons are usually generated at a certain internal quantum efficiency through the recombination of electrons and holes within an active region (e.g., one or more semiconductor layers), where the internal quantum efficiency is the proportion of the radiative electron-hole recombination in the active region that emits photons. The generated light may then be extracted from the LEDs in a particular direction or within a particular solid angle. The ratio between the number of emitted photons extracted from an LED and the number of electrons passing through the LED is referred to as the external quantum efficiency, which describes how efficiently the LED converts injected electrons to photons that are extracted from the device.

The external quantum efficiency may be proportional to the injection efficiency, the internal quantum efficiency, and the extraction efficiency. The injection efficiency refers to the proportion of electrons passing through the device that are injected into the active region. The extraction efficiency is the proportion of photons generated in the active region that escape from the device. For LEDs, and in particular, micro-LEDs with reduced physical dimensions, improving the internal and external quantum efficiency and/or controlling the emission spectrum may be challenging. In some embodiments, to increase the light extraction efficiency, a mesa that includes at least some of the layers of semiconductor materials may be formed.

Figure 7A:
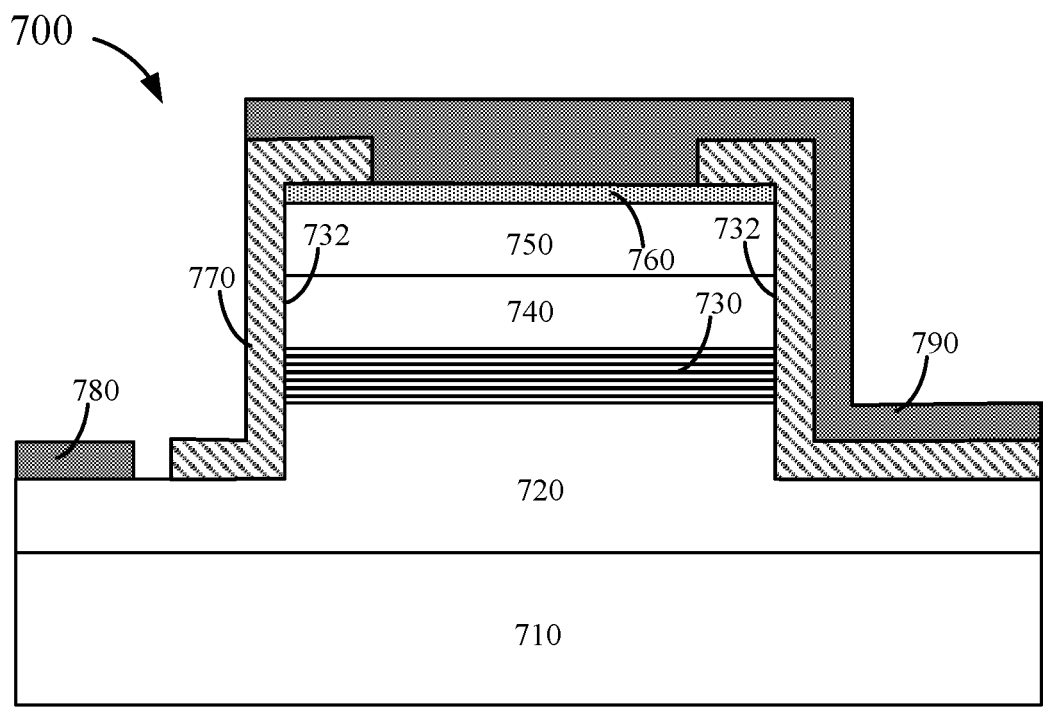
FIG. 7A illustrates an example of a light emitting diode (LED) having a vertical mesa structure according to certain embodiments.

FIG. 7A illustrates an example of an LED 700 having a vertical mesa structure. LED 700 may be a light emitter in light source 510, 540, or 642. LED 700 may be a micro-LED made of inorganic materials, such as multiple layers of semiconductor materials. The layered semiconductor light emitting device may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb). When the Group V element of the III-V semiconductor material includes nitrogen, the III-V semiconductor material is referred to as a III-nitride material. The layered semiconductor light emitting device may be manufactured by growing multiple epitaxial layers on a substrate using techniques such as vapor-phase epitaxy (VPE), liquid-phase epitaxy (LPE), molecular beam epitaxy (MBE), or metalorganic chemical vapor deposition (MOCVD). For example, the layers of the semiconductor materials may be grown layer-by-layer on a substrate with a certain crystal lattice orientation (e.g., polar, nonpolar, or semi-polar orientation), such as a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-$LiAlO_2$ structure, where the substrate may be cut in a specific direction to expose a specific plane as the growth surface.

In the example shown in FIG. 7A, LED 700 may include a substrate 710, which may include, for example, a sapphire substrate or a GaN substrate. A semiconductor layer 720 may be grown on substrate 710. Semiconductor layer 720 may include a III-V material, such as GaN, and may be p-doped (e.g., with Mg, Ca, Zn, or Be) or n-doped (e.g., with Si or Ge). One or more active layers 730 may be grown on semiconductor layer 720 to form an active region. Active layer 730 may include III-V materials, such as one or more InGaN layers, one or more AlInGaP layers, and/or one or more GaN layers, which may form one or more heterostructures, such as one or more quantum wells or MQWs. A semiconductor layer 740 may be grown on active layer 730. Semiconductor layer 740 may include a III-V material, such as GaN, and may be p-doped (e.g., with Mg, Ca, Zn, or Be) or n-doped (e.g., with Si or Ge). One of semiconductor layer 720 and semiconductor layer 740 may be a p-type layer and the other one may be an n-type layer. Semiconductor layer 720 and semiconductor layer 740 sandwich active layer 730 to form the light emitting region. For example, LED 700 may include a layer of InGaN situated between a layer of p-type GaN doped with magnesium and a layer of n-type GaN doped with silicon or oxygen. In some embodiments, LED 700 may include a layer of AlInGaP situated between a layer of p-type AlInGaP doped with zinc or magnesium and a layer of n-type AlInGaP doped with selenium, silicon, or tellurium.

In some embodiments, an electron-blocking layer (EBL) (not shown in FIG. 7A) may be grown to form a layer between active layer 730 and at least one of semiconductor layer 720 or semiconductor layer 740. The EBL may reduce the electron leakage current and improve the efficiency of the LED. In some embodiments, a heavily-doped semiconductor layer 750, such as a $P^+$ or $P^{++}$ semiconductor layer, may be formed on semiconductor layer 740 and act as a contact layer for forming an ohmic contact and reducing the contact impedance of the device. In some embodiments, a conductive layer 760 may be formed on heavily-doped semiconductor layer 750. Conductive layer 760 may include, for example, an indium tin oxide (ITO) or Al/Ni/Au film. In one example, conductive layer 760 may include a transparent ITO layer.

To make contact with semiconductor layer 720 (e.g., an n-GaN layer) and to more efficiently extract light emitted by active layer 730 from LED 700, the semiconductor material layers (including heavily-doped semiconductor layer 750, semiconductor layer 740, active layer 730, and semiconductor layer 720) may be etched to expose semiconductor layer 720 and to form a mesa structure that includes layers 720-760. The mesa structure may confine the carriers within the device. Etching the mesa structure may lead to the formation of mesa sidewalls 732 that may be orthogonal to the growth planes. A passivation layer 770 may be formed on sidewalls 732 of the mesa structure. Passivation layer 770 may include an oxide layer, such as a $SiO_2$ layer, and may act as a reflector to reflect emitted light out of LED 700. A contact layer 780, which may include a metal layer, such as Al, Au, Ni, Ti, or any combination thereof, may be formed on semiconductor layer 720 and may act as an electrode of LED 700. In addition, another contact layer 790, such as an Al/Ni/Au metal layer, may be formed on conductive layer 760 and may act as another electrode of LED 700.

When a voltage signal is applied to contact layers 780 and 790, electrons and holes may recombine in active layer 730, where the recombination of electrons and holes may cause photon emission. The wavelength and energy of the emitted photons may depend on the energy bandgap between the valence band and the conduction band in active layer 730. For example, InGaN active layers may emit green or blue light, AlGaN active layers may emit blue to ultraviolet light, while AlInGaP active layers may emit red, orange, yellow, or green light. The emitted photons may be reflected by passivation layer 770 and may exit LED 700 from the top (e.g., conductive layer 760 and contact layer 790) or bottom (e.g., substrate 710).

In some embodiments, LED 700 may include one or more other components, such as a lens, on the light emission surface, such as substrate 710, to focus or collimate the emitted light or couple the emitted light into a waveguide. In some embodiments, an LED may include a mesa of another shape, such as planar, conical, semi-parabolic, or parabolic, and a base area of the mesa may be circular, rectangular, hexagonal, or triangular. For example, the LED may include a mesa of a curved shape (e.g., paraboloid shape) and/or a non-curved shape (e.g., conic shape). The mesa may be truncated or non-truncated.

Figure 7B:
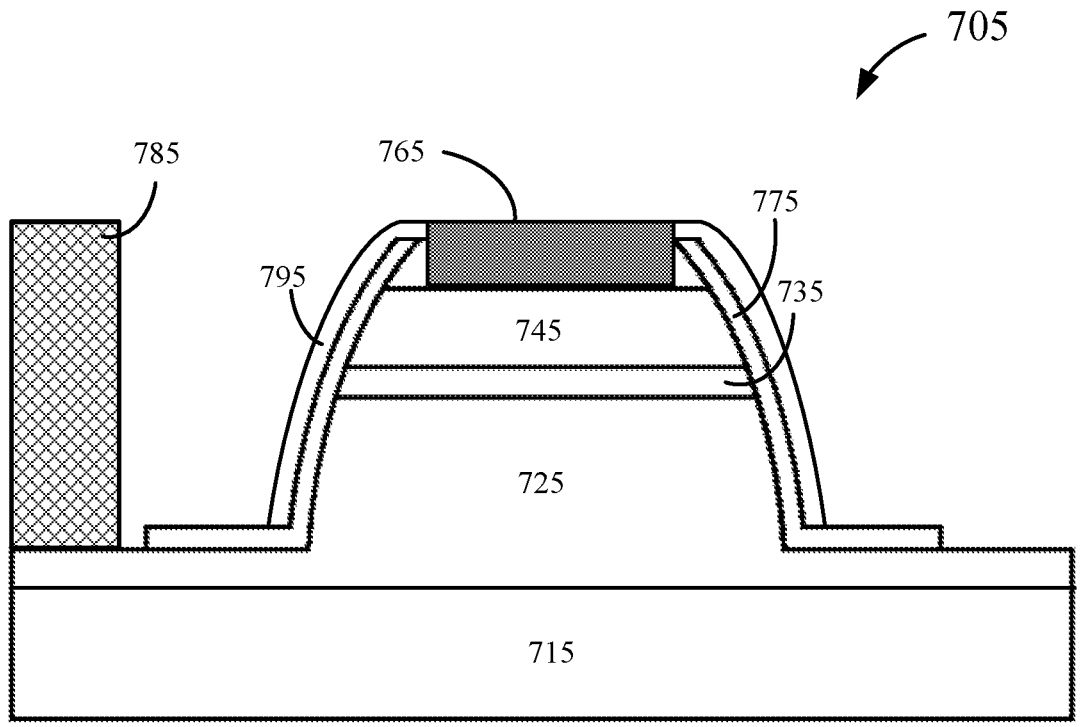
FIG. 7B is a cross-sectional view of an example of an LED having a parabolic mesa structure according to certain embodiments.

FIG. 7B is a cross-sectional view of an example of an LED 705 having a parabolic mesa structure. Similar to LED 700, LED 705 may include multiple layers of semiconductor materials, such as multiple layers of III-V semiconductor materials. The semiconductor material layers may be epitaxially grown on a substrate 715, such as a GaN substrate or a sapphire substrate. For example, a semiconductor layer 725 may be grown on substrate 715. Semiconductor layer 725 may include a III-V material, such as GaN, and may be p-doped (e.g., with Mg, Ca, Zn, or Be) or n-doped (e.g., with Si or Ge). One or more active layer 735 may be grown on semiconductor layer 725. Active layer 735 may include III-V materials, such as one or more InGaN layers, one or more AlInGaP layers, and/or one or more GaN layers, which may form one or more heterostructures, such as one or more quantum wells. A semiconductor layer 745 may be grown on active layer 735. Semiconductor layer 745 may include a III-V material, such as GaN, and may be p-doped (e.g., with Mg, Ca, Zn, or Be) or n-doped (e.g., with Si or Ge). One of semiconductor layer 725 and semiconductor layer 745 may be a p-type layer and the other one may be an n-type layer.

To make contact with semiconductor layer 725 (e.g., an n-type GaN layer) and to more efficiently extract light emitted by active layer 735 from LED 705, the semiconductor layers may be etched to expose semiconductor layer 725 and to form a mesa structure that includes layers 725-745. The mesa structure may confine carriers within the injection area of the device. Etching the mesa structure may lead to the formation of mesa side walls (also referred to herein as facets) that may be non-parallel with, or in some cases, orthogonal, to the growth planes associated with crystalline growth of layers 725-745.

As shown in FIG. 7B, LED 705 may have a mesa structure that includes a flat top. A dielectric layer 775 (e.g., $SiO_2$ or SiNx) may be formed on the facets of the mesa structure. In some embodiments, dielectric layer 775 may include multiple layers of dielectric materials. In some embodiments, a metal layer 795 may be formed on dielectric layer 775. Metal layer 795 may include one or more metal or metal alloy materials, such as aluminum (Al), silver (Ag), gold (Au), platinum (Pt), titanium (Ti), copper (Cu), or any combination thereof. Dielectric layer 775 and metal layer 795 may form a mesa reflector that can reflect light emitted by active layer 735 toward substrate 715. In some embodiments, the mesa reflector may be parabolic-shaped to act as a parabolic reflector that may at least partially collimate the emitted light.

Electrical contact 765 and electrical contact 785 may be formed on semiconductor layer 745 and semiconductor layer 725, respectively, to act as electrodes. Electrical contact 765 and electrical contact 785 may each include a conductive material, such as Al, Au, Pt, Ag, Ni, Ti, Cu, or any combination thereof (e.g., Ag/Pt/Au or Al/Ni/Au), and may act as the electrodes of LED 705. In the example shown in FIG. 7B, electrical contact 785 may be an n-contact, and electrical contact 765 may be a p-contact. Electrical contact 765 and semiconductor layer 745 (e.g., a p-type semiconductor layer) may form a back reflector for reflecting light emitted by active layer 735 back toward substrate 715. In some embodiments, electrical contact 765 and metal layer 795 include same material(s) and can be formed using the same processes. In some embodiments, an additional conductive layer (not shown) may be included as an intermediate conductive layer between the electrical contacts 765 and 785 and the semiconductor layers.

When a voltage signal is applied across contacts 765 and 785, electrons and holes may recombine in active layer 735. The recombination of electrons and holes may cause photon emission, thus producing light. The wavelength and energy of the emitted photons may depend on the energy bandgap between the valence band and the conduction band in active layer 735. For example, InGaN active layers may emit green or blue light, while AlInGaP active layers may emit red, orange, yellow, or green light. The emitted photons may propagate in many different directions, and may be reflected by the mesa reflector and/or the back reflector and may exit LED 705, for example, from the bottom side (e.g., substrate 715) shown in FIG. 7B. One or more other secondary optical components, such as a lens or a grating, may be formed on the light emission surface, such as substrate 715, to focus or collimate the emitted light and/or couple the emitted light into a waveguide.

One or two-dimensional arrays of the LEDs described above may be manufactured on a wafer to form light sources (e.g., light source 642). Driver circuits (e.g., driver circuit 644) may be fabricated, for example, on a silicon wafer using CMOS processes. The LEDs and the driver circuits on wafers may be diced and then bonded together, or may be bonded on the wafer level and then diced. Various bonding techniques can be used for bonding the LEDs and the driver circuits, such as adhesive bonding, metal-to-metal bonding, metal oxide bonding, wafer-to-wafer bonding, die-to-wafer bonding, hybrid bonding, and the like.

Figures 8A, 8B:
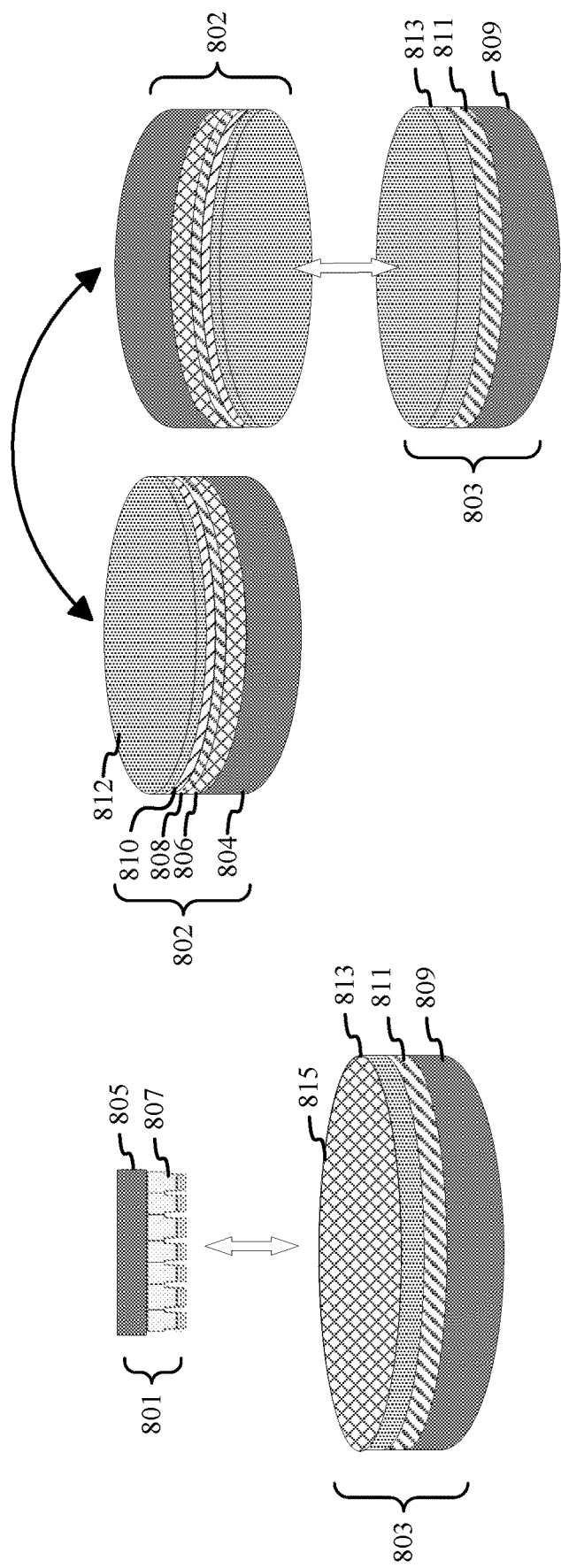
FIG. 8A illustrates an example of a method of die-to-wafer bonding for arrays of LEDs according to certain embodiments.
FIG. 8B illustrates an example of a method of wafer-to-wafer bonding for arrays of LEDs according to certain embodiments.

FIG. 8A illustrates an example of a method of die-to-wafer bonding for arrays of LEDs according to certain embodiments. In the example shown in FIG. 8A, an LED array 801 may include a plurality of LEDs 807 on a carrier substrate 805. Carrier substrate 805 may include various materials, such as GaAs, InP, GaN, AlN, sapphire, SiC, Si, or the like. LEDs 807 may be fabricated by, for example, growing various epitaxial layers, forming mesa structures, and forming electrical contacts or electrodes, before performing the bonding. The epitaxial layers may include various materials, such as GaN, InGaN, (AlGaIn)P, (AlGaIn)AsP, (AlGaIn)AsN, (AlGaIn)Pas, (Eu:InGa)N, (AlGaIn)N, or the like, and may include an n-type layer, a p-type layer, and an active layer that includes one or more heterostructures, such as one or more quantum wells or MQWs. The electrical contacts may include various conductive materials, such as a metal or a metal alloy.

A wafer 803 may include a base layer 809 having passive or active integrated circuits (e.g., driver circuits 811) fabricated thereon. Base layer 809 may include, for example, a silicon wafer. Driver circuits 811 may be used to control the operations of LEDs 807. For example, the driver circuit for each LED 807 may include a 2T1C pixel structure that has two transistors and one capacitor. Wafer 803 may also include a bonding layer 813. Bonding layer 813 may include various materials, such as a metal, an oxide, a dielectric, CuSn, AuTi, and the like. In some embodiments, a patterned layer 815 may be formed on a surface of bonding layer 813, where patterned layer 815 may include a metallic grid made of a conductive material, such as Cu, Ag, Au, Al, or the like.

LED array 801 may be bonded to wafer 803 via bonding layer 813 or patterned layer 815. For example, patterned layer 815 may include metal pads or bumps made of various materials, such as CuSn, AuSn, or nanoporous Au, that may be used to align LEDs 807 of LED array 801 with corresponding driver circuits 811 on wafer 803. In one example, LED array 801 may be brought toward wafer 803 until LEDs 807 come into contact with respective metal pads or bumps corresponding to driver circuits 811. Some or all of LEDs 807 may be aligned with driver circuits 811, and may then be bonded to wafer 803 via patterned layer 815 by various bonding techniques, such as metal-to-metal bonding. After LEDs 807 have been bonded to wafer 803, carrier substrate 805 may be removed from LEDs 807.

FIG. 8B illustrates an example of a method of wafer-to-wafer bonding for arrays of LEDs according to certain embodiments. As shown in FIG. 8B, a first wafer 802 may include a substrate 804, a first semiconductor layer 806, active layers 808, and a second semiconductor layer 810. Substrate 804 may include various materials, such as GaAs, InP, GaN, AlN, sapphire, SiC, Si, or the like. First semiconductor layer 806, active layers 808, and second semiconductor layer 810 may include various semiconductor materials, such as GaN, InGaN, (AlGaIn)P, (AlGaIn)AsP, (AlGaIn)AsN, (AlGaIn)Pas, (Eu:InGa)N, (AlGaIn)N, or the like. In some embodiments, first semiconductor layer 806 may be an n-type layer, and second semiconductor layer 810 may be a p-type layer. For example, first semiconductor layer 806 may be an n-doped GaN layer (e.g., doped with Si or Ge), and second semiconductor layer 810 may be a p-doped GaN layer (e.g., doped with Mg, Ca, Zn, or Be). Active layers 808 may include, for example, one or more GaN layers, one or more InGaN layers, one or more AlInGaP layers, and the like, which may form one or more heterostructures, such as one or more quantum wells or MQWs.

In some embodiments, first wafer 802 may also include a bonding layer. Bonding layer 812 may include various materials, such as a metal, an oxide, a dielectric, CuSn, AuTi, or the like. In one example, bonding layer 812 may include p-contacts and/or n-contacts (not shown). In some embodiments, other layers may also be included on first wafer 802, such as a buffer layer between substrate 804 and first semiconductor layer 806. The buffer layer may include various materials, such as polycrystalline GaN or AlN. In some embodiments, a contact layer may be between second semiconductor layer 810 and bonding layer 812. The contact layer may include any suitable material for providing an electrical contact to second semiconductor layer 810 and/or first semiconductor layer 806.

First wafer 802 may be bonded to wafer 803 that includes driver circuits 811 and bonding layer 813 as described above, via bonding layer 813 and/or bonding layer 812. Bonding layer 812 and bonding layer 813 may be made of the same material or different materials. Bonding layer 813 and bonding layer 812 may be substantially flat. First wafer 802 may be bonded to wafer 803 by various methods, such as metal-to-metal bonding, eutectic bonding, metal oxide bonding, anodic bonding, thermo-compression bonding, ultraviolet (UV) bonding, and/or fusion bonding.

As shown in FIG. 8B, first wafer 802 may be bonded to wafer 803 with the p-side (e.g., second semiconductor layer 810) of first wafer 802 facing down (i.e., toward wafer 803). After bonding, substrate 804 may be removed from first wafer 802, and first wafer 802 may then be processed from the n-side. The processing may include, for example, the formation of certain mesa shapes for individual LEDs, as well as the formation of optical components corresponding to the individual LEDs.

Figure 9A:
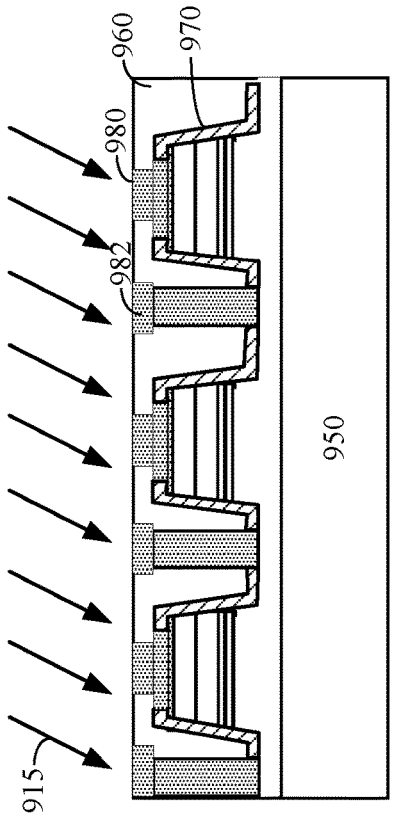
FIGS. 9A-9D illustrate an example of a method of hybrid bonding for arrays of LEDs according to certain embodiments.

FIGS. 9A-9D illustrate an example of a method of hybrid bonding for arrays of LEDs according to certain embodiments. The hybrid bonding may generally include wafer cleaning and activation, high-precision alignment of contacts of one wafer with contacts of another wafer, dielectric bonding of dielectric materials at the surfaces of the wafers at room temperature, and metal bonding of the contacts by annealing at elevated temperatures. FIG. 9A shows a substrate 910 with passive or active circuits 920 manufactured thereon. As described above with respect to FIGS. 8A-8B, substrate 910 may include, for example, a silicon wafer. Circuits 920 may include driver circuits for the arrays of LEDs. A bonding layer may include dielectric regions 940 and contact pads 930 connected to circuits 920 through electrical interconnects 922. Contact pads 930 may include, for example, Cu, Ag, Au, Al, W, Mo, Ni, Ti, Pt, Pd, or the like. Dielectric materials in dielectric regions 940 may include $SiCN$, $SiO_2$, $SiN$, $Al_2O_3$, $HfO_2$, $ZrO_2$, $Ta_2O_5$, or the like. The bonding layer may be planarized and polished using, for example, chemical mechanical polishing, where the planarization or polishing may cause dishing (a bowl like profile) in the contact pads. The surfaces of the bonding layers may be cleaned and activated by, for example, an ion (e.g., plasma) or fast atom (e.g., Ar) beam 905. The activated surface may be atomically clean and may be reactive for formation of direct bonds between wafers when they are brought into contact, for example, at room temperature.

Figure 9B:
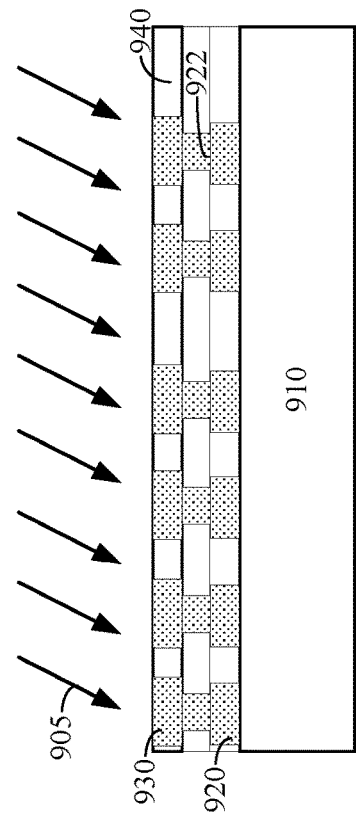

FIG. 9B illustrates a wafer 950 including an array of micro-LEDs 970 fabricated thereon as described above with respect to, for example, FIGS. 7A-8B. Wafer 950 may be a carrier wafer and may include, for example, GaAs, InP, GaN, AlN, sapphire, SiC, Si, or the like. Micro-LEDs 970 may include an n-type layer, an active region, and a p-type layer epitaxially grown on wafer 950. The epitaxial layers may include various III-V semiconductor materials described above, and may be processed from the p-type layer side to etch mesa structures in the epitaxial layers, such as substantially vertical structures, parabolic structures, conic structures, or the like. Passivation layers and/or reflection layers may be formed on the sidewalls of the mesa structures. P-contacts 980 and n-contacts 982 may be formed in a dielectric material layer 960 deposited on the mesa structures and may make electrical contacts with the p-type layer and the n-type layers, respectively. Dielectric materials in dielectric material layer 960 may include, for example, SiCN, $SiO_2$, SiN, $Al_2O_3$, $HfO_2$, $ZrO_2$, $Ta_2O_5$, or the like. P-contacts 980 and n-contacts 982 may include, for example, Cu, Ag, Au, Al, W, Mo, Ni, Ti, Pt, Pd, or the like. The top surfaces of p-contacts 980, n-contacts 982, and dielectric material layer 960 may form a bonding layer. The bonding layer may be planarized and polished using, for example, chemical mechanical polishing, where the polishing may cause dishing in p-contacts 980 and n-contacts 982. The bonding layer may then be cleaned and activated by, for example, an ion (e.g., plasma) or fast atom (e.g., Ar) beam 915. The activated surface may be atomically clean and reactive for formation of direct bonds between wafers when they are brought into contact, for example, at room temperature.

Figure 9C:
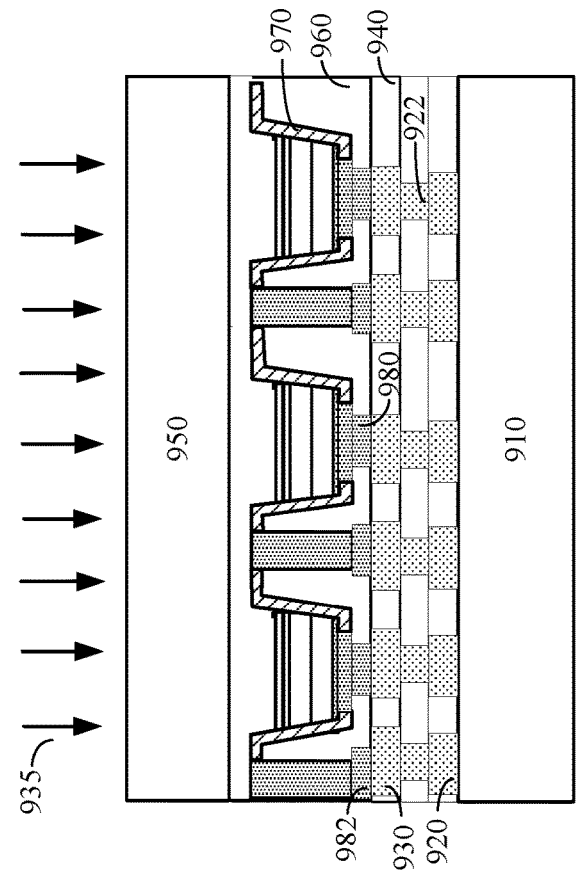

FIG. 9C illustrates a room temperature bonding process for bonding the dielectric materials in the bonding layers. For example, after the bonding layer that includes dielectric regions 940 and contact pads 930 and the bonding layer that includes p-contacts 980, n-contacts 982, and dielectric material layer 960 are surface activated, wafer 950 and micro-LEDs 970 may be turned upside down and brought into contact with substrate 910 and the circuits formed thereon. In some embodiments, compression pressure 925 may be applied to substrate 910 and wafer 950 such that the bonding layers are pressed against each other. Due to the surface activation and the dishing in the contacts, dielectric regions 940 and dielectric material layer 960 may be in direct contact because of the surface attractive force, and may react and form chemical bonds between them because the surface atoms may have dangling bonds and may be in unstable energy states after the activation. Thus, the dielectric materials in dielectric regions 940 and dielectric material layer 960 may be bonded together with or without heat treatment or pressure.

Figure 9D:
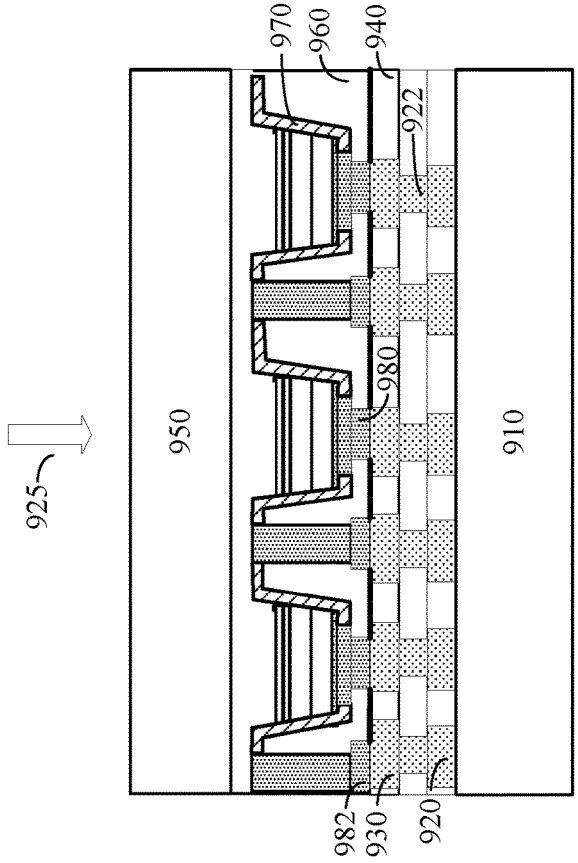

FIG. 9D illustrates an annealing process for bonding the contacts in the bonding layers after bonding the dielectric materials in the bonding layers. For example, contact pads 930 and p-contacts 980 or n-contacts 982 may be bonded together by annealing at, for example, about 200-400° C. or higher. During the annealing process, heat 935 may cause the contacts to expand more than the dielectric materials (due to different coefficients of thermal expansion), and thus may close the dishing gaps between the contacts such that contact pads 930 and p-contacts 980 or n-contacts 982 may be in contact and may form direct metallic bonds at the activated surfaces.

In some embodiments where the two bonded wafers include materials having different thermal expansion coefficients (TECs), the dielectric materials bonded at room temperature may help to reduce or prevent misalignment of the contact pads caused by the different thermal expansions. In some embodiments, to further reduce or avoid the misalignment of the contact pads at a high temperature during annealing, trenches may be formed between micro-LEDs, between groups of micro-LEDs, through part or all of the substrate, or the like, before bonding.

After the micro-LEDs are bonded to the driver circuits, the substrate on which the micro-LEDs are fabricated may be thinned or removed, and various secondary optical components may be fabricated on the light emitting surfaces of the micro-LEDs to, for example, extract, collimate, and redirect the light emitted from the active regions of the micro-LEDs. In one example, micro-lenses may be formed on the micro-LEDs, where each micro-lens may correspond to a respective micro-LED and may help to improve the light extraction efficiency and collimate the light emitted by the micro-LED. In some embodiments, the secondary optical components may be fabricated in the substrate or the n-type layer of the micro-LEDs. In some embodiments, the secondary optical components may be fabricated in a dielectric layer deposited on the n-type side of the micro-LEDs. Examples of the secondary optical components may include a lens, a grating, an antireflection (AR) coating, a prism, a photonic crystal, or the like.

Figure 10:
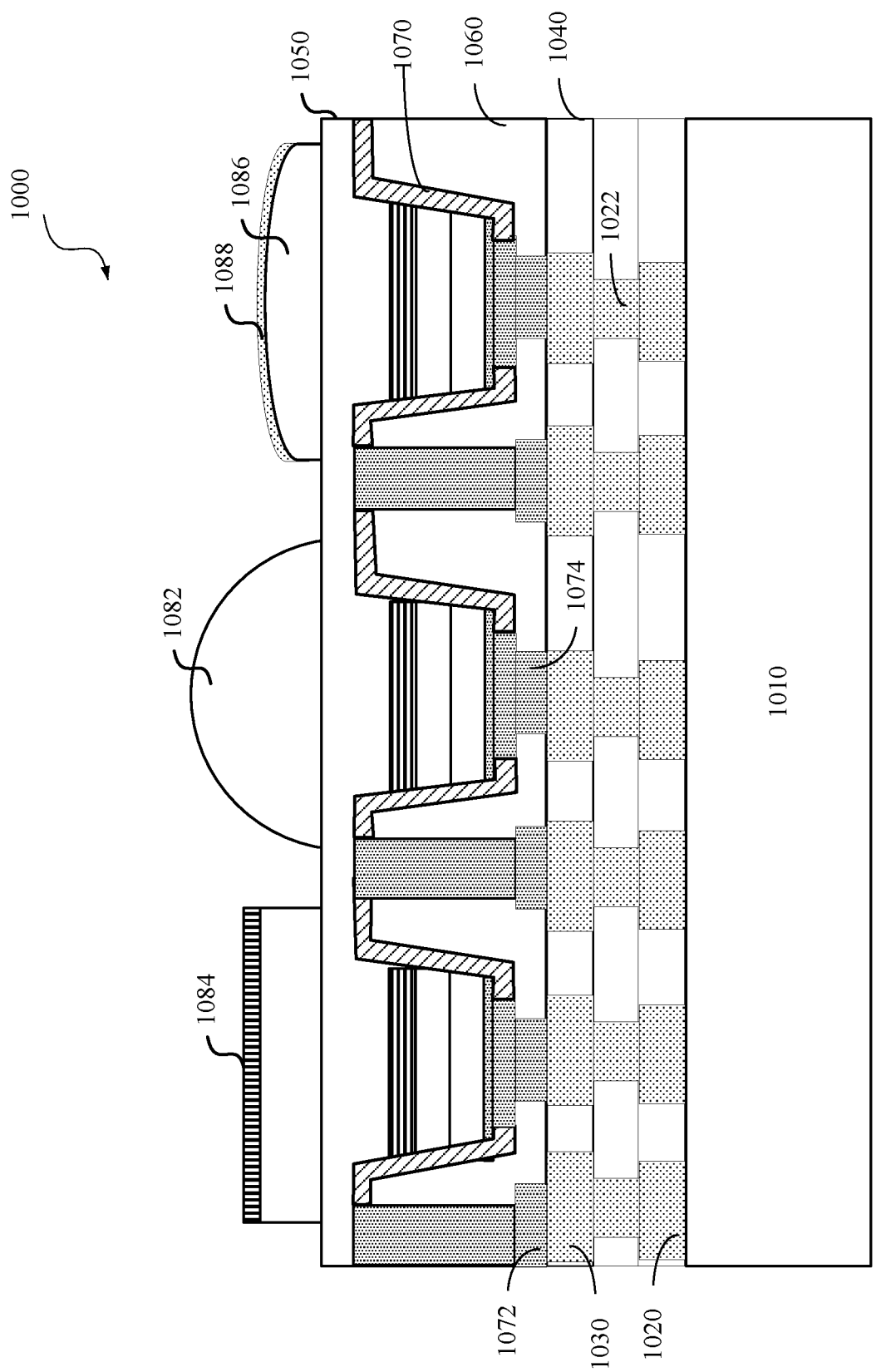
FIG. 10 illustrates an example of an LED array with secondary optical components fabricated thereon according to certain embodiments.

FIG. 10 illustrates an example of an LED array 1000 with secondary optical components fabricated thereon according to certain embodiments. LED array 1000 may be made by bonding an LED chip or wafer with a silicon wafer including electrical circuits fabricated thereon, using any suitable bonding techniques described above with respect to, for example, FIGS. 8A-9D. In the example shown in FIG. 10, LED array 1000 may be bonded using a wafer-to-wafer hybrid bonding technique as described above with respect to FIG. 9A-9D. LED array 1000 may include a substrate 1010, which may be, for example, a silicon wafer. Integrated circuits 1020, such as LED driver circuits, may be fabricated on substrate 1010. Integrated circuits 1020 may be connected to p-contacts 1074 and n-contacts 1072 of micro-LEDs 1070 through interconnects 1022 and contact pads 1030, where contact pads 1030 may form metallic bonds with p-contacts 1074 and n-contacts 1072. Dielectric layer 1040 on substrate 1010 may be bonded to dielectric layer 1060 through fusion bonding.

The substrate (not shown) of the LED chip or wafer may be thinned or may be removed to expose the n-type layer 1050 of micro-LEDs 1070. Various secondary optical components, such as a spherical micro-lens 1082, a grating 1084, a micro-lens 1086, an antireflection layer 1088, and the like, may be formed in or on top of n-type layer 1050. For example, spherical micro-lens arrays may be etched in the semiconductor materials of micro-LEDs 1070 using a grayscale mask and a photoresist with a linear response to exposure light, or using an etch mask formed by thermal reflowing of a patterned photoresist layer. The secondary optical components may also be etched in a dielectric layer deposited on n-type layer 1050 using similar photolithographic techniques or other techniques. For example, micro-lens arrays may be formed in a polymer layer through thermal reflowing of the polymer layer that is patterned using a binary mask. The micro-lens arrays in the polymer layer may be used as the secondary optical components or may be used as the etch mask for transferring the profiles of the micro-lens arrays into a dielectric layer or a semiconductor layer. The dielectric layer may include, for example, SiCN, SiO$_2$, SiN, Al$_2$O$_3$, HfO$_2$, ZrO$_2$, Ta$_2$O$_5$, or the like. In some embodiments, a micro-LED 1070 may have multiple corresponding secondary optical components, such as a micro-lens and an anti-reflection coating, a micro-lens etched in the semiconductor material and a micro-lens etched in a dielectric material layer, a micro-lens and a grating, a spherical lens and an aspherical lens, and the like. Three different secondary optical components are illustrated in FIG. 10 to show some examples of secondary optical components that can be formed on micro-LEDs 1070, which does not necessary imply that different secondary optical components are used simultaneously for every LED array.

Figure 11B:
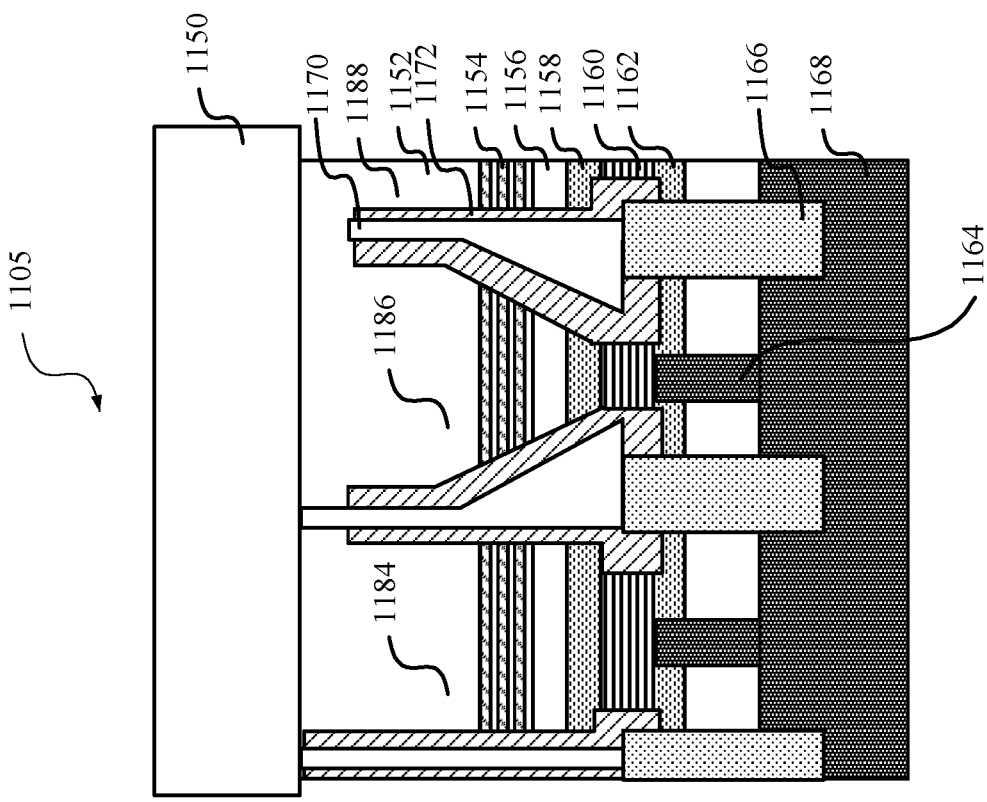
FIG. 11B illustrates an example of another LED array that may be formed according to certain embodiments of the hybrid bonding method described herein, and that may have LEDs with vertical and conical mesa shapes.
Figure 11A:
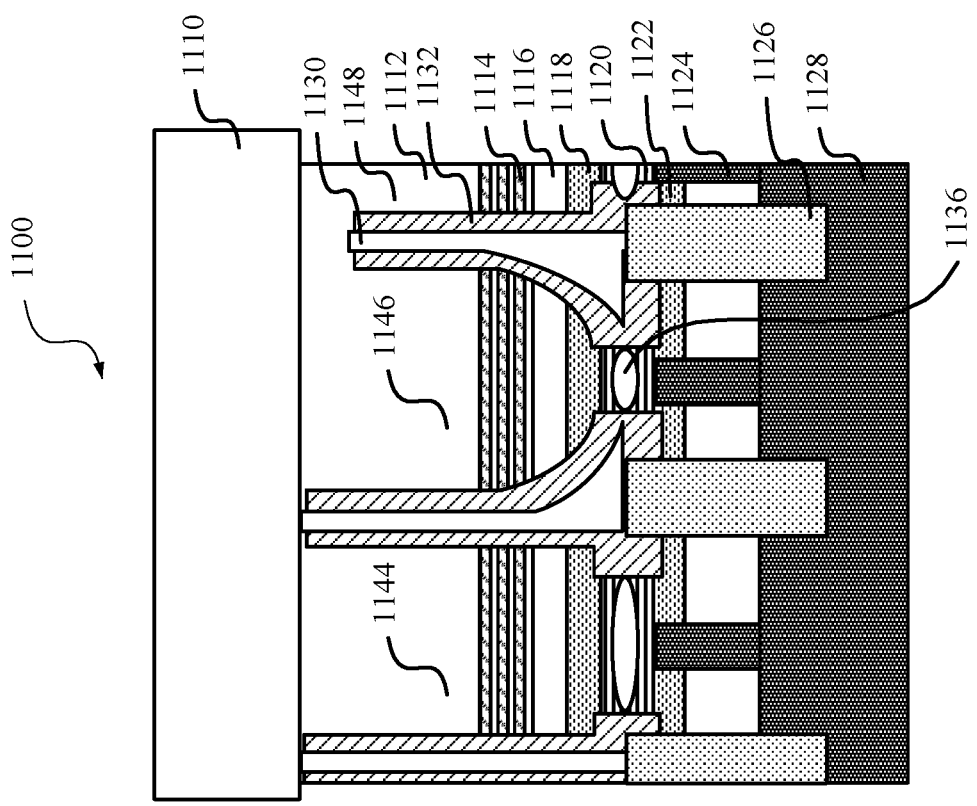
FIG. 11A illustrates an example of an LED array that may be formed according to certain embodiments of the hybrid bonding method described herein, and that may have LEDs with vertical and parabolic mesa shapes.

FIG. 11A illustrates an example of an LED array 1100 that may be formed according to the hybrid bonding method described above with respect to FIGS. 9A-9D, and that may have LEDs with vertical and parabolic mesa shapes. The LED array 1100 may include a one-dimensional array of LEDs or a two-dimensional array of LEDs. Each LED of the LED array may be a large LED, a mini LED, a micro-LED, a tapered LED, or a superluminescent diode (SLED). In other embodiments, lasers may be used in place of the LEDs. Each LED of the LED array 1100 may include a semiconductor layer stack that has an n-side semiconductor layer 1112, an active light emitting layer 1114, and a p-side semiconductor layer 1116. The semiconductor layer stack may include a III-V material, such as GaN, InGaN, (AlGaIn) P, (AlGaIn)AsP, (AlGaIn)AsN, (AlGaIn)PAs, (Eu:InGa)N, or (AlGaIn)N. The n-side semiconductor layer 1112 may be n-doped (e.g., with Si or Ge) and the p-side semiconductor layer 1116 may be p-doped (e.g., with Mg, Ca, Zn, or Be). The semiconductor layer stack may have a thickness of less than 2 μm. The active light emitting layer 1114 may be sandwiched between the n-side semiconductor layer 1112 and the p-side semiconductor layer 1116, and may include one or more InGaN layers, one or more AlInGaP layers, and/or one or more GaN layers, which may form one or more heterostructures, such as one or more quantum wells or MQWs. A first LED 1144 1144 may have a vertical mesa shape, and a second LED 1146 may have a parabolic mesa shape. Although the first LED 1144 and the second LED 1146 are shown as having different mesa shapes, some or all of the LEDs within the LED array 1100 may have the same mesa shape. A substrate 1110 may be a growth substrate for the LEDs or a temporary bond wafer.

Optionally, the semiconductor layer stack may also include a highly p-doped layer 1118. For example, for a red LED, the highly p-doped layer 1118 may include highly p-doped GaP or AlGaAs. The highly p-doped layer 1118 may have a higher concentration of p-type doping than the p-side semiconductor layer 1116. P-contacts 1120 may be provided beneath the semiconductor layer stack. The p-contacts 1120 may include, for example, Cu, Ag, Au, Al, W, Mo, Ni, Ti, Pt, Pd, or the like. The highly p-doped layer 1118 may be optimized for making contact to the p-contacts 1120. In addition, a dielectric layer 1132 may be formed around a reflector layer 1130 of each of the LEDs. The dielectric layer 1132 may include, for example, SiCN, SiO$_2$, SiN, Al$_2$O$_3$, HfO$_2$, ZrO$_2$, Ta$_2$O$_5$, or the like. Each reflector layer 1130 may include, for example, one or more metal or metal alloy materials, such as Al, Ag, Au, Pt, Ti, Cu, or any combination thereof. Each reflector layer 1130 may reflect light that is emitted by the active light emitting layer 1114. Further, each reflector layer 1130 may act as an n-contact by providing electrical contact to the n-side semiconductor layer 1112. Due to the configuration of the n-side semiconductor layer 1112, the first LED 1144 may have an isolated n-contact, while the second LED 1146 and a third LED 1148 may have a common n-contact. The p-contacts 1120 and/or the reflector layer 1130 may form a pattern of metal tracks through the dielectric layer 1132. The bottom surfaces of the p-contacts 1120 and the reflector layer 1130 may be recessed with respect to the bottom surface of the dielectric layer 1132. A thermal expansion coefficient of the p-contacts 1120 and/or the reflector layer 1130 may be higher than a thermal expansion coefficient of the dielectric layer 1132.

The LEDs may be bonded to a substrate 1128 according to the hybrid bonding method described above with respect to FIGS. 9A-9D. The substrate 1128 may be a passive backplane or an active CMOS Si-backplane. For example, the substrate 1128 may include a passive or an active matrix integrated circuit within a Si layer. P-contacts 1124 may provide electrical contact to certain passive or active circuits (not shown) within the Si layer of the substrate 1128. Similarly, n-contacts 1126 may provide electrical contact to other passive or active circuits (not shown) within the Si layer of the substrate 1128. The p-contacts 1124 and the n-contacts 1126 may be configured to drive the LEDs. The p-contacts 1124 and the n-contacts 1126 may include, for example, Cu, Ag, Au, Al, W, Mo, Ni, Ti, Pt, Pd, or the like. In addition, a dielectric layer 1122 may be formed between the p-contacts 1124 and the n-contacts 1126. The dielectric layer 1122 may include, for example, SiCN, SiO$_2$, SiN, Al$_2$O$_3$, HfO$_2$, ZrO$_2$, Ta$_2$O$_5$, or the like. The p-contacts 1124 and/or the n-contacts 1126 may form a pattern of metal tracks through the dielectric layer 1122. The top surface of the dielectric layer 1122 may be recessed with respect to the top surfaces of the p-contacts 1124 and/or the n-contacts 1126. A thermal expansion coefficient of the p-contacts 1124 and/or the n-contacts 1126 may be higher than a thermal expansion coefficient of the dielectric layer 1122.

Before bonding the LEDs to the substrate 1128, various bonding surfaces may be planarized and polished using, for example, chemical mechanical polishing, as described above with reference to FIGS. 9A and 9B. For example, the top surfaces of the p-contacts 1124, the n-contacts 1126, and/or the dielectric layer 1122 may be planarized and polished. Alternatively or in addition, the bottom surfaces of the p-contacts 1120, the reflector layer 1130, and/or the dielectric layer 1132 may be planarized and polished. Some or all of the bonding surfaces may also be cleaned and activated.

P-contacts 1120 may be aligned with p-contacts 1124. For example, the pattern of metal tracks formed by the p-contacts 1120 through the dielectric layer 1132 may be aligned with the pattern of metal tracks formed by the p-contacts 1124 through the dielectric layer 1122. Hybrid bonding may then be performed by first performing dielectric bonding of the dielectric layer 1132 with the dielectric layer 1122, and then performing metal bonding of p-contacts 1120 with p-contacts 1124. As discussed above with respect to FIG. 9C, the dielectric bonding may be performed at an ambient temperature (i.e., room temperature). The dielectric bonding may include performing plasma activation of the dielectric layer 1132 and the dielectric layer 1122. The dielectric layer 1132 and the dielectric layer 1122 may have high dangling bond strengths at temperatures greater than or equal to the ambient temperature. For example, the dielectric layer 1132 and/or the dielectric layer 1122 may include SiCN having a C-content between 25% and 35% and a bond energy between 2,000 mJ/m$^2$ and 3,000 mJ/m$^2$. As discussed above with respect to FIG. 9D, the metal bonding may be performed by annealing the LED array 1100 at a higher temperature, such as between 150° C. and 250° C., in order to form a metal-to-metal bond between the p-contacts 1120 and the p-contacts 1124. The metal bonding may include performing local area thermo-compression bonding of the p-contacts 1120 and the p-contacts 1124.

Alternatively or in addition, reflector layers 1130 may be aligned with n-contacts 1126. For example, the pattern of metal tracks formed by the reflector layers 1130 through the dielectric layer 1132 may be aligned with the pattern of metal tracks formed by the n-contacts 1126 through the dielectric layer 1122. Hybrid bonding may then be performed by first performing dielectric bonding of the dielectric layer 1132 with the dielectric layer 1122, and then performing metal bonding of reflector layers 1130 with n-contacts 1126. As discussed above with respect to FIG. 9C, the dielectric bonding may be performed at an ambient temperature (i.e., room temperature). The dielectric bonding may include performing plasma activation of the dielectric layer 1132 and the dielectric layer 1122. The dielectric layer 1132 and the dielectric layer 1122 may have high dangling bond strengths at temperatures greater than or equal to the ambient temperature. For example, the dielectric layer 1132 and/or the dielectric layer 1122 may include SiCN having a C-content between 25% and 35% and a bond energy between 2,000 $mJ/m^2$ and 3,000 $mJ/m^2$. As discussed above with respect to FIG. 9D, the metal bonding may be performed by annealing the LED array 1100 at a higher temperature, such as between 150° C. and 250° C., in order to form a metal-to-metal bond between the reflector layers 1130 and the n-contacts 1126. The metal bonding may include performing local area thermo-compression bonding of the reflector layers 1130 and the n-contacts 1126.

FIG. 11B illustrates an example of another LED array 1105 that may be formed according to the hybrid bonding method described above with respect to FIGS. 9A-9D, and that may have LEDs with vertical and conical mesa shapes. The LED array 1105 may include a one-dimensional array of LEDs or a two-dimensional array of LEDs. Each LED of the LED array may be a large LED, a mini LED, a micro-LED, a tapered LED, or a superluminescent diode (SLED). In other embodiments, lasers may be used in place of the LEDs. Each LED of the LED array 1105 may include a semiconductor layer stack that has an n-side semiconductor layer 1152, an active light emitting layer 1154, and a p-side semiconductor layer 1156. The semiconductor layer stack may include a III-V material, such as GaN, InGaN, (AlGaIn)P, (AlGaIn)AsP, (AlGaIn)AsN, (AlGaIn)PAs, (Eu:InGa)N, or (AlGaIn)N. The n-side semiconductor layer 1152 may be n-doped (e.g., with Si or Ge) and the p-side semiconductor layer 1156 may be p-doped (e.g., with Mg, Ca, Zn, or Be). The semiconductor layer stack may have a thickness of less than 2 μm. The active light emitting layer 1154 may be sandwiched between the n-side semiconductor layer 1152 and the p-side semiconductor layer 1156, and may include one or more InGaN layers, one or more AlInGaP layers, and/or one or more GaN layers, which may form one or more heterostructures, such as one or more quantum wells or MQWs. A first LED 1184 may have a vertical mesa shape, and a second LED 1186 may have a conical mesa shape. Although the first LED 1184 and the second LED 1186 are shown as having different mesa shapes, some or all of the LEDs within the LED array 1105 may have the same mesa shape. A substrate 1150 may be a growth substrate for the LEDs or a temporary bond wafer.

Optionally, the semiconductor layer stack may also include a highly p-doped layer 1158. For example, for a red LED, the highly p-doped layer 1158 may include highly p-doped GaP or AlGaAs. The highly p-doped layer 1158 may have a higher concentration of p-type doping than the p-side semiconductor layer 1156. P-contacts 1160 may be provided beneath the semiconductor layer stack. The p-contacts 1160 may include, for example, Cu, Ag, Au, Al, W, Mo, Ni, Ti, Pt, Pd, or the like. The highly p-doped layer 1158 may be optimized for making contact to the p-contacts 1160. In addition, a dielectric layer 1172 may be formed around a reflector layer 1170 of each of the LEDs. The dielectric layer 1172 may include, for example, SiCN, $SiO_2$, SiN, $Al_2O_3$, $HfO_2$, $ZrO_2$, $Ta_2O_5$, or the like. Each reflector layer 1170 may include, for example, one or more metal or metal alloy materials, such as Al, Ag, Au, Pt, Ti, Cu, or any combination thereof. Each reflector layer 1170 may reflect light that is emitted by the active light emitting layer 1154. Further, each reflector layer 1170 may act as an n-contact by providing electrical contact to the n-side semiconductor layer 1152. Due to the configuration of the n-side semiconductor layer 1152, the first LED 1184 may have an isolated n-contact, while the second LED 1186 and a third LED 1188 may have a common n-contact. The p-contacts 1160 and/or the reflector layer 1170 may form a pattern of metal tracks through the dielectric layer 1172. The bottom surfaces of the p-contacts 1160 and the reflector layer 1170 may be recessed with respect to the bottom surface of the dielectric layer 1172. A thermal expansion coefficient of the p-contacts 1160 and/or the reflector layer 1170 may be higher than a thermal expansion coefficient of the dielectric layer 1172.

The LEDs may be bonded to a substrate 1168 according to the hybrid bonding method described above with respect to FIGS. 9A-9D. The substrate 1168 may be a passive backplane or an active CMOS Si-backplane. For example, the substrate 1168 may include a passive or an active matrix integrated circuit within a Si layer. P-contacts 1164 may provide electrical contact to certain passive or active circuits (not shown) within the Si layer of the substrate 1168. Similarly, n-contacts 1166 may provide electrical contact to other passive or active circuits (not shown) within the Si layer of the substrate 1168. The p-contacts 1164 and the n-contacts 1166 may be configured to drive the LEDs. The p-contacts 1164 and the n-contacts 1166 may include, for example, Cu, Ag, Au, Al, W, Mo, Ni, Ti, Pt, Pd, or the like. In addition, a dielectric layer 1162 may be formed between the p-contacts 1164 and the n-contacts 1166. The dielectric layer 1162 may include, for example, SiCN, $SiO_2$, SiN, $Al_2O_3$, $HfO_2$, $ZrO_2$, $Ta_2O_5$, or the like. The p-contacts 1164 and/or the n-contacts 1166 may form a pattern of metal tracks through the dielectric layer 1162. The top surface of the dielectric layer 1162 may be recessed with respect to the top surfaces of the p-contacts 1164 and/or the n-contacts 1166. A thermal expansion coefficient of the p-contacts 1164 and/or the n-contacts 1166 may be higher than a thermal expansion coefficient of the dielectric layer 1162.

Before bonding the LEDs to the substrate 1168, various bonding surfaces may be planarized and polished using, for example, chemical mechanical polishing, as described above with reference to FIGS. 9A and 9B. For example, the top surfaces of the p-contacts 1164, the n-contacts 1166, and/or the dielectric layer 1162 may be planarized and polished. Alternatively or in addition, the bottom surfaces of the p-contacts 1160, the reflector layer 1170, and/or the dielectric layer 1172 may be planarized and polished. Some or all of the bonding surfaces may also be cleaned and activated.

P-contacts 1160 may be aligned with p-contacts 1164. For example, the pattern of metal tracks formed by the p-contacts 1160 through the dielectric layer 1172 may be aligned with the pattern of metal tracks formed by the p-contacts 1164 through the dielectric layer 1162. Hybrid bonding may then be performed by first performing dielectric bonding of the dielectric layer 1172 with the dielectric layer 1162, and then performing metal bonding of p-contacts 1160 with p-contacts 1164. As discussed above with respect to FIG. 9C, the dielectric bonding may be performed at an ambient temperature (i.e., room temperature). The dielectric bonding may include performing plasma activation of the dielectric layer 1172 and the dielectric layer 1162. The dielectric layer 1172 and the dielectric layer 1162 may have high dangling bond strengths at temperatures greater than or equal to the ambient temperature. For example, the dielectric layer 1172 and/or the dielectric layer 1162 may include SiCN having a C-content between 25% and 35% and a bond energy between 2,000 mJ/m$^2$ and 3,000 mJ/m$^2$. As discussed above with respect to FIG. 9D, the metal bonding may be performed by annealing the LED array 1105 at a higher temperature, such as between 150° C. and 250° C., in order to form a metal-to-metal bond between the p-contacts 1160 and the p-contacts 1164. The metal bonding may include performing local area thermo-compression bonding of the p-contacts 1160 and the p-contacts 1164.

Alternatively or in addition, reflector layers 1170 may be aligned with n-contacts 1166. For example, the pattern of metal tracks formed by the reflector layers 1170 through the dielectric layer 1172 may be aligned with the pattern of metal tracks formed by the n-contacts 1166 through the dielectric layer 1162. Hybrid bonding may then be performed by first performing dielectric bonding of the dielectric layer 1172 with the dielectric layer 1162, and then performing metal bonding of reflector layers 1170 with n-contacts 1166. As discussed above with respect to FIG. 9C, the dielectric bonding may be performed at an ambient temperature (i.e., room temperature). The dielectric bonding may include performing plasma activation of the dielectric layer 1172 and the dielectric layer 1162. The dielectric layer 1172 and the dielectric layer 1162 may have high dangling bond strengths at temperatures greater than or equal to the ambient temperature. For example, the dielectric layer 1172 and/or the dielectric layer 1162 may include SiCN having a C-content between 25% and 35% and a bond energy between 2,000 mJ/m$^2$ and 3,000 mJ/m$^2$. As discussed above with respect to FIG. 9D, the metal bonding may be performed by annealing the LED array 1105 at a higher temperature, such as between 150° C. and 250° C., in order to form a metal-to-metal bond between the reflector layers 1170 and the n-contacts 1166. The metal bonding may include performing local area thermo-compression bonding of the reflector layers 1170 and the n-contacts 1166.

Figure 12B:
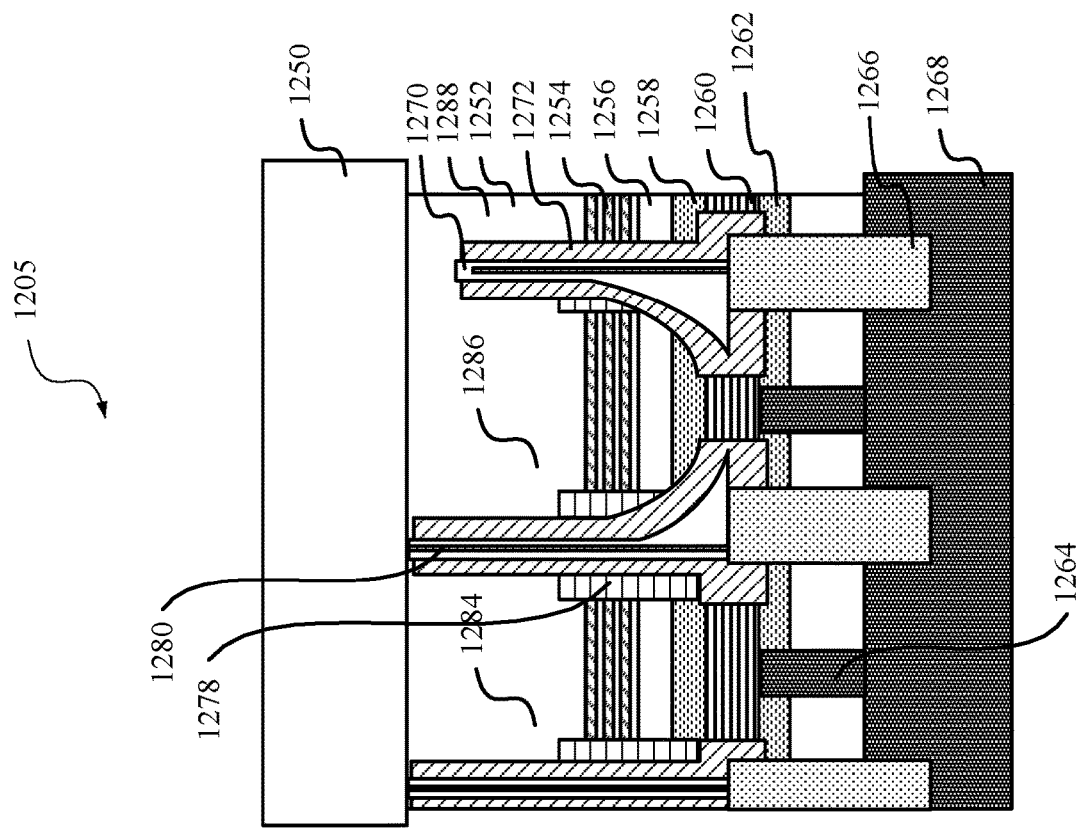
FIG. 12B illustrates an example of another LED array that may be formed according to certain embodiments of the hybrid bonding method described herein, and that may undergo p-side processing.
Figure 12A:
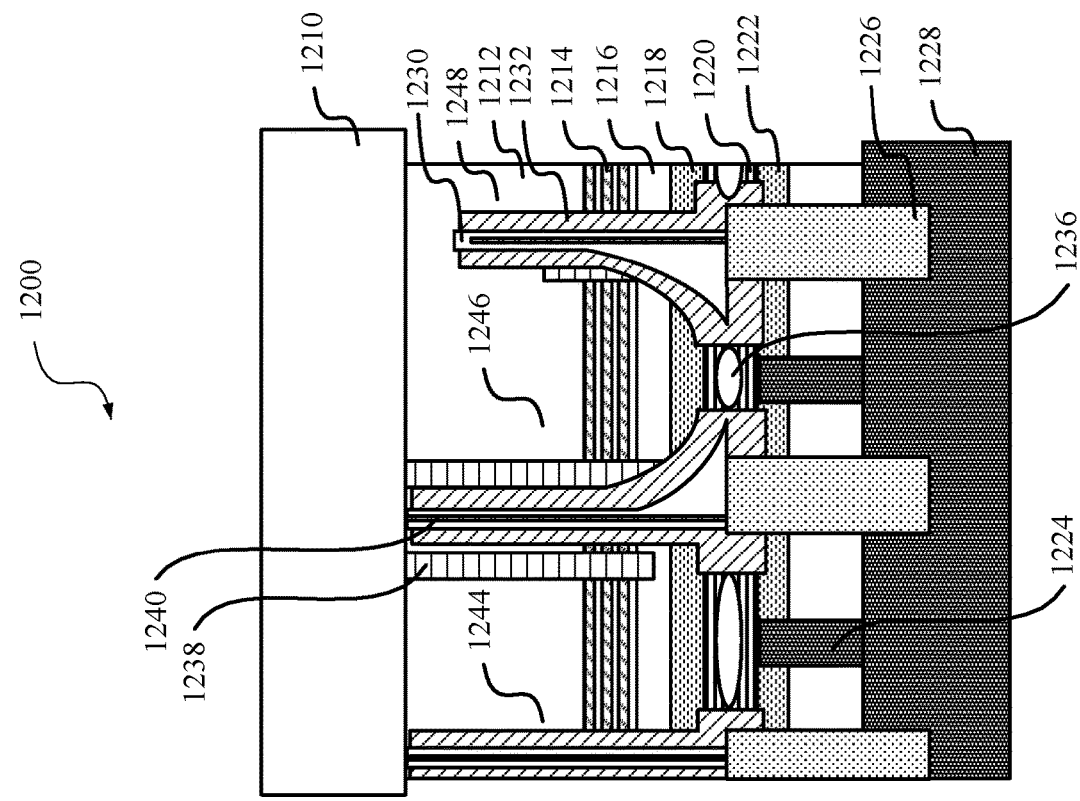
FIG. 12A illustrates an example of another LED array that may be formed according to certain embodiments of the hybrid bonding method described herein, and that may undergo n-side processing.

FIG. 12A illustrates an example of an LED array 1200 that may be formed according to the hybrid bonding method described above with respect to FIGS. 9A-9D, and that may undergo n-side processing. The LED array 1200 may include a one-dimensional array of LEDs or a two-dimensional array of LEDs. Each LED of the LED array may be a large LED, a mini LED, a micro-LED, a tapered LED, or a superluminescent diode (SLED). In other embodiments, lasers may be used in place of the LEDs. Each LED of the LED array 1200 may include a semiconductor layer stack that has an n-side semiconductor layer 1212, an active light emitting layer 1214, and a p-side semiconductor layer 1216. The semiconductor layer stack may include a III-V material, such as GaN, InGaN, (AlGaIn)P, (AlGaIn)AsP, (AlGaIn)AsN, (AlGaIn)PAs, (Eu:InGa)N, or (AlGaIn)N. The n-side semiconductor layer 1212 may be n-doped (e.g., with Si or Ge) and the p-side semiconductor layer 1216 may be p-doped (e.g., with Mg, Ca, Zn, or Be). The semiconductor layer stack may have a thickness of less than 2 μm. The active light emitting layer 1214 may be sandwiched between the n-side semiconductor layer 1212 and the p-side semiconductor layer 1216, and may include one or more InGaN layers, one or more AlInGaP layers, and/or one or more GaN layers, which may form one or more heterostructures, such as one or more quantum wells or MQWs. A first LED 1244 may have a vertical mesa shape, and a second LED 1246 may have a parabolic mesa shape. Although the first LED 1244 and the second LED 1246 are shown as having different mesa shapes, some or all of the LEDs within the LED array 1200 may have the same mesa shape. A substrate 1210 may be a growth substrate for the LEDs or a temporary bond wafer.

Optionally, the semiconductor layer stack may also include a highly p-doped layer 1218. For example, for a red LED, the highly p-doped layer 1218 may include highly p-doped GaP or AlGaAs. The highly p-doped layer 1218 may have a higher concentration of p-type doping than the p-side semiconductor layer 1116. P-contacts 1220 may be provided beneath the semiconductor layer stack. The p-contacts 1220 may include, for example, Cu, Ag, Au, Al, W, Mo, Ni, Ti, Pt, Pd, or the like. The highly p-doped layer 1218 may be optimized for making contact to the p-contacts 1220. In addition, a dielectric layer 1232 may be formed around a reflector layer 1230 of each of the LEDs. The dielectric layer 1232 may include, for example, SiCN, SiO$_2$, SiN, Al$_2$O$_3$, HfO$_2$, ZrO$_2$, Ta$_2$O$_5$, or the like. Each reflector layer 1230 may include, for example, one or more metal or metal alloy materials, such as Al, Ag, Au, Pt, Ti, Cu, or any combination thereof. Each reflector layer 1230 may reflect light that is emitted by the active light emitting layer 1214. Further, each reflector layer 1230 may act as an n-contact by providing electrical contact to the n-side semiconductor layer 1212. Due to the configuration of the n-side semiconductor layer 1212, the first LED 1244 may have an isolated n-contact, while the second LED 1246 and a third LED 1248 may have a common n-contact. The p-contacts 1220 and/or the reflector layer 1230 may form a pattern of metal tracks through the dielectric layer 1232. The bottom surfaces of the p-contacts 1220 and the reflector layer 1230 may be recessed with respect to the bottom surface of the dielectric layer 1232. A thermal expansion coefficient of the p-contacts 1220 and/or the reflector layer 1230 may be higher than a thermal expansion coefficient of the dielectric layer 1232.

The LEDs may be bonded to a substrate 1228 according to the hybrid bonding method described above with respect to FIGS. 9A-9D. The substrate 1228 may be a passive backplane or an active CMOS Si-backplane. For example, the substrate 1228 may include a passive or an active matrix integrated circuit within a Si layer. P-contacts 1224 may provide electrical contact to certain passive or active circuits (not shown) within the Si layer of the substrate 1228. Similarly, n-contacts 1226 may provide electrical contact to other passive or active circuits (not shown) within the Si layer of the substrate 1228. The p-contacts 1224 and the n-contacts 1226 may be configured to drive the LEDs. The p-contacts 1224 and the n-contacts 1226 may include, for example, Cu, Ag, Au, Al, W, Mo, Ni, Ti, Pt, Pd, or the like. In addition, a dielectric layer 1222 may be formed between the p-contacts 1224 and the n-contacts 1226. The dielectric layer 1222 may include, for example, SiCN, SiO$_2$, SiN, Al$_2$O$_3$, HfO$_2$, ZrO$_2$, Ta$_2$O$_5$, or the like. The p-contacts 1224 and/or the n-contacts 1226 may form a pattern of metal tracks through the dielectric layer 1222. The top surface of the dielectric layer 1222 may be recessed with respect to the top surfaces of the p-contacts 1224 and/or the n-contacts 1226. A thermal expansion coefficient of the p-contacts 1224 and/or the n-contacts 1226 may be higher than a thermal expansion coefficient of the dielectric layer 1222.

Before bonding the LEDs to the substrate 1228, various bonding surfaces may be planarized and polished using, for example, chemical mechanical polishing, as described above with reference to FIGS. 9A and 9B. For example, the top surfaces of the p-contacts 1224, the n-contacts 1226, and/or the dielectric layer 1222 may be planarized and polished. Alternatively or in addition, the bottom surfaces of the p-contacts 1220, the reflector layer 1230, and/or the dielectric layer 1232 may be planarized and polished. Some or all of the bonding surfaces may also be cleaned and activated.

P-contacts 1220 may be aligned with p-contacts 1224. For example, the pattern of metal tracks formed by the p-contacts 1220 through the dielectric layer 1232 may be aligned with the pattern of metal tracks formed by the p-contacts 1224 through the dielectric layer 1222. Hybrid bonding may then be performed by first performing dielectric bonding of the dielectric layer 1232 with the dielectric layer 1222, and then performing metal bonding of p-contacts 1220 with p-contacts 1224. As discussed above with respect to FIG. 9C, the dielectric bonding may be performed at an ambient temperature (i.e., room temperature). The dielectric bonding may include performing plasma activation of the dielectric layer 1232 and the dielectric layer 1222. The dielectric layer 1232 and the dielectric layer 1222 may have high dangling bond strengths at temperatures greater than or equal to the ambient temperature. For example, the dielectric layer 1232 and/or the dielectric layer 1222 may include SiCN having a C-content between 25% and 35% and a bond energy between 2,000 mJ/m$^2$ and 3,000 mJ/m$^2$. As discussed above with respect to FIG. 9D, the metal bonding may be performed by annealing the LED array 1200 at a higher temperature, such as between 150° C. and 250° C., in order to form a metal-to-metal bond between the p-contacts 1220 and the p-contacts 1224. The metal bonding may include performing local area thermo-compression bonding of the p-contacts 1220 and the p-contacts 1224.

Alternatively or in addition, reflector layers 1230 may be aligned with n-contacts 1226. For example, the pattern of metal tracks formed by the reflector layers 1230 through the dielectric layer 1232 may be aligned with the pattern of metal tracks formed by the n-contacts 1226 through the dielectric layer 1222. Hybrid bonding may then be performed by first performing dielectric bonding of the dielectric layer 1232 with the dielectric layer 1222, and then performing metal bonding of reflector layers 1230 with n-contacts 1226. As discussed above with respect to FIG. 9C, the dielectric bonding may be performed at an ambient temperature (i.e., room temperature). The dielectric bonding may include performing plasma activation of the dielectric layer 1232 and the dielectric layer 1222. The dielectric layer 1232 and the dielectric layer 1222 may have high dangling bond strengths at temperatures greater than or equal to the ambient temperature. For example, the dielectric layer 1232 and/or the dielectric layer 1222 may include SiCN having a C-content between 25% and 35% and a bond energy between 2,000 mJ/m$^2$ and 3,000 mJ/m$^2$. As discussed above with respect to FIG. 9D, the metal bonding may be performed by annealing the LED array 1200 at a higher temperature, such as between 150° C. and 250° C., in order to form a metal-to-metal bond between the reflector layers 1230 and the n-contacts 1226. The metal bonding may include performing local area thermo-compression bonding of the reflector layers 1230 and the n-contacts 1226.

FIG. 12B illustrates an example of another LED array 1205 that may be formed according to the hybrid bonding method described above with respect to FIGS. 9A-9D, and that may undergo p-side processing. The LED array 1205 may include a one-dimensional array of LEDs or a two-dimensional array of LEDs. Each LED of the LED array may be a large LED, a mini LED, a micro-LED, a tapered LED, or a superluminescent diode (SLED). In other embodiments, lasers may be used in place of the LEDs. Each LED of the LED array 1205 may include a semiconductor layer stack that has an n-side semiconductor layer 1252, an active light emitting layer 1254, and a p-side semiconductor layer 1256. The semiconductor layer stack may include a III-V material, such as GaN, InGaN, (AlGaIn)P, (AlGaIn)AsP, (AlGaIn)AsN, (AlGaIn)PAs, (Eu:InGa)N, or (AlGaIn)N. The n-side semiconductor layer 1252 may be n-doped (e.g., with Si or Ge) and the p-side semiconductor layer 1256 may be p-doped (e.g., with Mg, Ca, Zn, or Be). The semiconductor layer stack may have a thickness of less than 2 µm. The active light emitting layer 1254 may be sandwiched between the n-side semiconductor layer 1252 and the p-side semiconductor layer 1256, and may include one or more InGaN layers, one or more AlInGaP layers, and/or one or more GaN layers, which may form one or more heterostructures, such as one or more quantum wells or MQWs. A first LED 1284 may have a vertical mesa shape, and a second LED 1286 may have a parabolic mesa shape. Although the first LED 1284 and the second LED 1286 are shown as having different mesa shapes, some or all of the LEDs within the LED array may have the same mesa shape. A substrate 1250 may be a growth substrate for the LEDs or a temporary bond wafer.

Optionally, the semiconductor layer stack may also include a highly p-doped layer 1258. For example, for a red LED, the highly p-doped layer 1258 may include highly p-doped GaP or AlGaAs. The highly p-doped layer 1258 may have a higher concentration of p-type doping than the p-side semiconductor layer 1256. P-contacts 1260 may be provided beneath the semiconductor layer stack. The p-contacts 1260 may include, for example, Cu, Ag, Au, Al, W, Mo, Ni, Ti, Pt, Pd, or the like. The highly p-doped layer 1258 may be optimized for making contact to the p-contacts 1260. In addition, a dielectric layer 1272 may be formed around a reflector layer 1270 of each of the LEDs. The dielectric layer 1272 may include, for example, SiCN, SiO$_2$, SiN, Al$_2$O$_3$, HfO$_2$, ZrO$_2$, Ta$_2$O$_5$, or the like. Each reflector layer 1270 may include, for example, one or more metal or metal alloy materials, such as Al, Ag, Au, Pt, Ti, Cu, or any combination thereof. Each reflector layer 1270 may reflect light that is emitted by the active light emitting layer 1254. Further, each reflector layer 1270 may act as an n-contact by providing electrical contact to the n-side semiconductor layer 1252. Due to the configuration of the n-side semiconductor layer 1252, the first LED 1284 may have an isolated n-contact, while the second LED 1286 and a third LED 1288 may have a common n-contact. The p-contacts 1260 and/or the reflector layer 1270 may form a pattern of metal tracks through the dielectric layer 1272. The bottom surfaces of the p-contacts 1260 and the reflector layer 1270 may be recessed with respect to the bottom surface of the dielectric layer 1272. A thermal expansion coefficient of the p-contacts 1260 and/or the reflector layer 1270 may be higher than a thermal expansion coefficient of the dielectric layer 1272.

The LEDs may be bonded to a substrate 1268 according to the hybrid bonding method described above with respect to FIGS. 9A-9D. The substrate 1268 may be a passive backplane or an active CMOS Si-backplane. For example, the substrate 1268 may include a passive or an active matrix integrated circuit within a Si layer. P-contacts 1264 may provide electrical contact to certain passive or active circuits (not shown) within the Si layer of the substrate 1268. Similarly, n-contacts 1266 may provide electrical contact to other passive or active circuits (not shown) within the Si layer of the substrate 1268. The p-contacts 1264 and the n-contacts 1266 may be configured to drive the LEDs. The p-contacts 1264 and the n-contacts 1266 may include, for example, Cu, Ag, Au, Al, W, Mo, Ni, Ti, Pt, Pd, or the like. In addition, a dielectric layer 1262 may be formed between the p-contacts 1264 and the n-contacts 1266. The dielectric layer 1262 may include, for example, SiCN, $SiO_2$, SiN, $Al_2O_3$, $HfO_2$, $ZrO_2$, $Ta_2O_5$, or the like. The p-contacts 1264 and/or the n-contacts 1266 may form a pattern of metal tracks through the dielectric layer 1262. The top surface of the dielectric layer 1262 may be recessed with respect to the top surfaces of the p-contacts 1264 and/or the n-contacts 1266. A thermal expansion coefficient of the p-contacts 1264 and/or the n-contacts 1266 may be higher than a thermal expansion coefficient of the dielectric layer 1262.

Before bonding the LEDs to the substrate 1268, various bonding surfaces may be planarized and polished using, for example, chemical mechanical polishing, as described above with reference to FIGS. 9A and 9B. For example, the top surfaces of the p-contacts 1264, the n-contacts 1266, and/or the dielectric layer 1262 may be planarized and polished. Alternatively or in addition, the bottom surfaces of the p-contacts 1260, the reflector layer 1270, and/or the dielectric layer 1272 may be planarized and polished. Some or all of the bonding surfaces may also be cleaned and activated.

P-contacts 1260 may be aligned with p-contacts 1264. For example, the pattern of metal tracks formed by the p-contacts 1260 through the dielectric layer 1272 may be aligned with the pattern of metal tracks formed by the p-contacts 1264 through the dielectric layer 1262. Hybrid bonding may then be performed by first performing dielectric bonding of the dielectric layer 1272 with the dielectric layer 1262, and then performing metal bonding of p-contacts 1260 with p-contacts 1264. As discussed above with respect to FIG. 9C, the dielectric bonding may be performed at an ambient temperature (i.e., room temperature). The dielectric bonding may include performing plasma activation of the dielectric layer 1272 and the dielectric layer 1262. The dielectric layer 1272 and the dielectric layer 1262 may have high dangling bond strengths at temperatures greater than or equal to the ambient temperature. For example, the dielectric layer 1272 and/or the dielectric layer 1262 may include SiCN having a C-content between 25% and 35% and a bond energy between 2,000 $mJ/m^2$ and 3,000 $mJ/m^2$. As discussed above with respect to FIG. 9D, the metal bonding may be performed by annealing the LED array 1205 at a higher temperature, such as between 150° C. and 250° C., in order to form a metal-to-metal bond between the p-contacts 1260 and the p-contacts 1264. The metal bonding may include performing local area thermo-compression bonding of the p-contacts 1260 and the p-contacts 1264.

Alternatively or in addition, reflector layers 1270 may be aligned with n-contacts 1266. For example, the pattern of metal tracks formed by the reflector layers 1270 through the dielectric layer 1272 may be aligned with the pattern of metal tracks formed by the n-contacts 1266 through the dielectric layer 1262. Hybrid bonding may then be performed by first performing dielectric bonding of the dielectric layer 1272 with the dielectric layer 1262, and then performing metal bonding of reflector layers 1270 with n-contacts 1266. As discussed above with respect to FIG. 9C, the dielectric bonding may be performed at an ambient temperature (i.e., room temperature). The dielectric bonding may include performing plasma activation of the dielectric layer 1272 and the dielectric layer 1262. The dielectric layer 1272 and the dielectric layer 1262 may have high dangling bond strengths at temperatures greater than or equal to the ambient temperature. For example, the dielectric layer 1272 and/or the dielectric layer 1262 may include SiCN having a C-content between 25% and 35% and a bond energy between 2,000 $mJ/m^2$ and 3,000 $mJ/m^2$. As discussed above with respect to FIG. 9D, the metal bonding may be performed by annealing the LED array 1205 at a higher temperature, such as between 150° C. and 250° C., in order to form a metal-to-metal bond between the reflector layers 1270 and the n-contacts 1266. The metal bonding may include performing local area thermo-compression bonding of the reflector layers 1270 and the n-contacts 1266.

One advantage of the hybrid bonding method described with reference to FIGS. 9A-9D is that the LED array can be processed from both the n-side and the p-side. For example, before performing hybrid bonding, the LED array may be processed from a direction adjacent to the p-side semiconductor layer. This direction is generally indicated by the ion or fast atom beam 915 shown in FIG. 9B. The p-side processing may occur from above along a direction that is perpendicular to a plane that is parallel to a top surface of the n-contacts 982, the p-contacts 980, and/or the dielectric material layer 960. Alternatively, the p-side processing may occur from above along a direction having an angle of less than 90° with respect to the perpendicular direction. Referring to FIG. 12B, the p-side processing 1278 may occur from below along a direction that is perpendicular to a plane that is parallel to a bottom surface of the p-contacts 1260 and/or the dielectric layer 1272. Alternatively, the p-side processing 1278 may occur from below along a direction having an angle of less than 90° with respect to the perpendicular direction. Put another way, the p-side processing 1278 may occur from below along a direction that is adjacent to the bottom surface of the p-side semiconductor layer 1256, which is opposite to the active light emitting layer 1254.

Various types of p-side processing 1278 may be performed. For example, the p-side processing 1278 may include forming a plurality of mesa shapes within the p-side semiconductor layer 1256, the active light emitting layer 1254, and the n-side semiconductor layer 1252. For example, the first LED 1284 has a vertical mesa shape, and the second LED 1286 has a parabolic mesa shape. Within an LED array, the plurality of LEDs may have the same mesa shape or different mesa shapes. The p-side processing 1278 may also include forming a reflective layer on one, some, or all of the plurality of mesa shapes, such as the reflector layer 1270 shown in FIG. 12B. In some examples, the reflector layer 1270 may have a reflectivity that is greater than 80%.

Alternatively or in addition, the p-side processing 1278 may include performing ion implantation to increase the light output power (LOP) and decrease carrier leakage at low currents. Ion implantation is discussed in further detail below with respect to FIGS. 32-35B. Alternatively or in addition, the p-side processing 1278 may include quantum well intermixing to reduce lateral light reabsorption in the quantum wells, and to reduce lateral current flow and surface recombination losses at the mesa facets. Quantum well intermixing is discussed in further detail below with respect to FIGS. 36A-36C.

Alternatively or in addition, the p-side processing 1278 may include performing atomic layer deposition (ALD) of the semiconductor layer stack. Alternatively or in addition, the p-side processing 1278 may include performing overgrowth of the semiconductor layer stack. In some examples, the overgrowth may be performed by using molecular beam epitaxy (MBE). The ALD and/or the MBE may reduce surface recombination losses at a mesa facet of the plurality of mesa shapes.

Alternatively or in addition, before or after performing hybrid bonding, the LED array may be processed from a direction adjacent to the n-side semiconductor layer. Referring to FIG. 12A, n-side processing 1238 may occur from above along a direction that is perpendicular to a plane that is parallel to a top surface of the n-side semiconductor layer 1212. Alternatively, the n-side processing 1238 may occur from above along a direction having an angle of less than 90° with respect to the perpendicular direction. Put another way, the n-side processing 1238 may occur from above along a direction that is adjacent to the top surface of the n-side semiconductor layer 1212, which is opposite to the active light emitting layer 1214.

Various types of n-side processing 1238 may be performed. For example, the n-side processing 1238 may include performing ion implantation to increase the light output power (LOP) and decrease carrier leakage at low currents. Ion implantation is discussed in further detail below with respect to FIGS. 32-35B. Alternatively or in addition, the n-side processing 1238 may include quantum well intermixing to reduce lateral light reabsorption in the quantum wells, and to reduce lateral current flow and surface recombination losses at the mesa facets. Quantum well intermixing is discussed in further detail below with respect to FIGS. 36A-36C. Alternatively or in addition, the n-side processing 1238 may include etch processes such as singulation of the arrays. Alternatively or in addition, the n-side processing 1238 may include deposition processes to deposit lateral conductors such as indium tin oxide (ITO) and/or dielectric layers such as SiN or SiO for isolation or optical purposes.

FIG. 13A illustrates an example of another LED array 1300 that may be formed according to the hybrid bonding method described above with respect to FIGS. 9A-9D, and that may include secondary optics such as micro-lenses. The LED array 1300 may include a one-dimensional array of LEDs or a two-dimensional array of LEDs. Each LED of the LED array may be a large LED, a mini LED, a micro-LED, a tapered LED, or a superluminescent diode (SLED). In other embodiments, lasers may be used in place of the LEDs. Each LED of the LED array 1300 may include a semiconductor layer stack that has an n-side semiconductor layer 1312, an active light emitting layer 1314, and a p-side semiconductor layer 1316. The semiconductor layer stack may include a III-V material, such as GaN, InGaN, (AlGaIn)P, (AlGaIn)AsP, (AlGaIn)AsN, (AlGaIn)PAs, (Eu:InGa)N, or (AlGaIn)N. The n-side semiconductor layer 1312 may be n-doped (e.g., with Si or Ge) and the p-side semiconductor layer 1316 may be p-doped (e.g., with Mg, Ca, Zn, or Be). The semiconductor layer stack may have a thickness of less than 2 μm. The active light emitting layer 1314 may be sandwiched between the n-side semiconductor layer 1312 and the p-side semiconductor layer 1316, and may include one or more InGaN layers, one or more AlInGaP layers, and/or one or more GaN layers, which may form one or more heterostructures, such as one or more quantum wells or MQWs. A first LED 1344 may have a vertical mesa shape, and a second LED 1346 may have a parabolic mesa shape. Although the first LED 1344 and the second LED 1346 are shown as having different mesa shapes, some or all of the LEDs within the LED array 1300 may have the same mesa shape.

Optionally, the semiconductor layer stack may also include a highly p-doped layer 1318. For example, for a red LED, the highly p-doped layer 1318 may include highly p-doped GaP or AlGaAs. The highly p-doped layer 1318 may have a higher concentration of p-type doping than the p-side semiconductor layer 1316. P-contacts 1320 may be provided beneath the semiconductor layer stack. The p-contacts 1320 may include, for example, Cu, Ag, Au, Al, W, Mo, Ni, Ti, Pt, Pd, or the like. The highly p-doped layer 1318 may be optimized for making contact to the p-contacts 1320. In addition, a dielectric layer 1332 may be formed around a reflector layer 1330 of each of the LEDs. The dielectric layer 1332 may include, for example, SiCN, $SiO_2$, SiN, $Al_2O_3$, $HfO_2$, $ZrO_2$, $Ta_2O_5$, or the like. Each reflector layer 1330 may include, for example, one or more metal or metal alloy materials, such as Al, Ag, Au, Pt, Ti, Cu, or any combination thereof. Each reflector layer 1330 may reflect light that is emitted by the active light emitting layer 1314. Further, each reflector layer 1330 may act as an n-contact by providing electrical contact to the n-side semiconductor layer 1312. Due to the configuration of the n-side semiconductor layer 1312, the first LED 1344 may have an isolated n-contact, while the second LED 1346 and a third LED 1348 may have a common n-contact. The p-contacts 1320 and/or the reflector layer 1330 may form a pattern of metal tracks through the dielectric layer 1332. The bottom surfaces of the p-contacts 1320 and the reflector layer 1330 may be recessed with respect to the bottom surface of the dielectric layer 1332. A thermal expansion coefficient of the p-contacts 1320 and/or the reflector layer 1330 may be higher than a thermal expansion coefficient of the dielectric layer 1332.

The LEDs may be bonded to a substrate 1328 according to the hybrid bonding method described above with respect to FIGS. 9A-9D. The substrate 1328 may be a passive backplane or an active CMOS Si-backplane. For example, the substrate 1328 may include a passive or an active matrix integrated circuit within a Si layer. P-contacts 1324 may provide electrical contact to certain passive or active circuits (not shown) within the Si layer of the substrate 1328. Similarly, n-contacts 1326 may provide electrical contact to other passive or active circuits (not shown) within the Si layer of the substrate 1328. The p-contacts 1324 and the n-contacts 1326 may be configured to drive the LEDs. The p-contacts 1324 and the n-contacts 1326 may include, for example, Cu, Ag, Au, Al, W, Mo, Ni, Ti, Pt, Pd, or the like. In addition, a dielectric layer 1322 may be formed between the p-contacts 1324 and the n-contacts 1326. The dielectric layer 1322 may include, for example, SiCN, $SiO_2$, SiN, $Al_2O_3$, $HfO_2$, $ZrO_2$, $Ta_2O_5$, or the like. The p-contacts 1324 and/or the n-contacts 1326 may form a pattern of metal tracks through the dielectric layer 1322. The top surface of the dielectric layer 1322 may be recessed with respect to the top surfaces of the p-contacts 1324 and/or the n-contacts 1326. A thermal expansion coefficient of the p-contacts 1324 and/or the n-contacts 1326 may be higher than a thermal expansion coefficient of the dielectric layer 1322.

Before bonding the LEDs to the substrate 1328, various bonding surfaces may be planarized and polished using, for example, chemical mechanical polishing, as described above with reference to FIGS. 9A and 9B. For example, the top surfaces of the p-contacts 1324, the n-contacts 1326, and/or the dielectric layer 1322 may be planarized and polished. Alternatively or in addition, the bottom surfaces of the p-contacts 1320, the reflector layer 1330, and/or the dielectric layer 1332 may be planarized and polished. Some or all of the bonding surfaces may also be cleaned and activated.

P-contacts 1320 may be aligned with p-contacts 1324. For example, the pattern of metal tracks formed by the p-contacts 1320 through the dielectric layer 1332 may be aligned with the pattern of metal tracks formed by the p-contacts 1324 through the dielectric layer 1322. Hybrid bonding may then be performed by first performing dielectric bonding of the dielectric layer 1332 with the dielectric layer 1322, and then performing metal bonding of p-contacts 1320 with p-contacts 1324. As discussed above with respect to FIG. 9C, the dielectric bonding may be performed at an ambient temperature (i.e., room temperature). The dielectric bonding may include performing plasma activation of the dielectric layer 1332 and the dielectric layer 1322. The dielectric layer 1332 and the dielectric layer 1322 may have high dangling bond strengths at temperatures greater than or equal to the ambient temperature. For example, the dielectric layer 1332 and/or the dielectric layer 1322 may include SiCN having a C-content between 25% and 35% and a bond energy between 2,000 mJ/m$^2$ and 3,000 mJ/m$^2$. As discussed above with respect to FIG. 9D, the metal bonding may be performed by annealing the LED array 1300 at a higher temperature, such as between 150° C. and 250° C., in order to form a metal-to-metal bond between the p-contacts 1320 and the p-contacts 1324. The metal bonding may include performing local area thermo-compression bonding of the p-contacts 1320 and the p-contacts 1324.

Alternatively or in addition, reflector layers 1330 may be aligned with n-contacts 1326. For example, the pattern of metal tracks formed by the reflector layers 1330 through the dielectric layer 1332 may be aligned with the pattern of metal tracks formed by the n-contacts 1326 through the dielectric layer 1322. Hybrid bonding may then be performed by first performing dielectric bonding of the dielectric layer 1332 with the dielectric layer 1322, and then performing metal bonding of reflector layers 1330 with n-contacts 1326. As discussed above with respect to FIG. 9C, the dielectric bonding may be performed at an ambient temperature (i.e., room temperature). The dielectric bonding may include performing plasma activation of the dielectric layer 1332 and the dielectric layer 1322. The dielectric layer 1332 and the dielectric layer 1322 may have high dangling bond strengths at temperatures greater than or equal to the ambient temperature. For example, the dielectric layer 1332 and/or the dielectric layer 1322 may include SiCN having a C-content between 25% and 35% and a bond energy between 2,000 mJ/m$^2$ and 3,000 mJ/m$^2$. As discussed above with respect to FIG. 9D, the metal bonding may be performed by annealing the LED array 1300 at a higher temperature, such as between 150° C. and 250° C., in order to form a metal-to-metal bond between the reflector layers 1330 and the n-contacts 1326. The metal bonding may include performing local area thermo-compression bonding of the reflector layers 1330 and the n-contacts 1326.

FIG. 13B illustrates an example of another LED array 1305 that may be formed according to the hybrid bonding method described above with respect to FIGS. 9A-9D, and that may include secondary optics such as AR coatings and gratings. The LED array 1305 may include a one-dimensional array of LEDs or a two-dimensional array of LEDs. Each LED of the LED array may be a large LED, a mini LED, a micro-LED, a tapered LED, or a superluminescent diode (SLED). In other embodiments, lasers may be used in place of the LEDs. Each LED of the LED array 1305 may include a semiconductor layer stack that has an n-side semiconductor layer 1352, an active light emitting layer 1354, and a p-side semiconductor layer 1356. The semiconductor layer stack may include a III-V material, such as GaN, InGaN, (AlGaIn)P, (AlGaIn)AsP, (AlGaIn)AsN, (AlGaIn)PAs, (Eu:InGa)N, or (AlGaIn)N. The n-side semiconductor layer 1352 may be n-doped (e.g., with Si or Ge) and the p-side semiconductor layer 1356 may be p-doped (e.g., with Mg, Ca, Zn, or Be). The semiconductor layer stack may have a thickness of less than 2 μm. The active light emitting layer 1354 may be sandwiched between the n-side semiconductor layer 1352 and the p-side semiconductor layer 1356, and may include one or more InGaN layers, one or more AlInGaP layers, and/or one or more GaN layers, which may form one or more heterostructures, such as one or more quantum wells or MQWs. A first LED 1384 may have a vertical mesa shape, and a second LED 1386 may have a parabolic mesa shape.

Optionally, the semiconductor layer stack may also include a highly p-doped layer 1358. For example, for a red LED, the highly p-doped layer 1358 may include highly p-doped GaP or AlGaAs. The highly p-doped layer 1358 may have a higher concentration of p-type doping than the p-side semiconductor layer 1356. P-contacts 1360 may be provided beneath the semiconductor layer stack. The p-contacts 1360 may include, for example, Cu, Ag, Au, Al, W, Mo, Ni, Ti, Pt, Pd, or the like. The highly p-doped layer 1358 may be optimized for making contact to the p-contacts 1360. In addition, a dielectric layer 1372 may be formed around a reflector layer 1370 of each of the LEDs. The dielectric layer 1372 may include, for example, SiCN, SiO$_2$, SiN, Al$_2$O$_3$, HfO$_2$, ZrO$_2$, Ta$_2$O$_5$, or the like. Each reflector layer 1370 may include, for example, one or more metal or metal alloy materials, such as Al, Ag, Au, Pt, Ti, Cu, or any combination thereof. Each reflector layer 1370 may reflect light that is emitted by the active light emitting layer 1354. Further, each reflector layer 1370 may act as an n-contact by providing electrical contact to the n-side semiconductor layer 1352. Due to the configuration of the n-side semiconductor layer 1352, the first LED 1384 may have an isolated n-contact, while the second LED 1386 and a third LED 1388 may have a common n-contact. The p-contacts 1360 and/or the reflector layer 1370 may form a pattern of metal tracks through the dielectric layer 1372. The bottom surfaces of the p-contacts 1360 and the reflector layer 1370 may be recessed with respect to the bottom surface of the dielectric layer 1372. A thermal expansion coefficient of the p-contacts 1360 and/or the reflector layer 1370 may be higher than a thermal expansion coefficient of the dielectric layer 1372.

The LEDs may be bonded to a substrate 1368 according to the hybrid bonding method described above with respect to FIGS. 9A-9D. The substrate 1368 may be a passive backplane or an active CMOS Si-backplane. For example, the substrate 1368 may include a passive or an active matrix integrated circuit within a Si layer. P-contacts 1364 may provide electrical contact to certain passive or active circuits (not shown) within the Si layer of the substrate 1368. Similarly, n-contacts 1366 may provide electrical contact to other passive or active circuits (not shown) within the Si layer of the substrate 1368. The p-contacts 1364 and the n-contacts 1366 may be configured to drive the LEDs. The p-contacts 1364 and the n-contacts 1366 may include, for example, Cu, Ag, Au, Al, W, Mo, Ni, Ti, Pt, Pd, or the like. In addition, a dielectric layer 1362 may be formed between the p-contacts 1364 and the n-contacts 1366. The dielectric layer 1362 may include, for example, SiCN, SiO$_2$, SiN, Al$_2$O$_3$, HfO$_2$, ZrO$_2$, Ta$_2$O$_5$, or the like. The p-contacts 1364 and/or the n-contacts 1366 may form a pattern of metal tracks through the dielectric layer 1362. The top surface of the dielectric layer 1362 may be recessed with respect to the top surfaces of the p-contacts 1364 and/or the n-contacts 1366. A thermal expansion coefficient of the p-contacts 1364 and/or the n-contacts 1366 may be higher than a thermal expansion coefficient of the dielectric layer 1362.

Before bonding the LEDs to the substrate 1368, various bonding surfaces may be planarized and polished using, for example, chemical mechanical polishing, as described above with reference to FIGS. 9A and 9B. For example, the top surfaces of the p-contacts 1364, the n-contacts 1366, and/or the dielectric layer 1362 may be planarized and polished. Alternatively or in addition, the bottom surfaces of the p-contacts 1360, the reflector layer 1370, and/or the dielectric layer 1372 may be planarized and polished. Some or all of the bonding surfaces may also be cleaned and activated.

P-contacts 1360 may be aligned with p-contacts 1364. For example, the pattern of metal tracks formed by the p-contacts 1360 through the dielectric layer 1372 may be aligned with the pattern of metal tracks formed by the p-contacts 1364 through the dielectric layer 1362. Hybrid bonding may then be performed by first performing dielectric bonding of the dielectric layer 1372 with the dielectric layer 1362, and then performing metal bonding of p-contacts 1360 with p-contacts 1364. As discussed above with respect to FIG. 9C, the dielectric bonding may be performed at an ambient temperature (i.e., room temperature). The dielectric bonding may include performing plasma activation of the dielectric layer 1372 and the dielectric layer 1362. The dielectric layer 1372 and the dielectric layer 1362 may have high dangling bond strengths at temperatures greater than or equal to the ambient temperature. For example, the dielectric layer 1372 and/or the dielectric layer 1362 may include SiCN having a C-content between 25% and 35% and a bond energy between 2,000 mJ/m$^2$ and 3,000 mJ/m$^2$. As discussed above with respect to FIG. 9D, the metal bonding may be performed by annealing the LED array 1305 at a higher temperature, such as between 150° C. and 250° C., in order to form a metal-to-metal bond between the p-contacts 1360 and the p-contacts 1364. The metal bonding may include performing local area thermo-compression bonding of the p-contacts 1360 and the p-contacts 1364.

Alternatively or in addition, reflector layers 1370 may be aligned with n-contacts 1366. For example, the pattern of metal tracks formed by the reflector layers 1370 through the dielectric layer 1372 may be aligned with the pattern of metal tracks formed by the n-contacts 1366 through the dielectric layer 1362. Hybrid bonding may then be performed by first performing dielectric bonding of the dielectric layer 1372 with the dielectric layer 1362, and then performing metal bonding of reflector layers 1370 with n-contacts 1366. As discussed above with respect to FIG. 9C, the dielectric bonding may be performed at an ambient temperature (i.e., room temperature). The dielectric bonding may include performing plasma activation of the dielectric layer 1372 and the dielectric layer 1362. The dielectric layer 1372 and the dielectric layer 1362 may have high dangling bond strengths at temperatures greater than or equal to the ambient temperature. For example, the dielectric layer 1372 and/or the dielectric layer 1362 may include SiCN having a C-content between 25% and 35% and a bond energy between 2,000 mJ/m$^2$ and 3,000 mJ/m$^2$. As discussed above with respect to FIG. 9D, the metal bonding may be performed by annealing the LED array 1305 at a higher temperature, such as between 150° C. and 250° C., in order to form a metal-to-metal bond between the reflector layers 1370 and the n-contacts 1366. The metal bonding may include performing local area thermo-compression bonding of the reflector layers 1370 and the n-contacts 1366.

As shown in FIGS. 13A and 13B, various optics may be formed to correspond to the LEDs on an n-side of the LEDs. The optics may be formed after a growth substrate or a temporary substrate is removed from the top surface of the LEDs. The optics may be formed before or after the hybrid bonding method has been performed. For example, as shown in FIG. 13A, a spherical micro-lens 1342 and a micro-lens 1344 may be formed above their respective LEDs. The spherical micro-lens 1342 and the micro-lens 1344 may be formed from a direction adjacent to a surface of the n-side semiconductor layer 1312 that is opposite to the active light emitting layer 1314. Similarly, as shown in FIG. 13B, an AR coating 1382 and a grating 1384 may be formed above their respective LEDs. The AR coating 1382 and the grating 1384 may be formed from a direction adjacent to a surface of the n-side semiconductor layer 1352 that is opposite to the active light emitting layer 1354. Alternatively or in addition, n-side processing 1338 may be performed with respect to the LEDs shown in FIG. 13A. The n-side processing 1338 may be similar to the n-side processing 1238 described above with reference to FIG. 12A. Alternatively or in addition, p-side processing 1378 may be performed with respect to the LEDs shown in FIG. 13B. The p-side processing 1378 may be similar to the p-side processing 1278 described above with reference to FIG. 12B.

Figure 14:
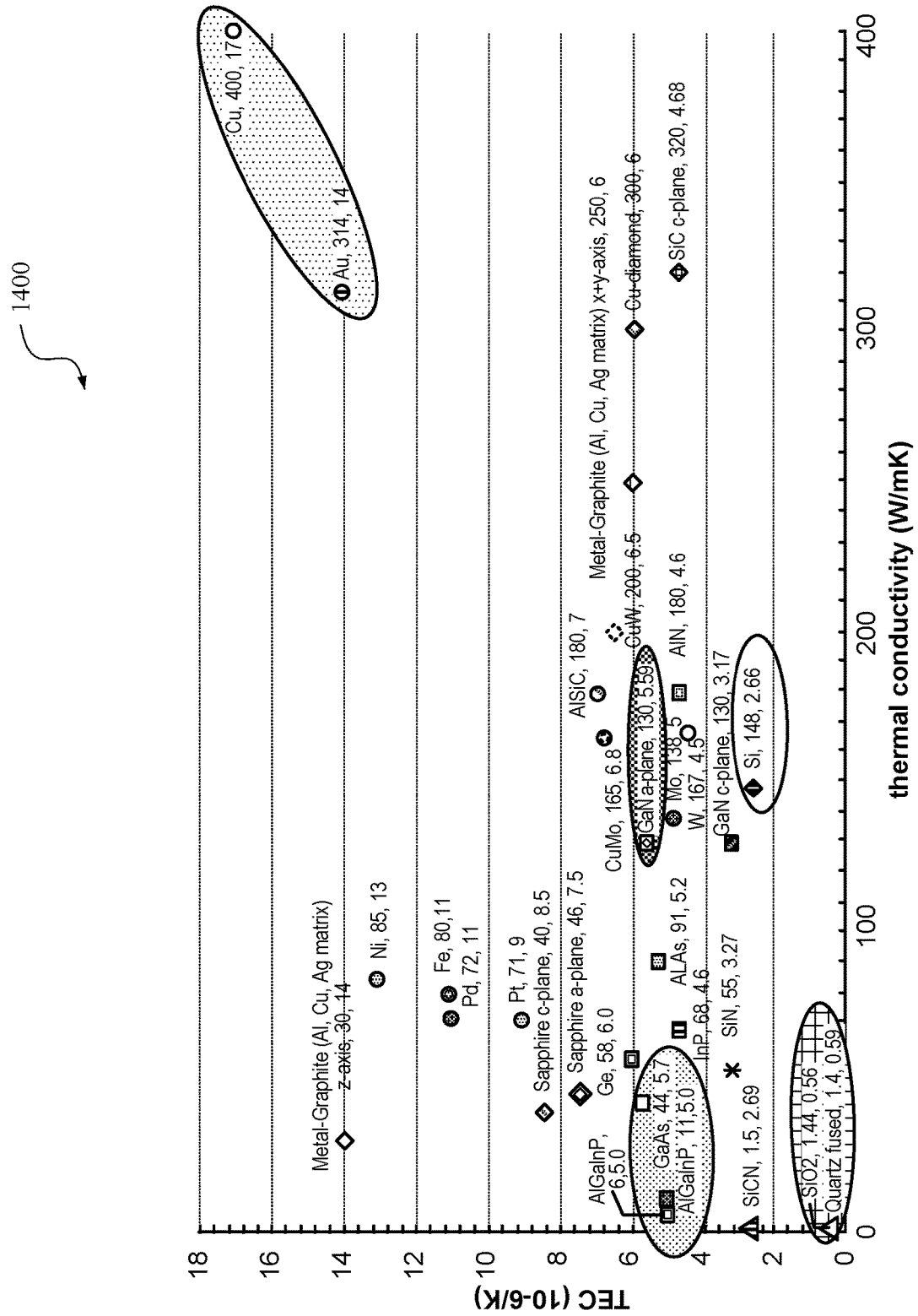
FIG. 14 shows a plot of the thermal expansion coefficient as a function of the thermal conductivity for various materials.

FIG. 14 shows a plot 1400 of the thermal expansion coefficient as a function of the thermal conductivity for various materials. As shown in FIG. 14, the thermal expansion coefficient of the III-V semiconductor material of the semiconductor layer stack may be different from the thermal expansion coefficient of the Si layer. For example, for blue and green LEDs, GaN has a TEC of 3.17 ppm/K at a first crystal orientation and a TEC of 5.59 ppm/K at a second crystal orientation. For infrared LEDs, GaAs/AlGaInAs has a TEC of 5.73 ppm/K. For red LEDs, AlGaAs/AlGaInP has a TEC of 5 ppm/K. In contrast, Si has a TEC of 2.66 ppm/K. This may cause wafer bow, cracking, and run-out during the thermal annealing step of the hybrid bonding method. Run-out occurs when the centers of the contacts become misaligned. For example, referring back to FIG. 11A, the centers of some or all of the p-contacts 1124 may become misaligned with the centers of the respective p-contacts 1120. In some examples, the contacts near the middle of the wafer may be correctly aligned, while the contacts near the outer perimeter of the wafer may become misaligned. Accordingly, embodiments of the invention provide various methods for compensating this run-out. In some examples, the run-out may be compensated to be less than 200 nm. For example, the maximum misalignment between the centers of the contacts may be compensated to be less than 200 mm for wafers having a maximum lateral dimension of up to 200 mm.

Figure 15:
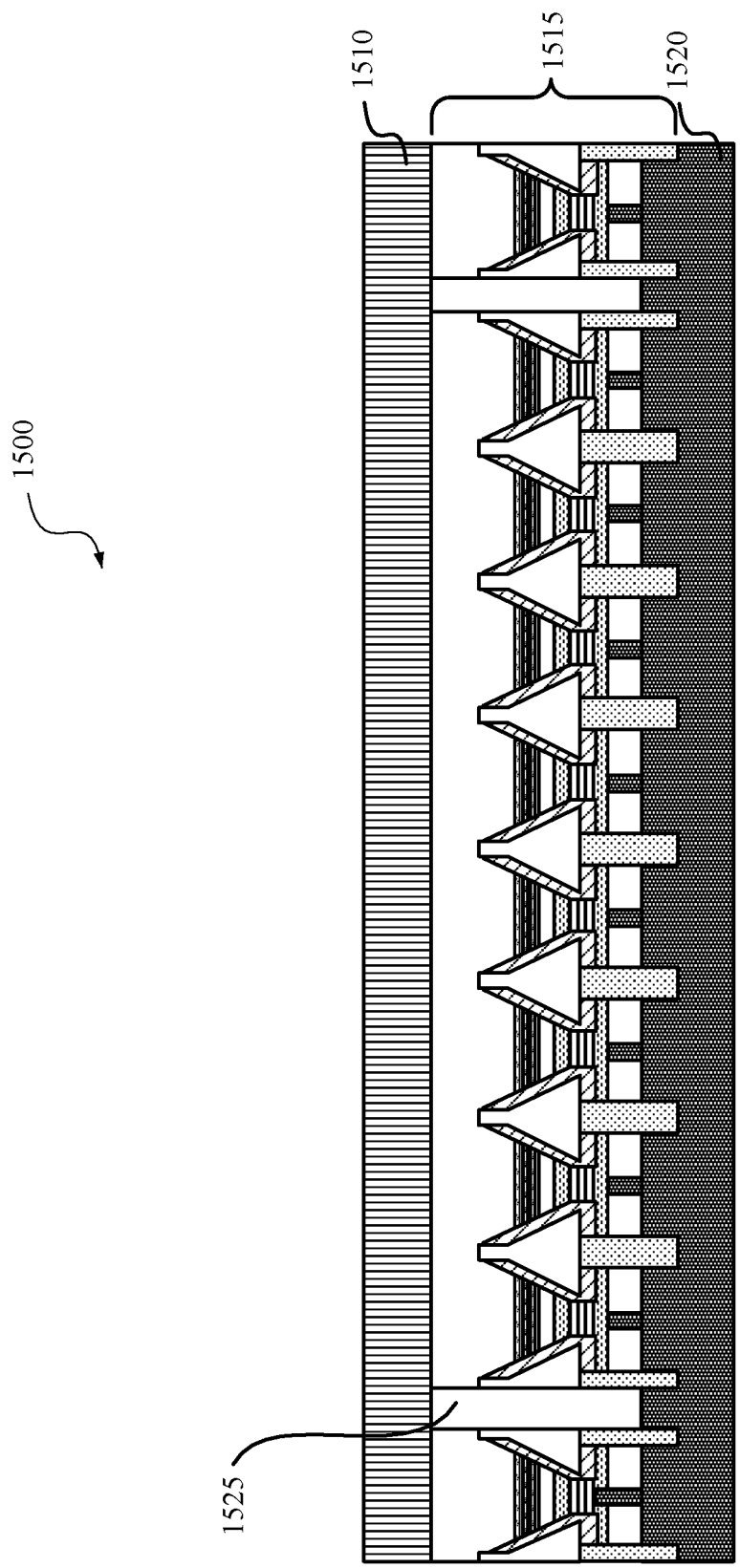
FIG. 15 illustrates an example of an LED array in which run-out may be compensated by forming trenches between adjacent LEDs according to certain embodiments.

FIG. 15 illustrates an example of an LED array 1500 in which run-out may be compensated by forming trenches between adjacent LEDs according to certain embodiments. As shown in FIG. 15, the LED array 1500 includes a plurality of LEDs 1515 that have a common n-contact. The plurality of LEDs 1515 are bonded to a substrate 1520 that may be a passive backplane or an active CMOS Si backplane. The LED array 1500 may also include a substrate 1510 that may be an LED growth substrate or a temporary bonded substrate. As shown in FIG. 15, a plurality of trenches 1525 may be formed between adjacent LEDs 1515. The trenches 1525 may be formed before performing hybrid bonding of the plurality of LEDs 1515 to the substrate 1520. In this example, the trenches 1525 extend from the bottom surface of the substrate 1510 to the top surface of the substrate 1520. The trenches 1525 may be formed between each pair of adjacent LEDs 1515 or between groups of adjacent LEDs 1515. The trenches 1525 may also be used to singulate the LEDs 1515 during cool-down. FIGS. 12A and 12B show additional examples of trenches 1240 and 1280, respectively. Similarly, FIGS. 13A and 13B show additional examples of trenches 1340 and 1380, respectively.

Figure 16:
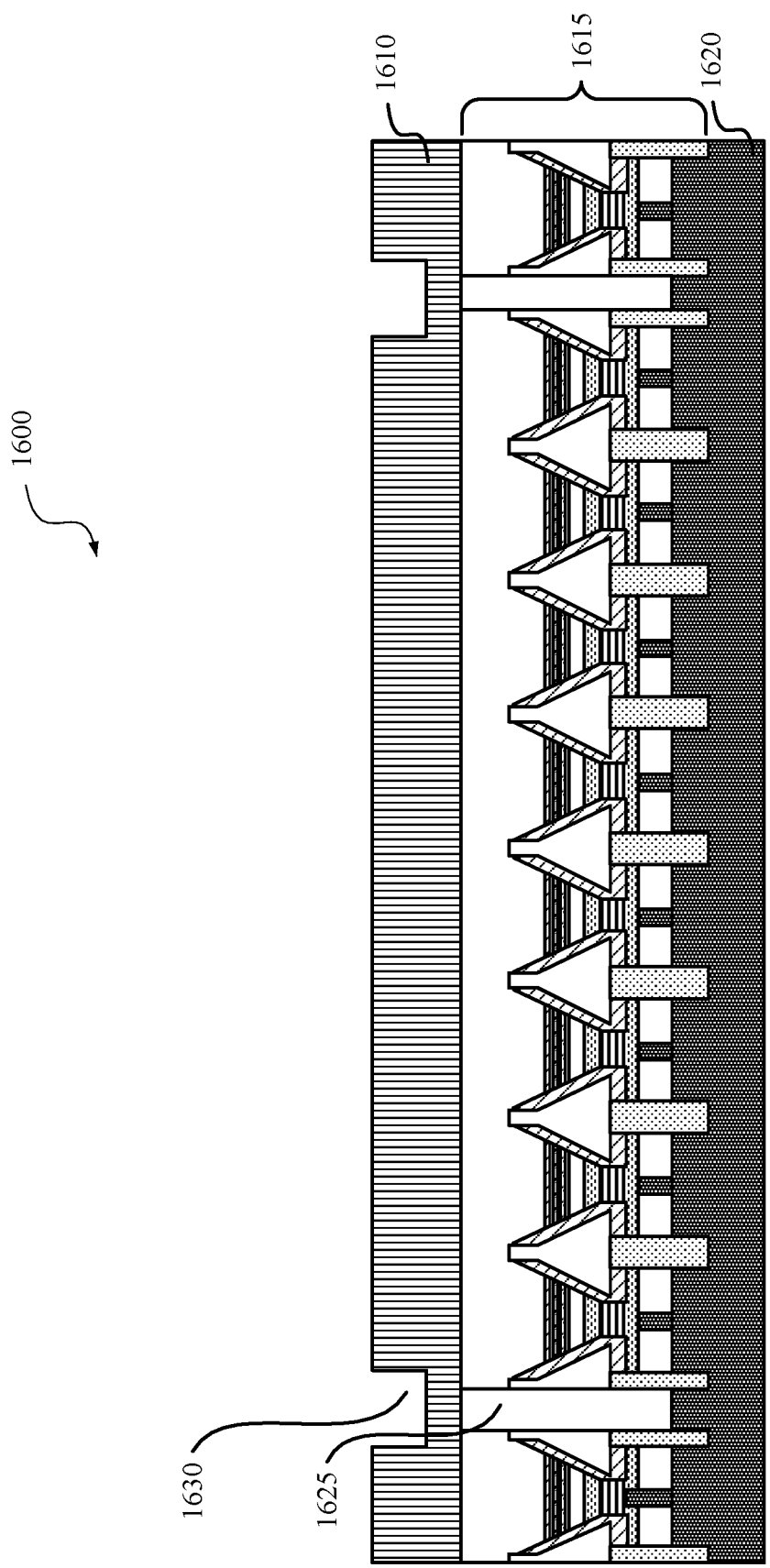
FIG. 16 illustrates an example of another LED array in which run-out may be compensated by forming trenches between adjacent LEDs and by forming corresponding trenches through the substrate according to certain embodiments.

FIG. 16 illustrates another example of an LED array 1600 in which run-out may be compensated by forming trenches between adjacent LEDs and by forming corresponding trenches through the substrate according to certain embodiments. As shown in FIG. 16, the LED array 1600 includes a plurality of LEDs 1615 that have a common n-contact. The plurality of LEDs 1615 are bonded to a substrate 1620 that may be a passive backplane or an active CMOS Si backplane. The LED array 1600 may also include a substrate 1610 that may be an LED growth substrate. As shown in FIG. 16, a plurality of trenches 1625 may be formed between adjacent LEDs 1615. The trenches 1625 may be formed before performing hybrid bonding of the plurality of LEDs 1615 to the substrate 1620. In this example, the trenches 1625 extend from the bottom surface of the substrate 1610 to the top surface of the substrate 1620. The trenches 1625 may be formed between each pair of adjacent LEDs 1615 or between groups of adjacent LEDs 1615. Partial trenches 1630 may also be formed through the substrate 1610. The partial trenches 1630 may be at least partially aligned with the trenches 1625. In some examples, the partial trenches 1630 may be formed by sawing through a portion of the substrate 1610.

Figure 17:
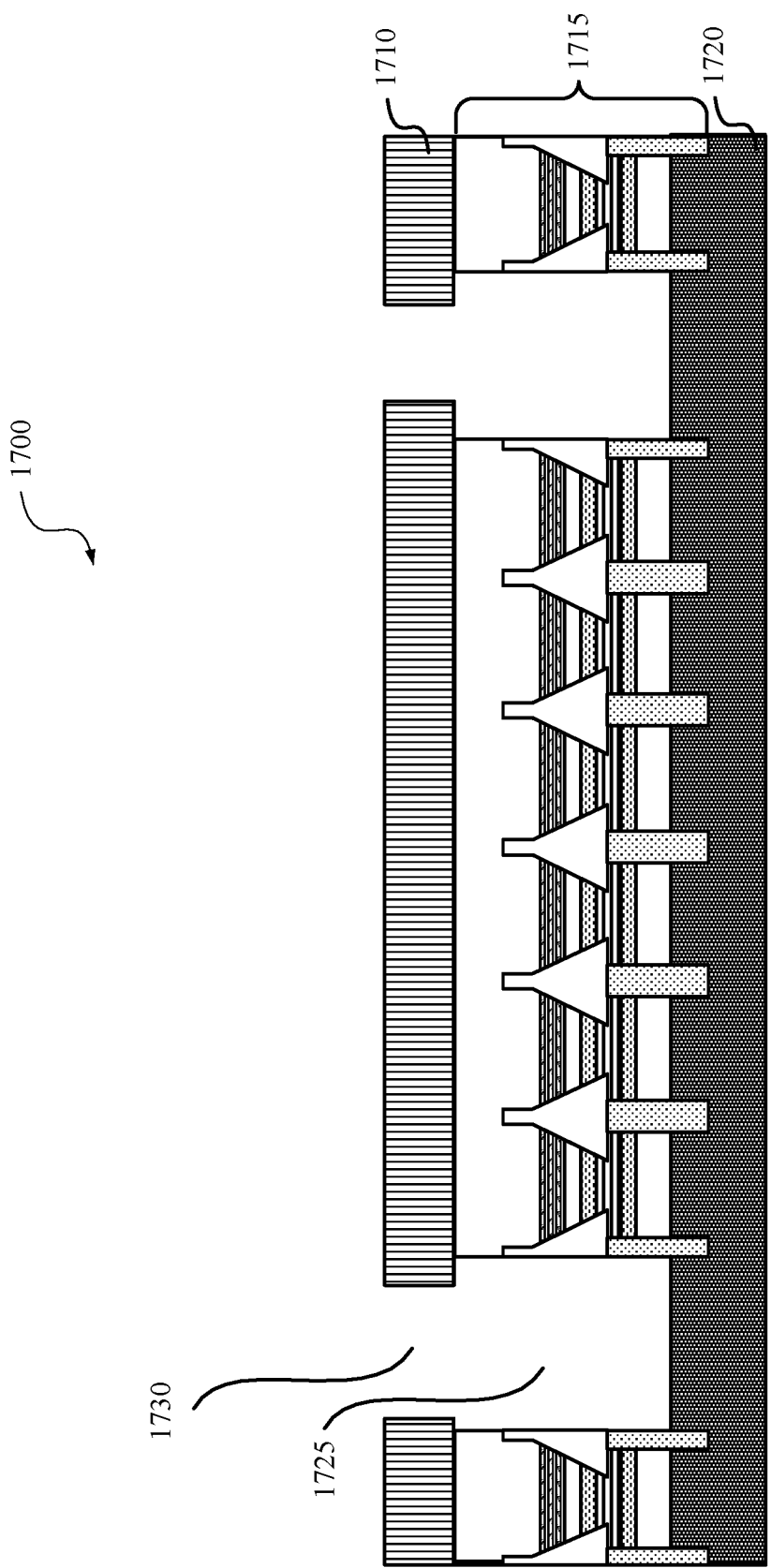
FIG. 17 illustrates an example of another LED array in which run-out may be compensated by forming trenches between adjacent LEDs and by forming corresponding full through the substrate according to certain embodiments.

FIG. 17 illustrates another example of an LED array 1700 in which run-out may be compensated by forming trenches between adjacent LEDs and by forming corresponding full through the substrate according to certain embodiments. As shown in FIG. 17, the LED array 1700 includes a plurality of LEDs 1715 that have a common n-contact. The plurality of LEDs 1715 are bonded to a substrate 1720 that may be a passive backplane or an active CMOS Si backplane. The LED array 1700 may also include a substrate 1710 that may be an LED growth substrate. As shown in FIG. 17, a plurality of trenches 1725 may be formed between adjacent LEDs 1715. The trenches 1725 may be formed before performing hybrid bonding of the plurality of LEDs 1715 to the substrate 1720. In this example, the trenches 1725 extend from the bottom surface of the substrate 1710 to the top surface of the substrate 1720. The trenches 1725 may be formed between each pair of adjacent LEDs 1715 or between groups of adjacent LEDs 1715. Full trenches 1730 may also be formed through the substrate 1710. The full trenches 1730 may be at least partially aligned with the trenches 1725. In some examples, the full trenches 1730 may be formed by dicing the substrate 1710. Any remaining mismatch of the TECs may be scaled down to a die level of 1 mm×2 mm or 3 mm×5 mm for large two-dimensional LED arrays with a high pixel count (such as HD and 2K displays) and a low pixel pitch (such as 1.2 μm to 10 μm).

Figure 18:
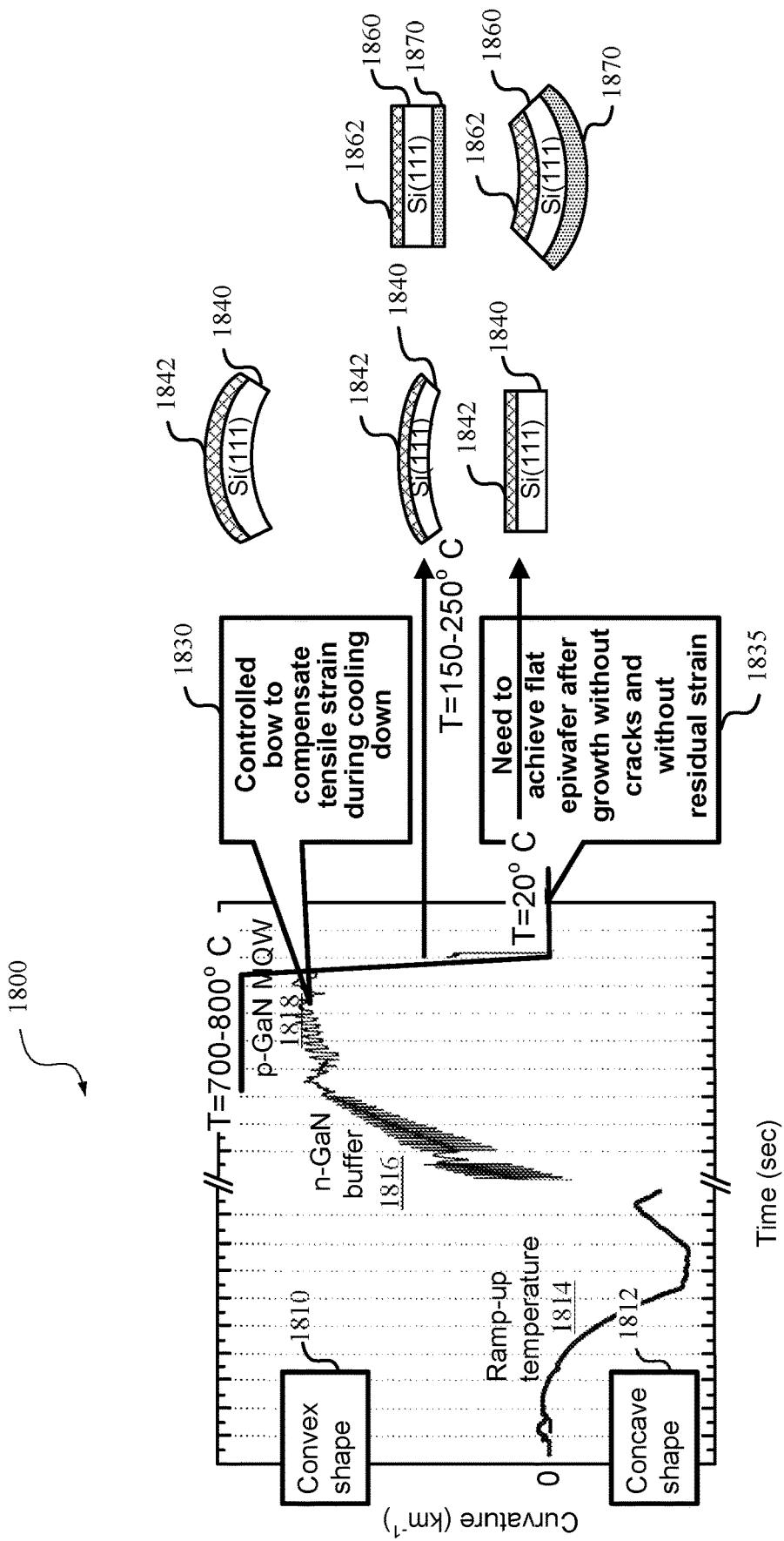
FIG. 18 illustrates an example of another LED array in which run-out may be compensated by changing the shape of components within an LED array according to certain embodiments.

FIG. 18 illustrates an example of a method 1800 in which run-out may be compensated by changing the shape of components within an LED array according to certain embodiments. For example, the graph shown on the left-hand side of FIG. 18 illustrates a curvature profile for GaN-based LEDs on a Si substrate. As shown in FIG. 18, the epitaxially-grown GaN-on-Si, which includes a GaN layer 1842 and an Si layer 1840, may be formed to have a concave shape 1812 or a convex shape 1810 after performing the dielectric bonding but before performing the metal bonding of the hybrid bonding method. For example, the GaN-on-Si may be formed to have the concave shape 1812 before beginning the ramp-up temperature 1814. The curvature of an n-GaN buffer 1816 and a p-GaN MQW 1818 may change as the GaN-on-Si is heated. The GaN-on-Si has a large curvature at a temperature between 700° C. and 800° C., a moderate curvature at a temperature between 150° C. and 250° C., and no curvature at a temperature of 20° C.

Alternatively or in addition, the run-out may be compensated by forming a TEC compensation layer on the GaN layer 1842 and/or the Si layer 1840. In the example shown on the right-hand side of FIG. 18, a TEC compensation layer 1870 is formed on the bottom surface of the Si layer 1840. The TEC compensation layer 1870 may be formed before performing the dielectric bonding or before performing the metal bonding of the hybrid bonding method. For example, the TEC compensation layer 1870 may be a Cu layer having a TEC of 17 ppm/K or a Ni layer having a TEC of 13 ppm/K. The higher TEC of the TEC compensation layer 1870 may compensate the lower TEC of the Si layer (2.66 ppm/K) and match the TEC with a typical III-V semiconductor TEC between 4 ppm/K and 6 ppm/K. The chart 1400 shown in FIG. 14 may be referenced to select various materials for the TEC compensation layer 1870. Further, a Taiko grinding process may be used to reduce the thickness of the TEC compensation layer 1870 and customize the amount of compensation for each III-V material. In other examples, a temporary TEC compensation layer (not shown) may be formed on the top surface of the GaN layer 1862. After performing the hybrid bonding method, the temporary TEC compensation layer may be removed from the top surface of the GaN layer 1862 by using the Taiko grinding process, selective etching, and/or laser lift-off (LLO). In other examples, a patterned TEC compensation layer may be formed that has gaps between adjacent LEDs or groups of LEDs.

Alternatively or in addition, the run-out may be compensated by adjusting the temperature profiles that are applied during the hybrid bonding method. The temperatures that are applied to the GaN layer 1842 and the Si layer 1840 may be controlled independently, and various vertical and lateral temperature profiles may be used. A finite element method (FEM) may also simulate and compensate the run-out based on vertical and lateral temperature gradients. Further, the run-out may be minimized by using a laser to perform local area heating and annealing.

Alternatively or in addition, the run-out may be compensated by performing dishing of various metal components within the LED array. For example, p-contacts 1120 shown in FIG. 11A may be dished, as illustrated by gap 1136. Similarly, p-contacts 1220 shown in FIG. 12A may be dished, as illustrated by gap 1236. Likewise, p-contacts 1320 shown in FIG. 13A may be dished, as illustrated by gap 1336. Using FIG. 11A as an example, other contacts may also be dished, such as p-contacts 1124. Further, the integrated circuit within the substrate 1128 may be dished. The dishing may provide better electrical conductivity after the hybrid bonding method is performed.

Some or all of the methods discussed above may result in LED arrays having improved performance. For example, the hybrid bonding method allows for high-precision bonding along with both n-side and p-side processing. The hybrid bonding method also allows for reducing surface recombination losses by various methods discussed above. Lateral carrier diffusion may be reduced in the p-side semiconductor layer, the active light emitting layer, and/or the n-side semiconductor layer. Fewer surface states and defects may result in a lower surface recombination velocity (SRV). As discussed in further detail below, lateral (in-plane) carrier confinement may be achieved based on a local e-h-potential barrier with quantum-dot (QD) behavior in AlInGaP for red micro-LEDs or InGaN-QD-like behavior for green and blue micro-LEDs based on In-fluctuations inside the quantum wells.

Various methods may be used to reduce the SRV and the e-h diffusion in micro-LEDs in conjunction with the hybrid bonding method. For example, sub-surface damage may be addressed by performing a wet chemical etch and adding a dielectric material having a thinner first layer with higher quality and fewer defects at the heterointerface and a thicker second layer. Sub-surface damage may also be addressed by performing a dry chemical etch, such as inductively coupled plasma (ICP) etching. The sub-surface damage may be minimized by reducing the physical component of the etching, such as by reducing the ion energy, and/or by increasing the chemical component of the etching, such as by using Cl-based etching with a high plasma density.

Alternatively or in addition, sidewall passivation may be performed via a wet chemical surface clean or etch, such as with TMAH, dilute HCl, or sulfidation, and/or by depositing a dielectric material, such as SiN, $SiO_2$, AlN, $HfO_2$, or GaO. Sidewall passivation may also be performed via an in-situ surface clean, such as with plasma or hydrogen in an ultra-high vacuum (UHV) chamber, and/or by depositing two layers of a dielectric material. The first layer of the dielectric material may be deposited by inductively-coupled plasma enhanced chemical vapor deposition (ICPECVD), atomic layer deposition (ALD), or sputtering. The first layer of the dielectric material may have a thickness between 5 nm and 15 nm. The second layer of the dielectric material may be deposited at a higher rate than the first layer of the dielectric. The second layer of the dielectric material may have a thickness between 30 nm and 450 nm, such as a thickness between 50 nm and 120 nm. Sidewall passivation may also be performed via nitridation with an $NH_3$ or $N_2$ plasma, and/or by depositing a dielectric material.

Alternatively or in addition, overgrowth may be performed via an in-situ clean and epitaxial passivation. For example, an UHV clean may be performed with hydrogen, and molecular beam epitaxy (MBE) overgrowth may be performed with materials such as ZnSe or AlGaN for red and IR micro-LEDs, and materials such as AlN, $Al_2O_3$, or GaO for AlGaN-based UV, blue, green, and red LEDs.

Alternatively or in addition, ion implantation and/or quantum well intermixing may be performed. Ion implantation is discussed with respect to FIGS. 32-35B and quantum well intermixing is discussed with respect to FIGS. 36A-36C.

As discussed in further detail below, reducing the SRV to 900 cm/s may increase the effective internal quantum efficiency ($IQE_{eff}$). The $IQE_{eff}$ is the IQE at device level. For red micro-LEDs the peak $IQE_{eff}$ may be 10%, greater than 20%, greater than 40%, or greater than 80%, and the surface loss may be reduced to less than 10%. For blue micro-LEDs the peak $IQE_{eff}$ may be greater than 60%, and the surface loss may be reduced to less than 7%. For green micro-LEDs the peak $IQE_{eff}$ may be greater than 45%, and the surface loss may be reduced to less than 10%.

In some examples, for red micro-LEDs the peak $IQE_{eff}$ may be 10% at a current density of 1-30 A/cm², and the total wall-plug efficiency (WPE) may be greater than 8% at a current density of 1-30 A/cm². For blue micro-LEDs the peak $IQE_{eff}$ may be greater than 60% at a current density of 0.1-20 A/cm², the surface loss may be 7%, the SRV may be reduced to 900 cm/s, and the total WPE may be greater than 10% at a current density of 0.1-20 A/cm². For green micro-LEDs the peak $IQE_{eff}$ may be greater than 40% at a current density of 0.7-10 A/cm², the surface loss may be 10%, the SRV may be reduced to 900 cm/s, and the total WPE may be greater than 5% at a current density of 0.7-10 A/cm².

Alternatively or in addition, the peak external quantum efficiency (EQE) current may be reduced by using fewer quantum wells, thinner quantum wells, and/or quantum dots. The peak EQE current may be reduced and the carrier lifetime may be improved to greater than 700 ns by providing low non-radiative recombination inside the quantum wells and low surface recombination loss at the mesa facets. For example, red micro-LEDs may have a non-radiative recombination time greater than 1 μsec, while blue and green micro-LEDs may have a non-radiative recombination time greater than 0.5 μsec. Red micro-LEDs may have an SRV less than 3E4 cm/s and an e-h diffusion less than 1 cm²/s, and blue and green micro-LEDs may have an SRV less than 1E4 cm/s and an e-h diffusion less than or equal to 2 cm²/s.

FIGS. 19A-23 illustrate examples of the improved performance of red micro-LEDs having a maximum lateral dimension between 1 μm and 10 μm by full device simulation. These examples reduce the SRV to between 1E4 cm/s and 2E4 cm/s, and reduce the lateral e-h diffusion within the active light emitting region with two-dimensional electron gas (2DEG) and two-dimensional hole gas (2DHG) from 20 cm²/s to 0.07 cm²/s. In some examples, these results may be achieved via lateral carrier blocking by techniques such as quantum well intermixing, ion implantation, overgrowth, etc.

Figure 19B:
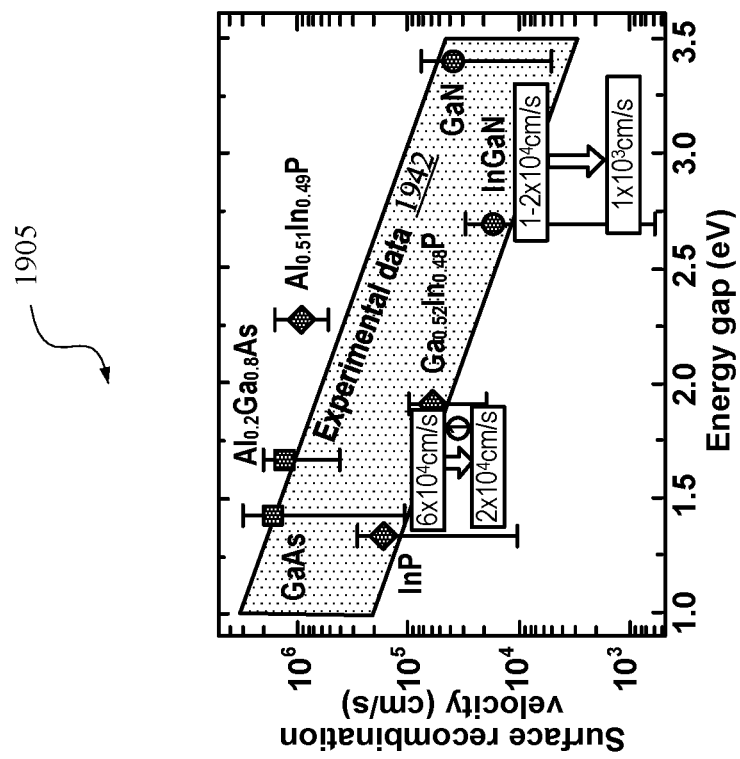
FIGS. 19A and 19B show simulated plots of performance parameters for red micro-LEDs having a vertical mesa shape and a maximum lateral dimension of 10 μm.
Figure 19A:
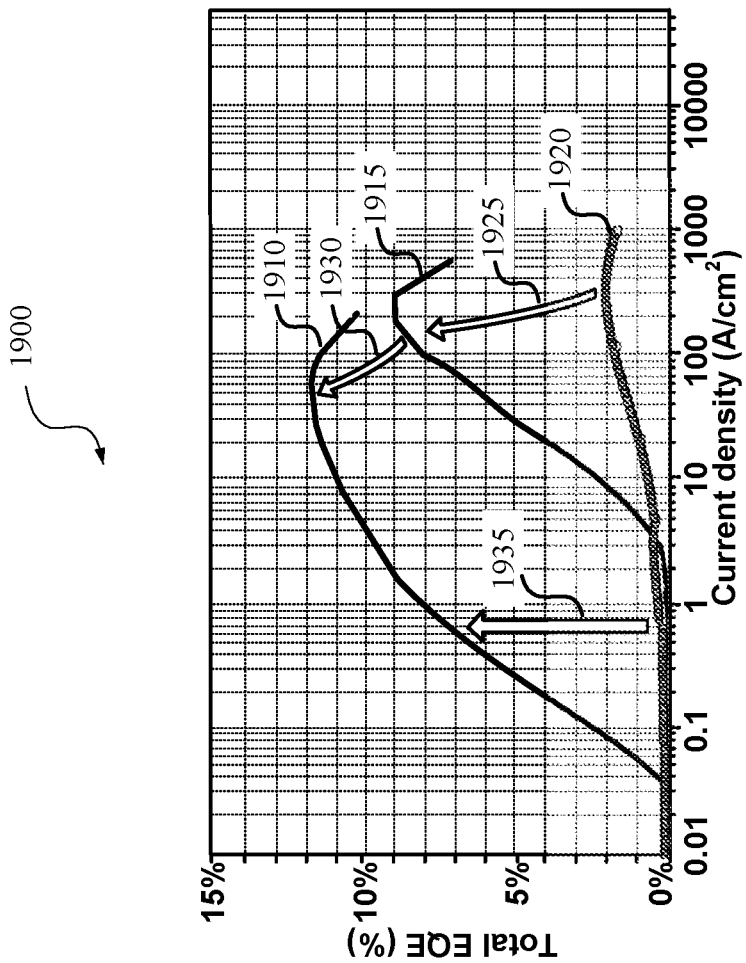

FIGS. 19A and 19B show simulated plots of performance parameters for red micro-LEDs having a vertical mesa shape and a maximum lateral dimension of 10 μm. FIG. 19A shows a simulated plot 1900 of the total external quantum efficiency (EQE) as a function of the current density. Curve 1920 represents the total EQE of a first standard red micro-LED, curve 1915 represents the total EQE of a first improved red micro-LED having a SRV of 3E4 cm/s and an e-h diffusion of 20 cm²/s, and curve 1910 represents the total EQE of a second improved red micro-LED having an SRV of 2E4 cm/s and an e-h diffusion of 0.07 cm²/s. Arrow 1925 indicates the improvement in total EQE between the first standard red micro-LED and the first improved red micro-LED, arrow 1930 indicates the improvement in total EQE between the first improved red micro-LED and the second improved red micro-LED, and arrow 1935 indicates the improvement in total EQE between the first standard red micro-LED and the second improved red micro-LED. The second improved red micro-LED has a six-fold increase in total EQE as compared with the first standard red micro-LED. The improvement is particularly large at low current densities. FIG. 19B shows a simulated plot 1905 of the SRV as a function of the energy gap for various materials. The SRV values shown in FIG. 19B are used for the simulations discussed herein.

Figures 20A, 20B:
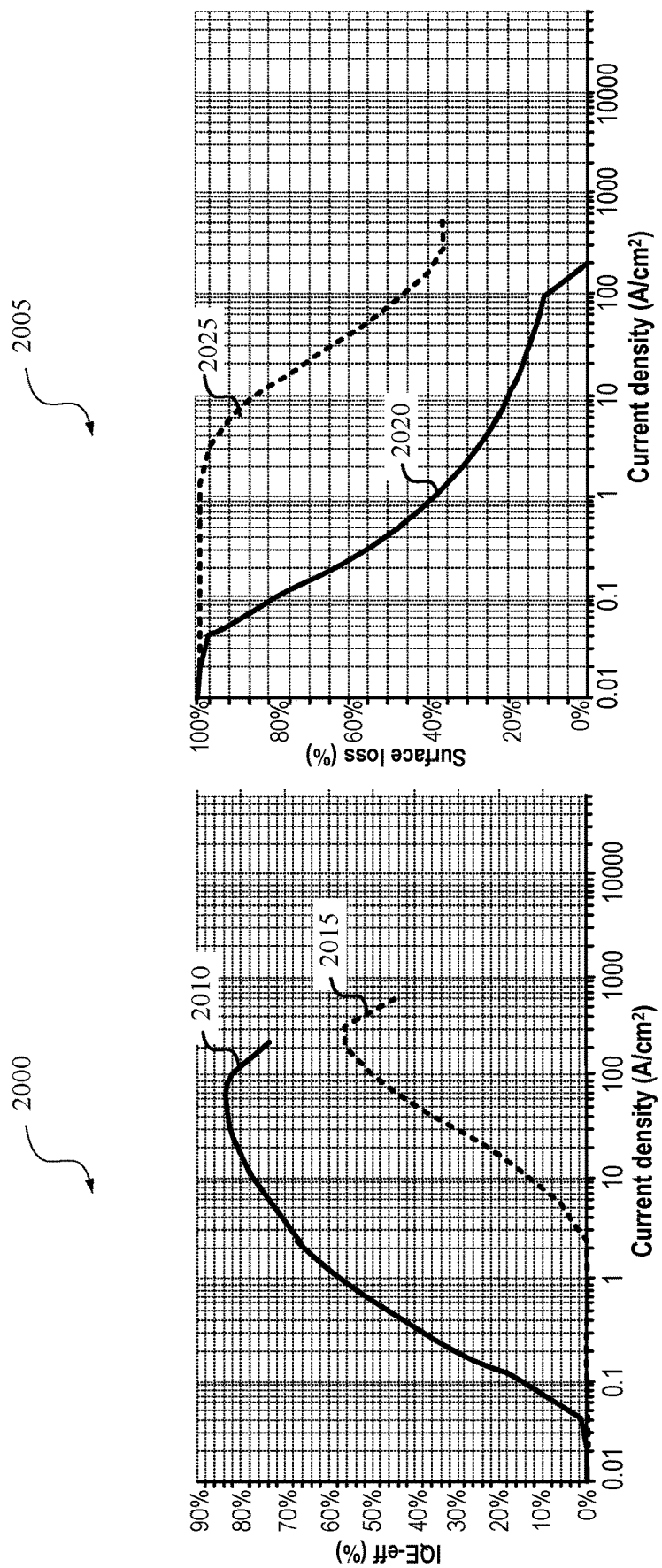
FIGS. 20A and 20B show simulated plots of additional performance parameters for red micro-LEDs having a vertical mesa shape and a maximum lateral dimension of 10 μm.

FIGS. 20A and 20B show simulated plots of additional performance parameters for red micro-LEDs having a vertical mesa shape and a maximum lateral dimension of 10 μm. FIG. 20A shows a simulated plot 2000 of the effective internal quantum efficiency ($IQE_{eff}$) as a function of the current density. Curve 2015 represents the $IQE_{eff}$ of the first improved red micro-LED having a SRV of 3E4 cm/s and an e-h diffusion of 20 cm²/s, and curve 2010 represents the $IQE_{eff}$ of the second improved red micro-LED having an SRV of 2E4 cm/s and an e-h diffusion of 0.07 cm²/s. The $IQE_{eff}$ may be improved to various values, such as 10%, greater than 20%, greater than 40%, or greater than 80%. FIG. 20B shows a simulated plot 2005 of the surface loss as a function of the current density. Curve 2025 represents the surface loss of the first improved red micro-LED having a SRV of 3E4 cm/s and an e-h diffusion of 20 cm$^2$/s, and curve 2020 represents the surface loss of the second improved red micro-LED having an SRV of 2E4 cm/s and an e-h diffusion of 0.07 cm$^2$/s. In some examples, the surface loss may be reduced from 99% to 10%.

Figures 21A, 21B:
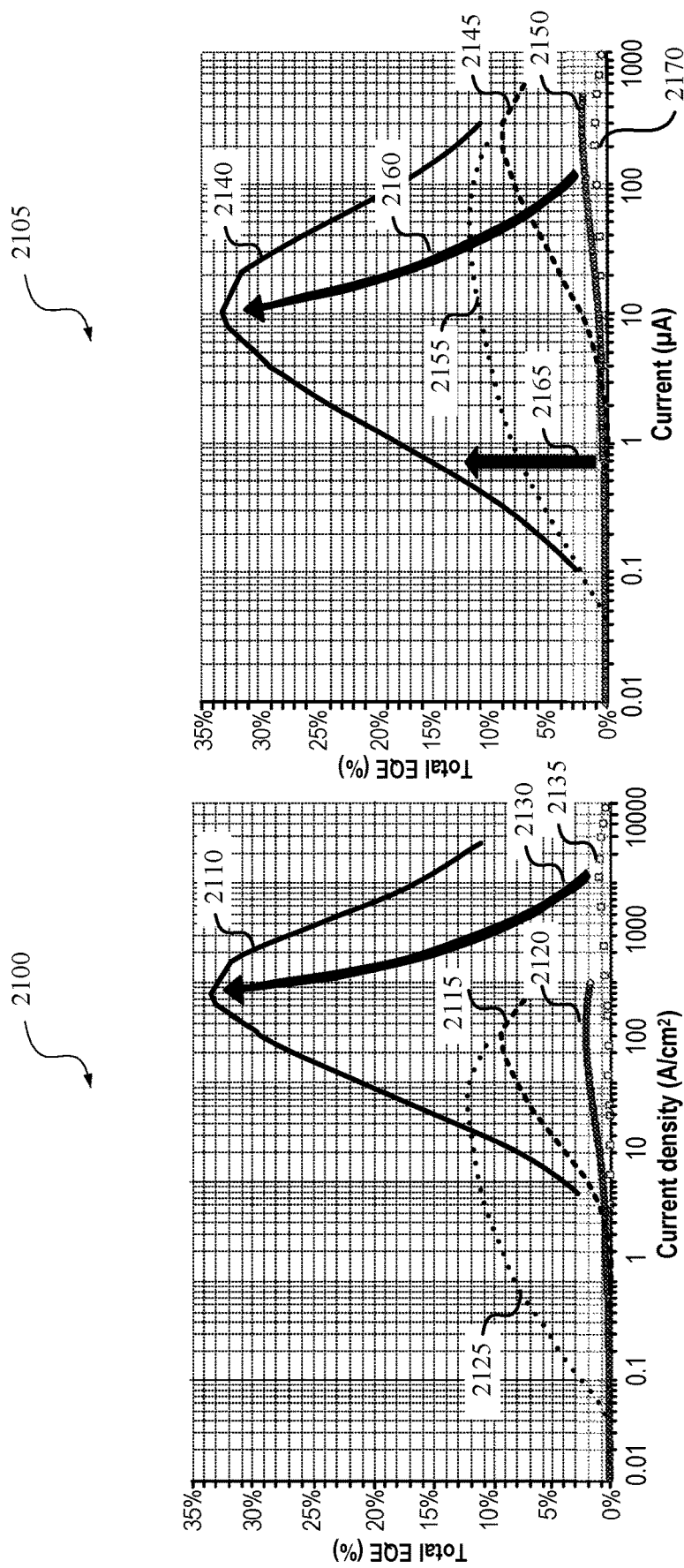
FIGS. 21A and 21B show simulated plots of performance parameters for red micro-LEDs having a vertical mesa shape and a maximum lateral dimension of 10 μm, along with red micro-LEDs having a parabolic mesa shape and a maximum lateral dimension of 3 μm.

FIGS. 21A and 21B show simulated plots of performance parameters for red micro-LEDs having a vertical mesa shape and a maximum lateral dimension of 10 µm, along with red micro-LEDs having a parabolic mesa shape and a maximum lateral dimension of 3 µm. FIG. 21A shows a simulated plot 2100 of the total EQE as a function of the current density. Curve 2120 represents the total EQE of the first standard red micro-LED, curve 2115 represents the total EQE of the first improved red micro-LED having a SRV of 3E4 cm/s and an e-h diffusion of 20 cm$^2$/s, and curve 2125 represents the total EQE of the second improved red micro-LED having an SRV of 2E4 cm/s and an e-h diffusion of 0.07 cm$^2$/s. For comparison, curve 2110 represents the total EQE of a third improved red micro-LED having a parabolic mesa shape, an additional lens, an anti-reflection (AR) coating, and a maximum lateral dimension of 3 µm. The third improved red micro-LED also has an SRV of 2E4 cm/s and an e-h diffusion of 0.07 cm$^2$/s. Curve 2135 represents the total EQE of a second standard red micro-LED having a parabolic mesa shape and a maximum lateral dimension of 3.1 µm. Arrow 2130 indicates the improvement in total EQE between the second standard red micro-LED and the third improved red micro-LED.

FIG. 21B shows a simulated plot 2105 of the total EQE as a function of the current. Curve 2150 represents the total EQE of the first standard red micro-LED, curve 2145 represents the total EQE of the first improved red micro-LED having a SRV of 3E4 cm/s and an e-h diffusion of 20 cm$^2$/s, and curve 2155 represents the total EQE of the second improved red micro-LED having an SRV of 2E4 cm/s and an e-h diffusion of 0.07 cm$^2$/s. For comparison, curve 2140 represents the total EQE of a third improved red micro-LED having a parabolic mesa shape, an additional lens, an anti-reflection (AR) coating, and a maximum lateral dimension of 3 µm. The third improved red micro-LED also has an SRV of 2E4 cm/s and an e-h diffusion of 0.07 cm$^2$/s. Curve 2170 represents the total EQE of the second standard red micro-LED having a parabolic mesa shape and a maximum lateral dimension of 3.1 µm. Arrow 2160 indicates the improvement in total EQE between the second standard red micro-LED and the third improved red micro-LED, and arrow 2165 indicates the improvement in total EQE between the first standard red micro-LED and the third improved red micro-LED. The third improved red micro-LED having the parabolic mesa shape, the additional lens, the AR coating, and the maximum lateral dimension of 3 µm may have a thirty-fold higher total EQE than the standard red micro-LEDs.

Figure 22B:
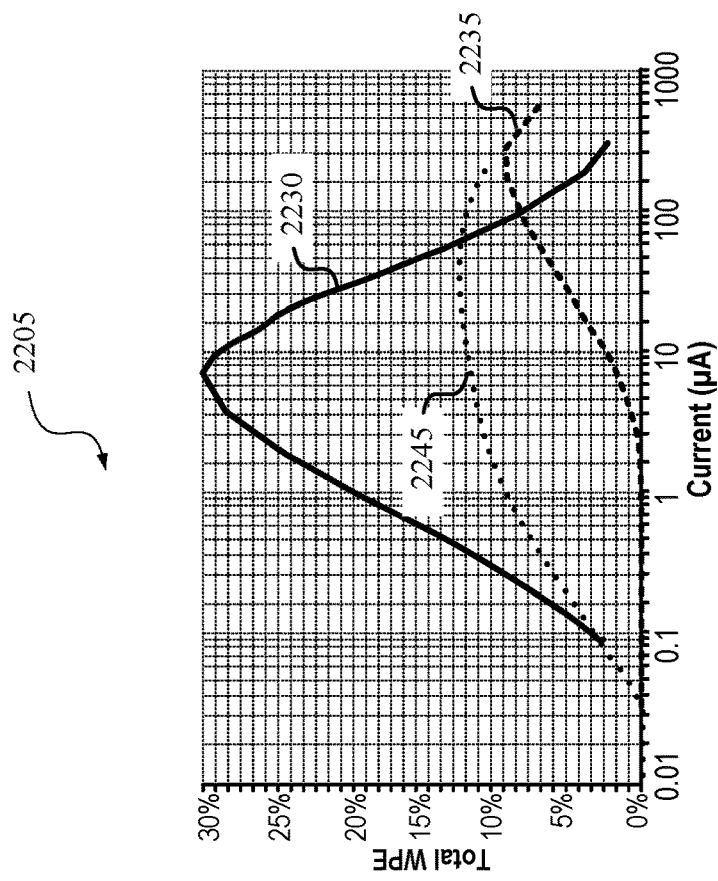
FIGS. 22A and 22B show simulated plots of additional performance parameters for red micro-LEDs having a vertical mesa shape and a maximum lateral dimension of 10 μm, along with red micro-LEDs having a parabolic mesa shape and a maximum lateral dimension of 3 μm.
Figure 22A:
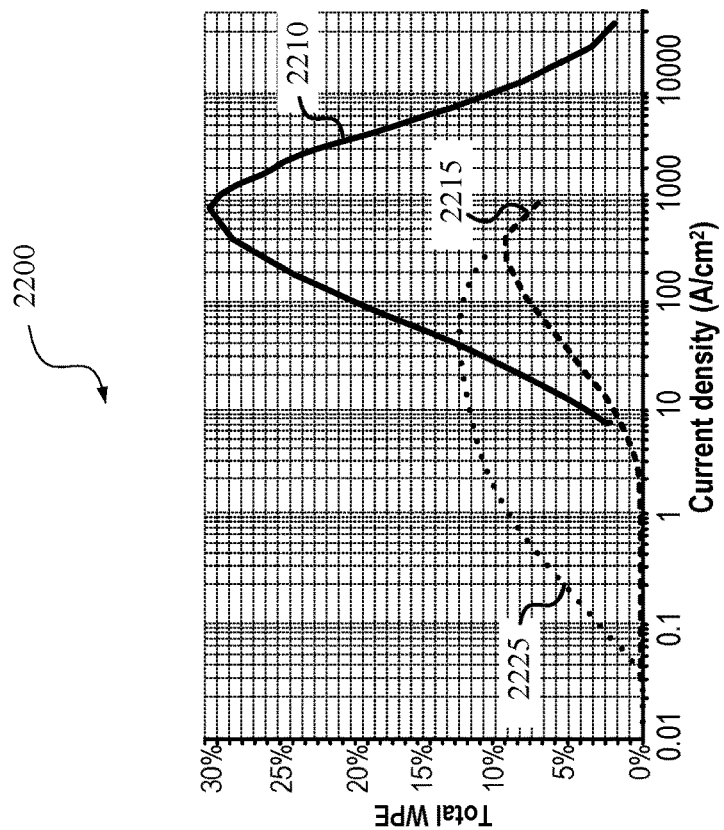

FIGS. 22A and 22B show simulated plots of additional performance parameters for red micro-LEDs having a vertical mesa shape and a maximum lateral dimension of 10 µm, along with red micro-LEDs having a parabolic mesa shape and a maximum lateral dimension of 3 µm. FIG. 22A shows a simulated plot 2200 of the total wall-plug efficiency (WPE) as a function of the current density. Curve 2215 represents the total WPE of the first improved red micro-LED having a SRV of 3E4 cm/s and an e-h diffusion of 20 cm$^2$/s, curve 2225 represents the total WPE of the second improved red micro-LED having an SRV of 2E4 cm/s and an e-h diffusion of 0.07 cm$^2$/s, and curve 2210 represents the total WPE of the third improved red micro-LED having a parabolic mesa shape, an additional lens, an AR coating, and a maximum lateral dimension of 3 µm.

FIG. 22B shows a simulated plot 2205 of the total WPE as a function of the current. Curve 2235 represents the total WPE of the first improved red micro-LED having a SRV of 3E4 cm/s and an e-h diffusion of 20 cm$^2$/s, curve 2245 represents the total WPE of the second improved red micro-LED having an SRV of 2E4 cm/s and an e-h diffusion of 0.07 cm$^2$/s, and curve 2230 represents the total WPE of the third improved red micro-LED having a parabolic mesa shape, an additional lens, an anti-reflection (AR) coating, and a maximum lateral dimension of 3 µm. The third improved red micro-LED also has an SRV of 2E4 cm/s and an e-h diffusion of 0.07 cm$^2$/s. The third improved red micro-LED having the parabolic mesa shape, the additional lens, the AR coating, and the maximum lateral dimension of 3 µm may have a total WPE of approximately 30% at a current of 10 µA.

Figure 23:
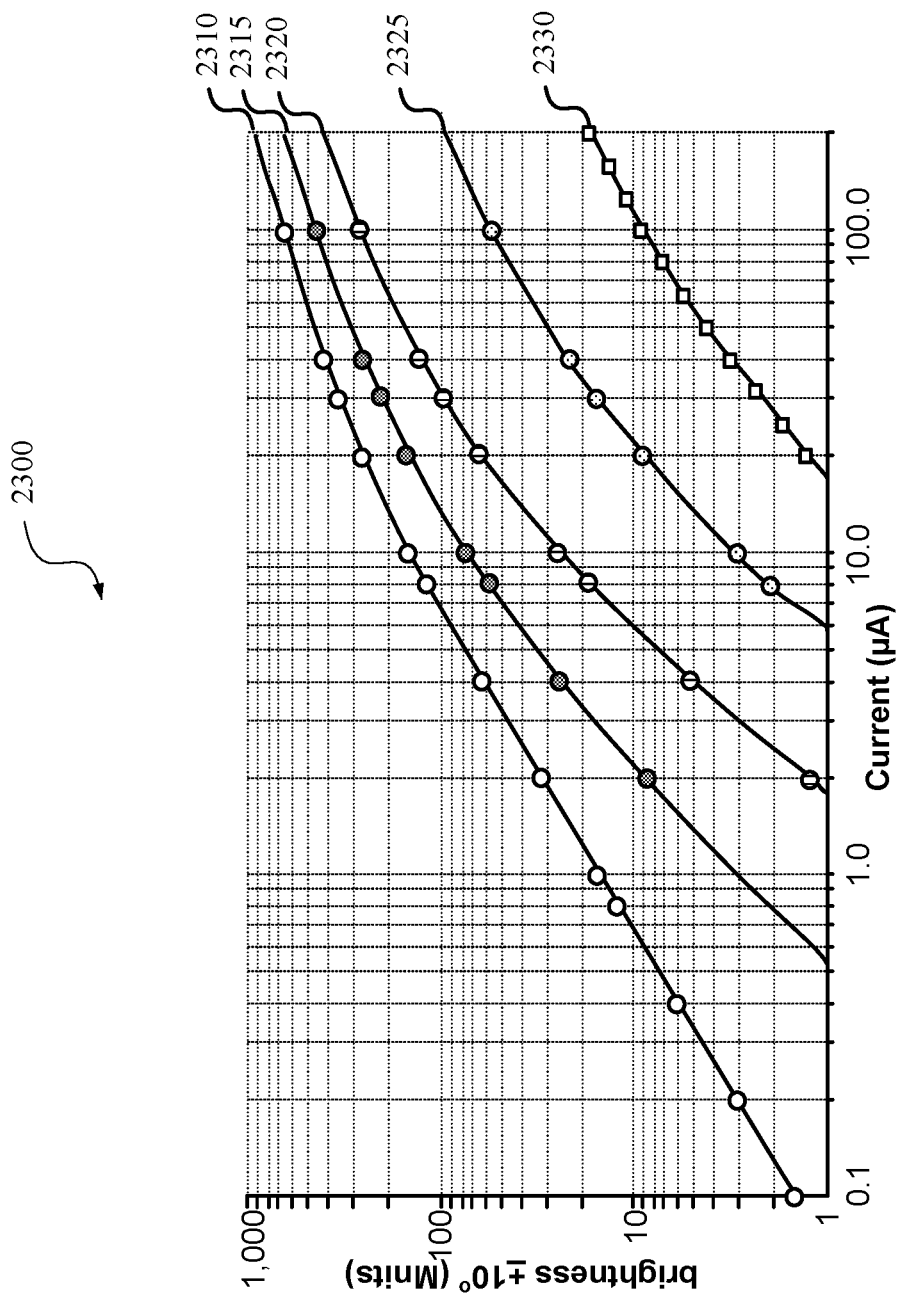
FIG. 23 shows a simulated plot of brightness for red micro-LEDs having a parabolic mesa shape, an additional lens, an AR coating, and a maximum lateral dimension between 1 μm and 3 μm.

FIG. 23 shows a simulated plot 2300 of brightness for red micro-LEDs having a parabolic mesa shape, an additional lens, an AR coating, and a maximum lateral dimension between 1 µm and 3 µm. The brightness is measured within an angle of ±10° with respect to an emission axis of the LEDs. Curve 2330 represents the brightness of a standard red micro-LED, curve 2325 represents the brightness of a first optimized micro-LED having a maximum lateral dimension of 3 µm, an SRV of 1E5 cm/s, and an e-h diffusion of 20 cm$^2$/s, curve 2320 represents the brightness of a second optimized micro-LED having a maximum lateral dimension of 3 µm, an SRV of 3E4 cm/s, and an e-h diffusion of 20 cm$^2$/s, curve 2315 represents the brightness of a third optimized micro-LED having a maximum lateral dimension of 3 µm, an SRV of 3E4 cm/s, and an e-h diffusion of 1 cm$^2$/s, and curve 2310 represents the brightness of a fourth optimized micro-LED having a maximum lateral dimension of 3 µm, an SRV of 1E4 cm/s, and an e-h diffusion of 0.1 cm$^2$/s. For example, a brightness between 10 and 20 Mnits may be achieved at a current of 1 µA, and a brightness of 150 Mnits may be achieved at a current of 10 µA.

FIGS. 24A-27 illustrate examples of the improved performance of green micro-LEDs having a reduced SRV of 900 cm/s and a reduced lateral e-h diffusion of 2 cm$^2$/s. As discussed in further detail below, these green micro-LEDs take a higher density of states between 40 meV and 60 meV into account, based on In-fluctuations in the InGaN quantum well, to achieve a higher efficiency.

Figure 24A:
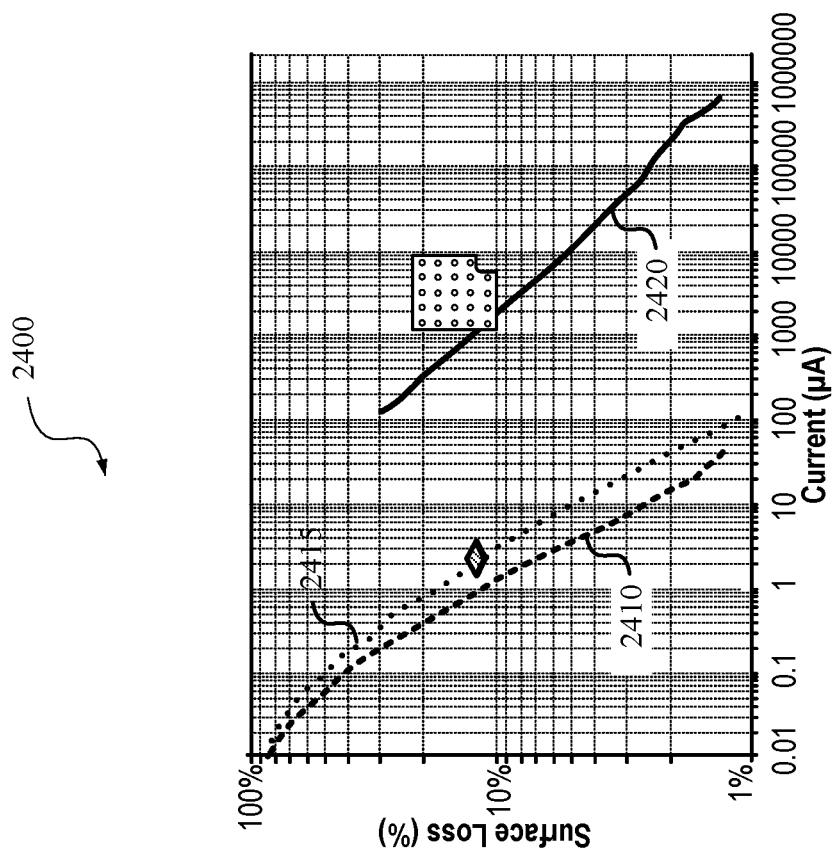
FIGS. 24A and 24B show simulated plots of performance parameters for green micro-LEDs having a vertical mesa shape and five quantum wells.
Figure 24B:
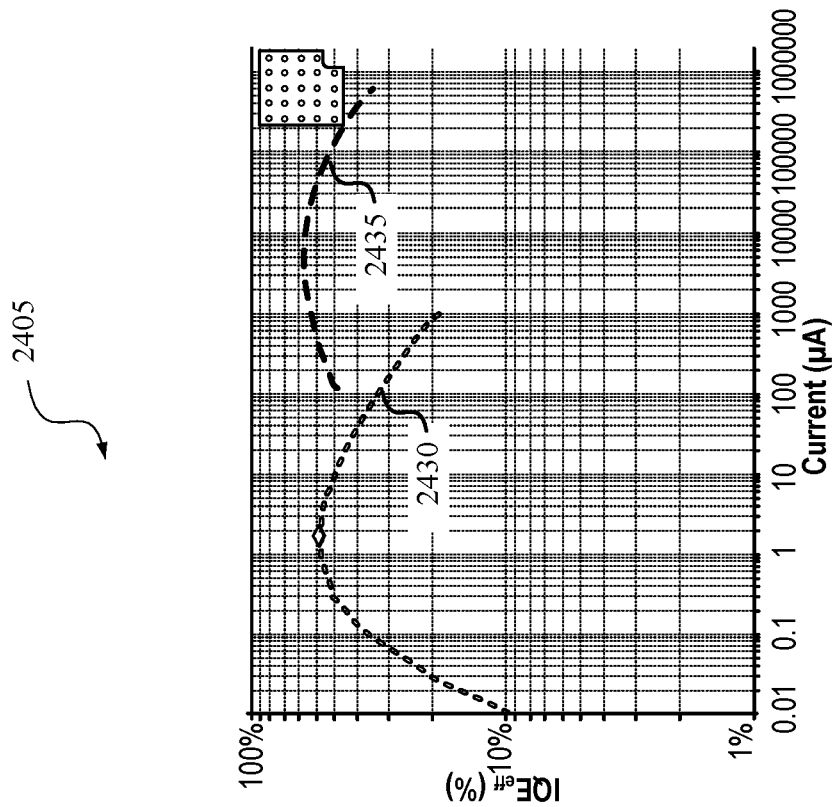

FIGS. 24A and 24B show simulated plots of performance parameters for green micro-LEDs having a vertical mesa shape and five quantum wells. FIG. 24A shows a simulated plot 2400 of the surface loss as a function of the current. Curve 2410 represents the surface loss of a first improved green micro-LED having dimensions of 1 µm×1 µm and an SRV of 900 cm/s, and curve 2415 represents the surface loss of a second improved green micro-LED having dimensions of 10 µm×10 µm and an SRV of 900 cm/s. Curve 2420 represents the surface loss of a first improved array of green micro-LEDs having dimensions of 1000 µm×1000 µm. FIG. 24B shows a simulated plot 2430 of the $IQE_{eff}$ as a function of the current. Curve 2430 represents the $IQE_{eff}$ of a third improved green micro-LED having dimensions of 8.5 µm×8.5 µm and an SRV of 900 cm/s. Curve 2435 represents the $IQE_{eff}$ of the first improved array of green micro-LEDs having dimensions of 1000 µm×1000 µm. As shown in FIGS. 24A and 24B, the surface loss may be reduced to approximately 10% at a current of 1 µA, and the $IQE_{eff}$ may be increased to a value between 50% and 60%.

Figure 25:
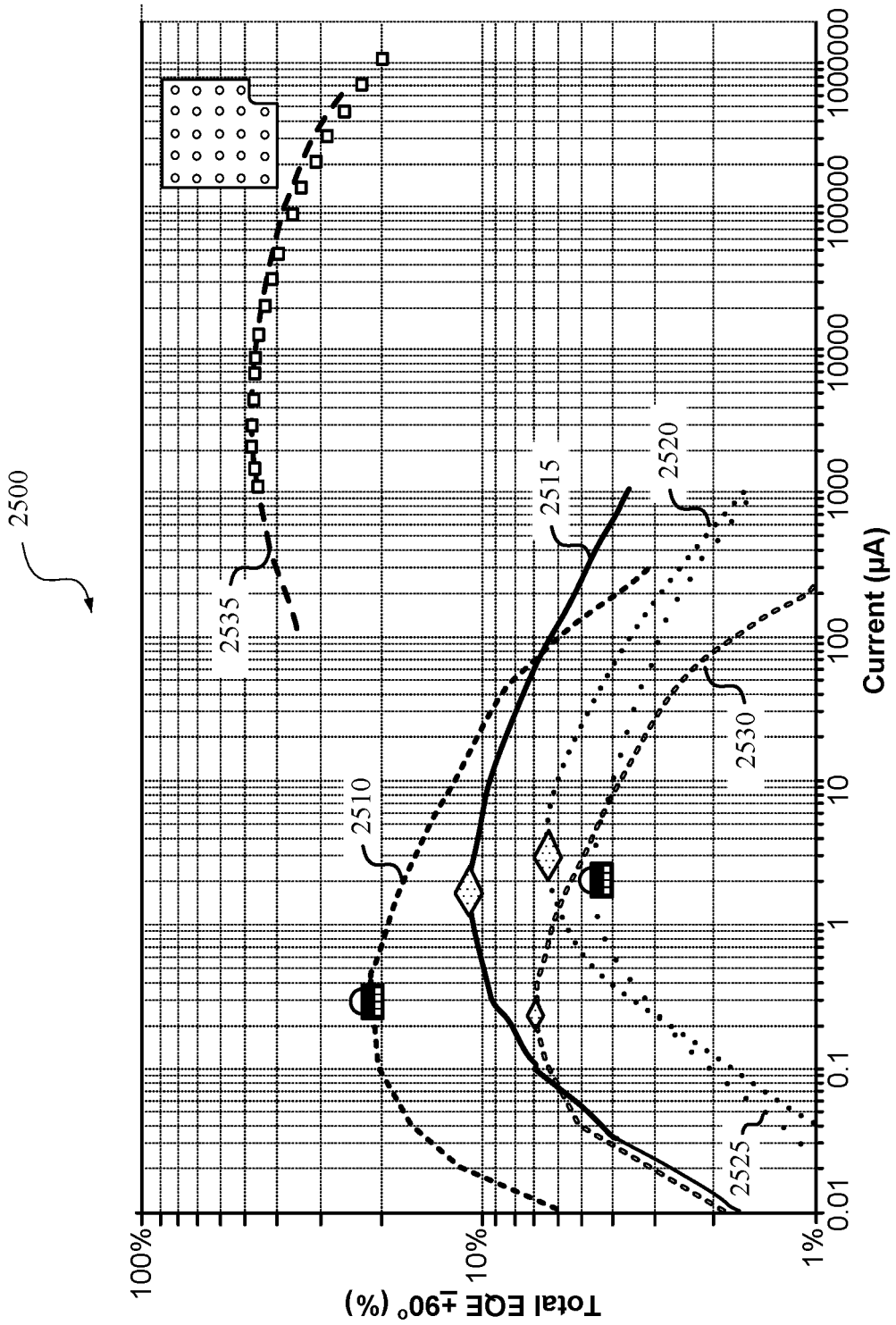
FIG. 25 shows a simulated plot of the total EQE for green micro-LEDs as a function of the current.

FIG. 25 shows a simulated plot 2500 of the total EQE for green micro-LEDs as a function of the current. The total EQE is measured within an angle of ±90° with respect to an emission axis of the LEDs. Curve 2520 represents the total EQE of a first standard green micro-LED having a vertical mesa shape and a maximum lateral dimension of 10 µm, and curve 2525 represents the total EQE of a second standard green micro-LED having a semi-parabolic mesa shape and a maximum lateral dimension of 3.9 µm. Curve 2530 represents the total EQE of the first improved green micro-LED having dimensions of 1 µm×1 µm and a vertical mesa shape, curve 2515 represents the total EQE of the third improved green micro-LED having dimensions of 8.5 µm×8.5 µm and a vertical mesa shape, and curve 2510 represents the total EQE of a fourth improved green micro-LED having a maximum lateral dimension of 3 µm, a parabolic mesa shape, an additional lens, and an AR coating. Curve 2535 represents the total EQE of the first improved array of green micro-LEDs having dimensions of 1000 µm×1000 µm. As shown in FIG. 25, the fourth improved green micro-LED may have a total EQE of approximately 20% at a current between 0.1 and 1.0 µA.

Figure 26:
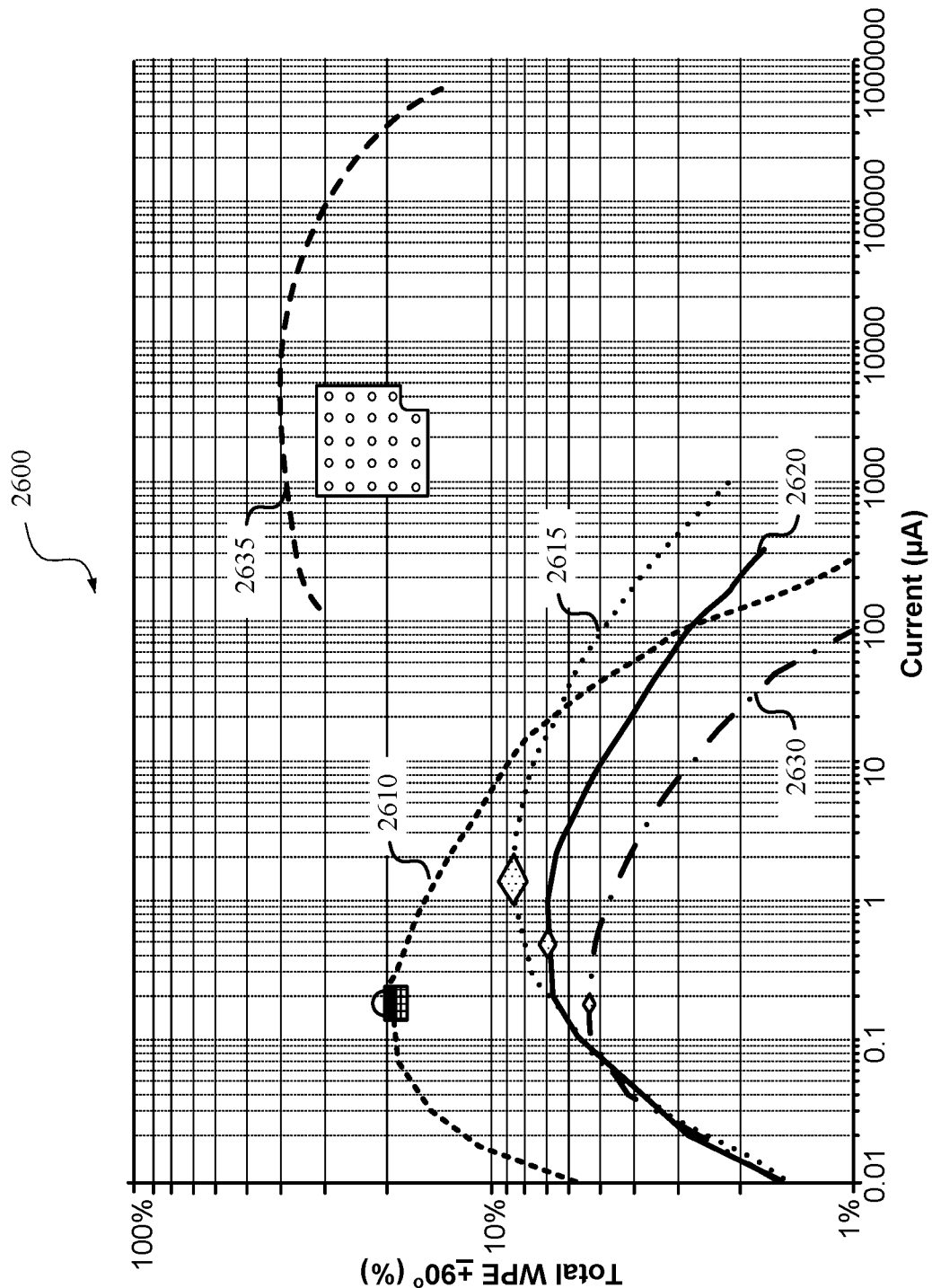
FIG. 26 shows a simulated plot of the total WPE for green micro-LEDs as a function of the current.

FIG. 26 shows a simulated plot 2600 of the total WPE for green micro-LEDs as a function of the current. The total WPE is measured within an angle of ±90° with respect to an emission axis of the LEDs. Curve 2630 represents the total WPE of the first improved green micro-LED having dimensions of 1 µm×1 µm and a vertical mesa shape, curve 2615 represents the total EQE of the third improved green micro-LED having dimensions of 8.5 µm×8.5 µm and a vertical mesa shape, curve 2610 represents the total WPE of the fourth improved green micro-LED having a maximum lateral dimension of 3 µm, a parabolic mesa shape, an additional lens, and an AR coating, and curve 2620 represents the total WPE of a fifth improved green micro-LED having dimensions of 3 µm×3 µm and a vertical mesa shape. Curve 2635 represents the total WPE of the first improved array of green micro-LEDs having dimensions of 1000 µm×1000 µm. As shown in FIG. 26, the fourth improved green micro-LED may have a total WPE of approximately 18% at a current between 100 nA and 300 nA.

Figure 27:
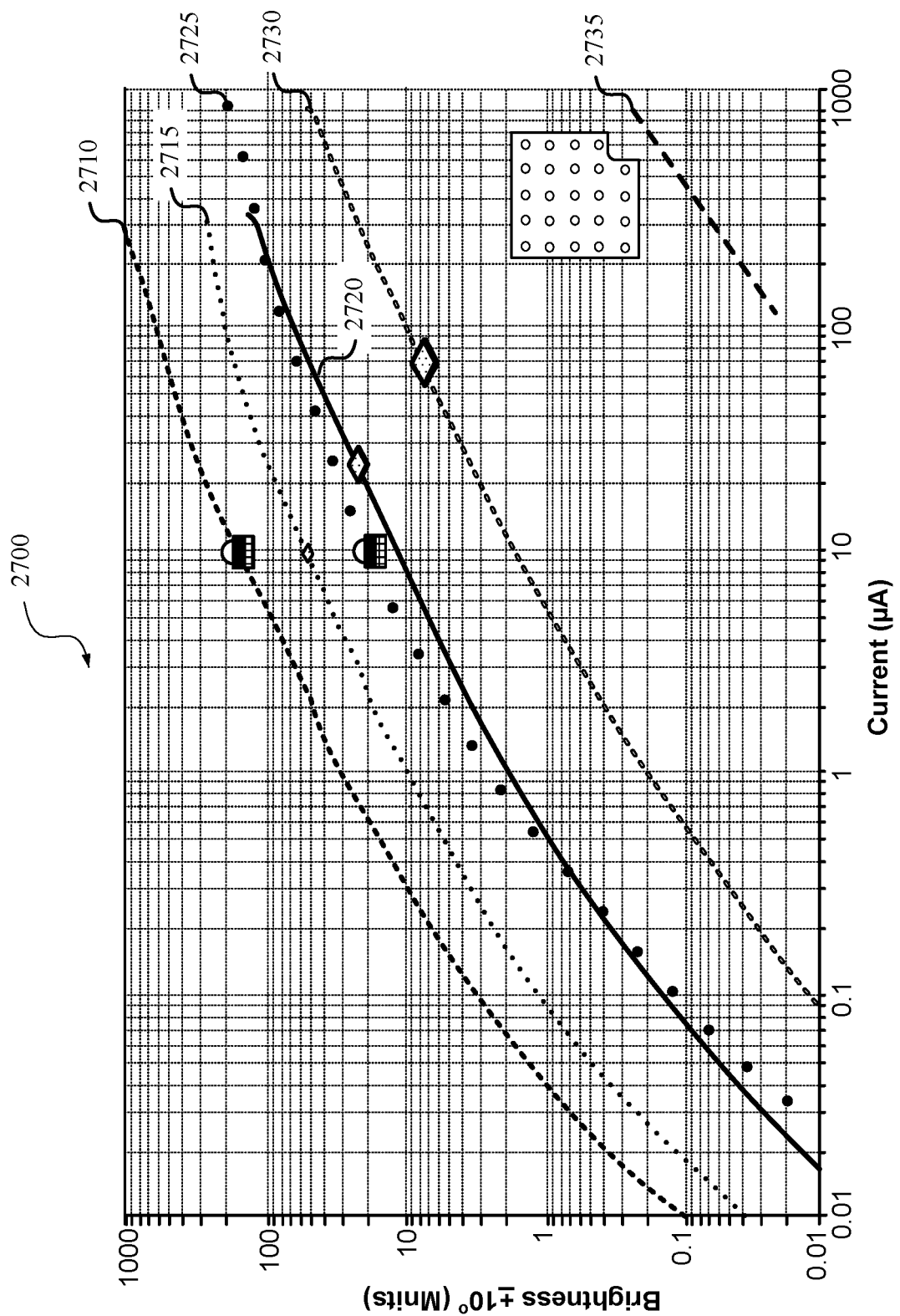
FIG. 27 shows a simulated plot of the brightness for green micro-LEDs as a function of the current.

FIG. 27 shows a simulated plot 2700 of the brightness for green micro-LEDs as a function of the current. The brightness is measured within an angle of ±10° with respect to an emission axis of the LEDs. Curve 2725 represents the brightness of the second standard green micro-LED having a semi-parabolic mesa shape and a maximum lateral dimension of 3.9 µm. Curve 2715 represents the brightness of the first improved green micro-LED having dimensions of 1 µm×1 µm and a vertical mesa shape, curve 2730 represents the brightness of the third improved green micro-LED having dimensions of 8.5 µm×8.5 µm and a vertical mesa shape, and curve 2710 represents the brightness of the fourth improved green micro-LED having a maximum lateral dimension of 3 µm, a parabolic mesa shape, an additional lens, and an AR coating. Curve 2735 represents the brightness of the first improved array of green micro-LEDs having dimensions of 1000 µm×1000 µm. As shown in FIG. 27, the fourth improved green micro-LED may have a brightness of approximately 30 Mnits at a current of 1 µA and a brightness of approximately 150 Mnits at a current of 10 µA.

FIGS. 28A-30 illustrate examples of the improved performance of blue micro-LEDs having a reduced SRV of 900 cm/s and a reduced lateral e-h diffusion of 2 cm$^2$/s. These micro-LEDs have a density of states between 20 meV and 35 meV.

Figures 28A, 28B:
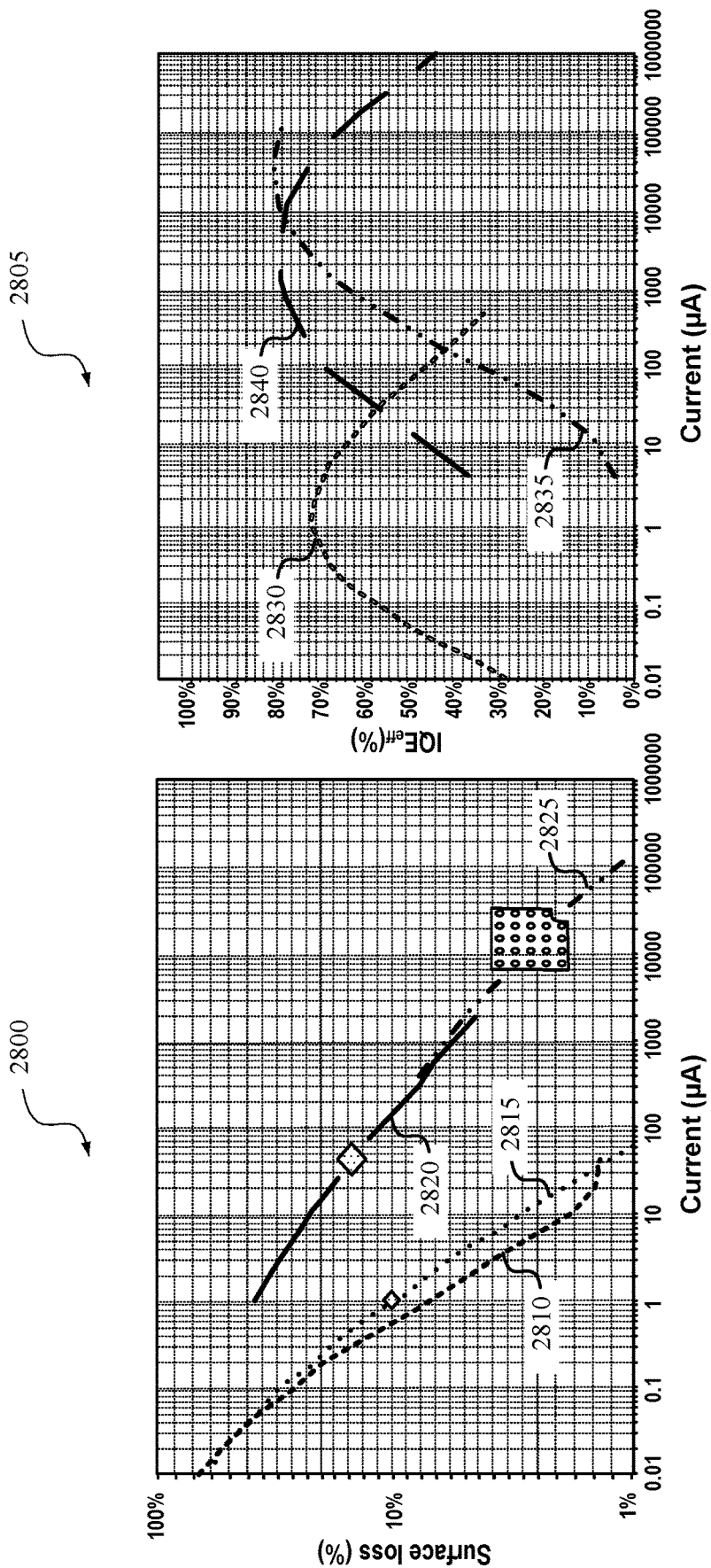
FIGS. 28A and 28B show simulated plots of performance parameters for blue micro-LEDs having a vertical mesa shape.

FIGS. 28A and 28B show simulated plots of performance parameters for blue micro-LEDs having a vertical mesa shape. FIG. 28A shows a simulated plot 2800 of the surface loss as a function of the current. Curve 2810 represents the surface loss of a first improved blue micro-LED having a single quantum well, a vertical mesa shape, dimensions of 1 µm×1 µm, and an SRV of 900 cm/s, curve 2815 represents the surface loss of a second improved blue micro-LED having a single quantum well, a vertical mesa shape, dimensions of 8.5 µm×8.5 µm, and an SRV of 900 cm/s, and curve 2820 represents the surface loss of a third improved blue micro-LED having a single quantum well, a vertical mesa shape, dimensions of 90 µm×90 µm, and an SRV of 900 cm/s. Curve 2825 represents the surface loss of a first improved array of blue micro-LEDs having a single quantum well, a vertical mesa shape, and dimensions of 1000 µm×1000 µm. FIG. 28B shows a simulated plot 2805 of the $IQE_{eff}$ as a function of the current. Curve 2830 represents the $IQE_{eff}$ of a fourth improved blue micro-LED having a single quantum well, a vertical mesa shape, dimensions of 8.5 µm×8.5 µm, and an SRV of 900 cm/s. Curve 2840 represents the $IQE_{eff}$ of the first improved array of blue micro-LEDs having a single quantum well, a vertical mesa shape, and dimensions of 1000 µm×1000 µm. Curve 2835 represents the $IQE_{eff}$ of a second improved array of blue micro-LEDs having seven quantum wells, a vertical mesa shape, and dimensions of 1000 µm×1000 µm. As shown in FIGS. 28A and 28B, the surface loss may be reduced to approximately 7% at a current of 1 µA, and the $IQE_{eff}$ may be increased to approximately 70% at a current of 1 µA.

Figure 29B:
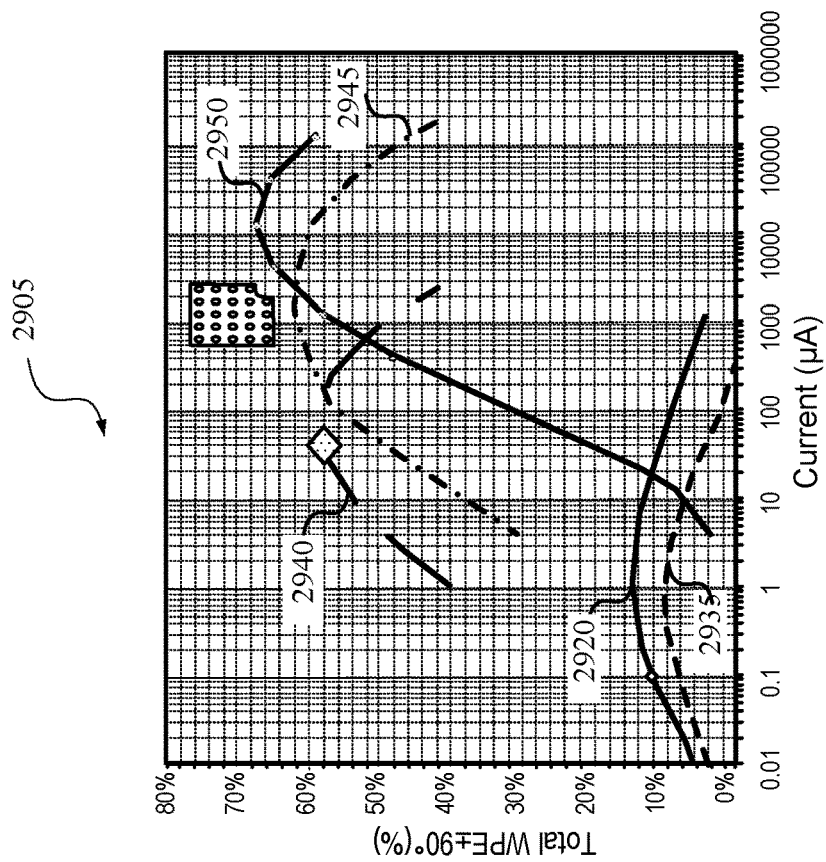
FIGS. 29A and 29B show simulated plots of additional performance parameters for blue micro-LEDs having a vertical mesa shape.
Figure 29A:
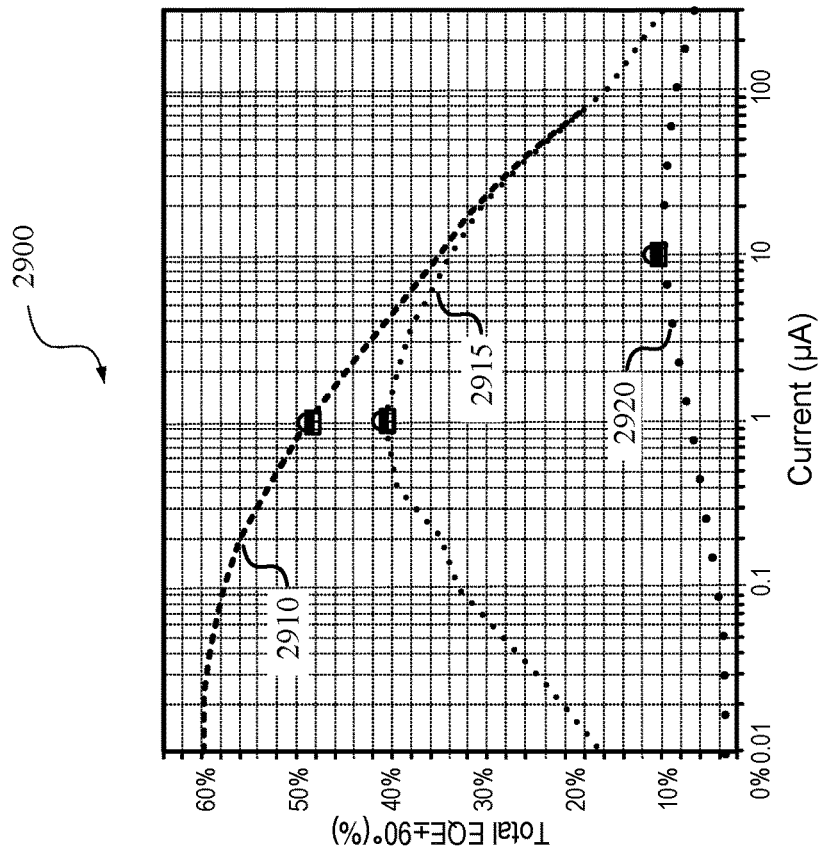

FIGS. 29A and 29B show simulated plots of additional performance parameters for blue micro-LEDs having a vertical mesa shape. FIG. 29A shows a simulated plot 2900 of the total EQE as a function of the current. The total EQE is measured within an angle of ±90° with respect to an emission axis of the LEDs. Curve 2920 represents the total EQE of a standard blue micro-LED having a parabolic mesa shape and a maximum lateral dimension of 3.9 µm. Curve 2910 represents the total EQE of a fifth improved blue micro-LED having a single quantum well, a parabolic mesa shape, a maximum lateral dimension of 3.0 µm, and no SRV of 900 cm/s, and curve 2915 represents the total EQE of a sixth improved blue micro-LED having a single quantum well, a parabolic mesa shape, a maximum lateral dimension of 3.0 µm, and an SRV of 900 cm/s. FIG. 29B shows a simulated plot 2905 of the total WPE as a function of the current. The total WPE is measured within an angle of ±90° with respect to an emission axis of the LEDs. Curve 2920 represents the total WPE of the fourth improved blue micro-LED having a single quantum well, a vertical mesa shape, dimensions of 8.5 µm×8.5 µm, and an SRV of 900 cm/s, curve 2935 represents the total WPE of a seventh improved blue micro-LED having seven quantum wells and dimensions of 8.5 µm×8.5 µm, and curve 2940 represents the total WPE of an eighth improved blue micro-LED having a single quantum well, a vertical mesa shape, dimensions of 90 µm×90 µm, and an SRV of 3E4 cm/s. Curve 2950 represents the total WPE of the second improved array of blue micro-LEDs having seven quantum wells, a vertical mesa shape, and dimensions of 1000 µm×1000 µm, and curve 2945 represents the total WPE of a third improved array of blue micro-LEDs having a single quantum well, a vertical mesa shape, and dimensions of 1000 µm×1000 µm, and an SRV of 3E4 cm/s. As shown in FIGS. 29A and 29B, the total EQE of the sixth improved blue micro-LED may be approximately 30% at a current of 100 nA, and the total WPE of the fourth improved blue micro-LED may be approximately 12% at a current of 100 nA.

Figure 30:
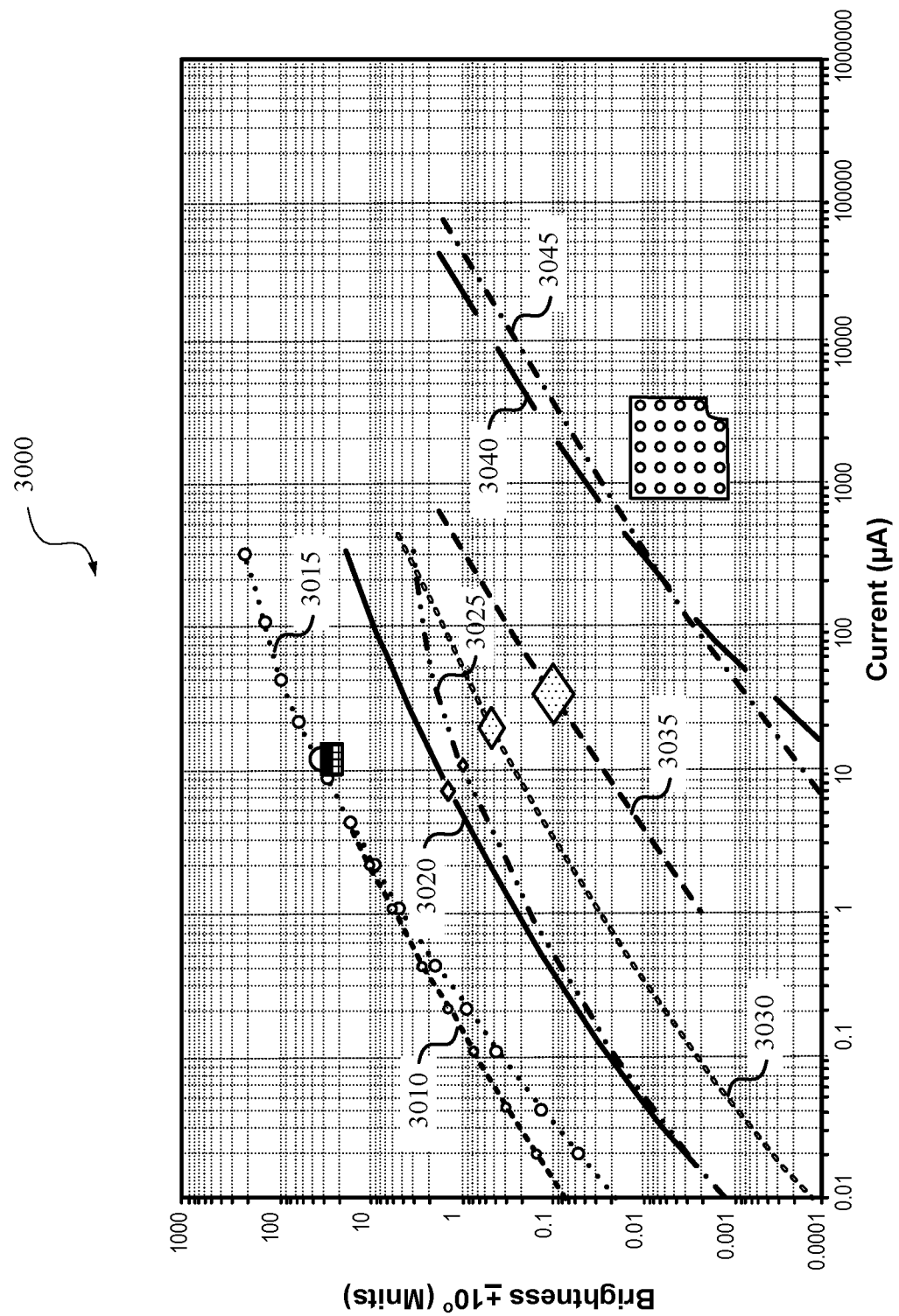
FIG. 30 shows a simulated plot of the brightness for blue micro-LEDs as a function of the current.

FIG. 30 shows a simulated plot 3000 of the brightness for blue micro-LEDs as a function of the current. The brightness is measured within an angle of ±10° with respect to an emission axis of the LEDs. Curve 3010 represents the brightness of the fifth improved blue micro-LED having a single quantum well, a parabolic mesa shape, an additional lens, an AR coating, a maximum lateral dimension of 3.0 μm, and no SRV, curve 3015 represents the brightness of the sixth improved blue micro-LED having a single quantum well, a parabolic mesa shape, an additional lens, an AR coating, a maximum lateral dimension of 3.0 μm, and an SRV of 900 cm/s, curve 3020 represents the brightness of a ninth improved blue micro-LED having a single quantum well, a vertical mesa shape, dimensions of 3 μm×3 μm, and an SRV of 900 cm/s, curve 3025 represents the brightness of the first improved blue micro-LED having a single quantum well, a vertical mesa shape, dimensions of 1 μm×1 μm, and an SRV of 900 cm/s, curve 3030 represents the brightness of the fourth improved blue micro-LED having a single quantum well, a vertical mesa shape, dimensions of 8.5 μm×8.5 μm, and an SRV of 900 cm/s, and curve 3035 represents the brightness of the third improved blue micro-LED having a single quantum well, a vertical mesa shape, dimensions of 90 μm×90 μm, and an SRV of 900 cm/s. Curve 3045 represents the brightness of the first improved array of blue micro-LEDs having a single quantum well, a vertical mesa shape, and dimensions of 1000 μm×1000 μm, and curve 3040 represents the brightness of the second improved array of blue micro-LEDs having seven quantum wells, a vertical mesa shape, and dimensions of 1000 μm×1000 μm. As shown in FIG. 30, the fifth improved blue micro-LED and the sixth improved blue micro-LED may have a brightness of approximately 4 Mnits at a current of 1 μA and a brightness of approximately 30 Mnits at a current of 10 μA.

Figures 31A, 31B, 31C:
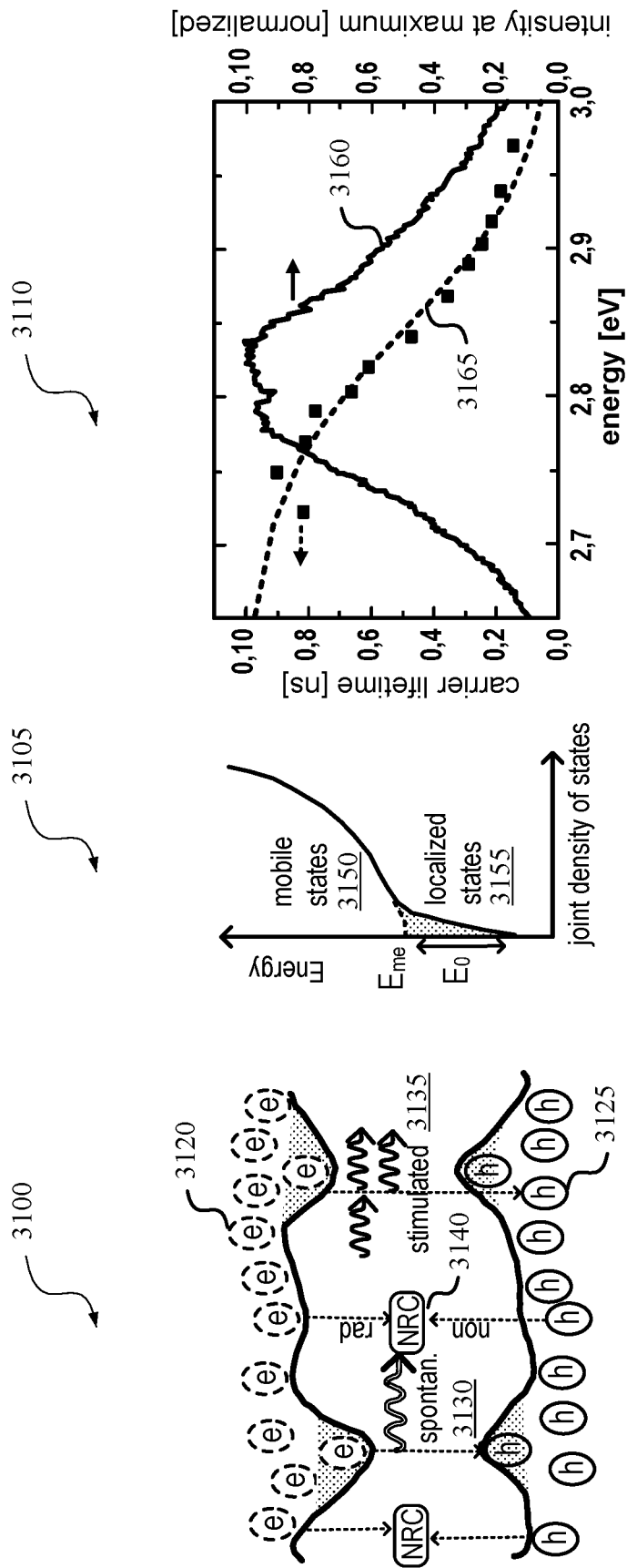
FIGS. 31A-31C illustrate an example of the use of alloy and strain fluctuations to confine lateral carriers according to certain embodiments.

FIGS. 31A-31C illustrate an example of the use of alloy and strain fluctuations to confine lateral carriers according to certain embodiments. Alloy and strain fluctuations, such as In/Ga in the active region of InGaN quantum wells, may create a local e-h potential barrier that blocks lateral carrier diffusion to the mesa facet, especially at lower current densities. For example, blue and green InGaN-based micro-LEDs can reduce lateral carrier diffusion due to InGaN-alloy fluctuations, and red AlInGaP-based micro-LEDs can reduce lateral carrier diffusion due to AlInGaP-alloy fluctuations. Blue micro-LEDs may have a density of states that is greater than 20 meV, green micro-LEDs may have a density of states that is greater than 40 meV, and green micro-LEDs may have a density of states that is greater than 60 meV.

FIGS. 31A and 31C show an example of a model of localized states based on potential fluctuations due to inhomogeneities in In-rich InGaN quantum wells. FIG. 31A shows a bandgap diagram 3100 including electrons 3120 and holes 3125 that may produce spontaneous emission 3130, stimulated emission 3135, and/or non-radiative recombination 3140. FIG. 31B shows a plot 3105 of the energy as a function of the joint density of states. Mobile states 3150 have an energy above the mobility edge $E_{me}$, while localized states 3155 have an energy below the mobility edge $E_{me}$. Carriers below the mobility edge $E_{me}$ are trapped within the localized states 3155. FIG. 31C shows an experimental plot 3110 of the carrier lifetime 3165 as a function of the energy, along with the normalized intensity at maximum 3160 as a function of the energy. A curve fit of the carrier lifetime 3165 may be performed to determine the localization depth of the carriers. In the example shown in FIG. 31C, the curve fit results in a radiative lifetime of 999 ps, a mobility edge $E_{me}$ of 2.84 eV, and an average depth $E_0$ of 57 meV.

Figure 32:
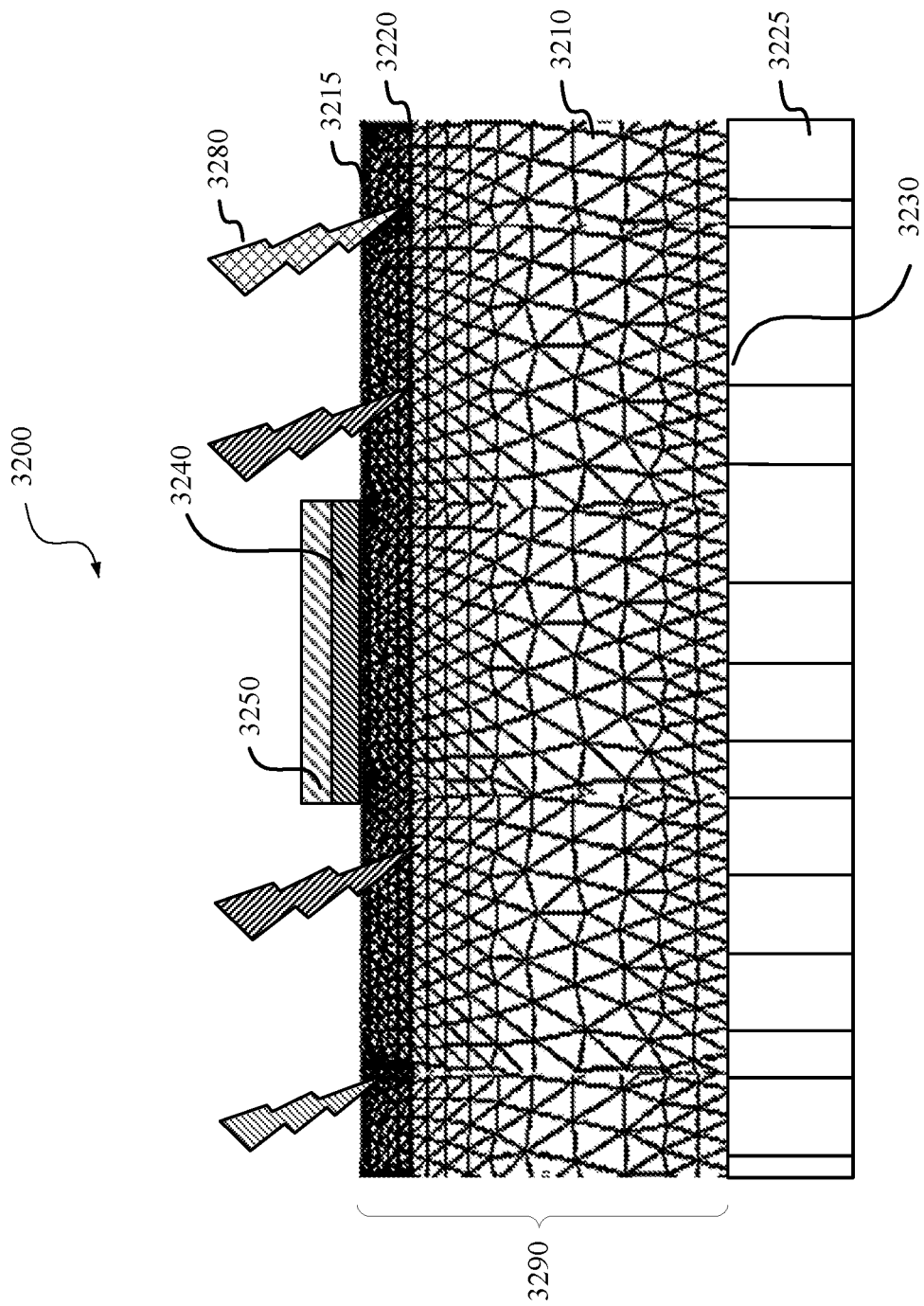
FIG. 32 illustrates an example of ion implantation that may be performed according to certain embodiments.
Figure 33:
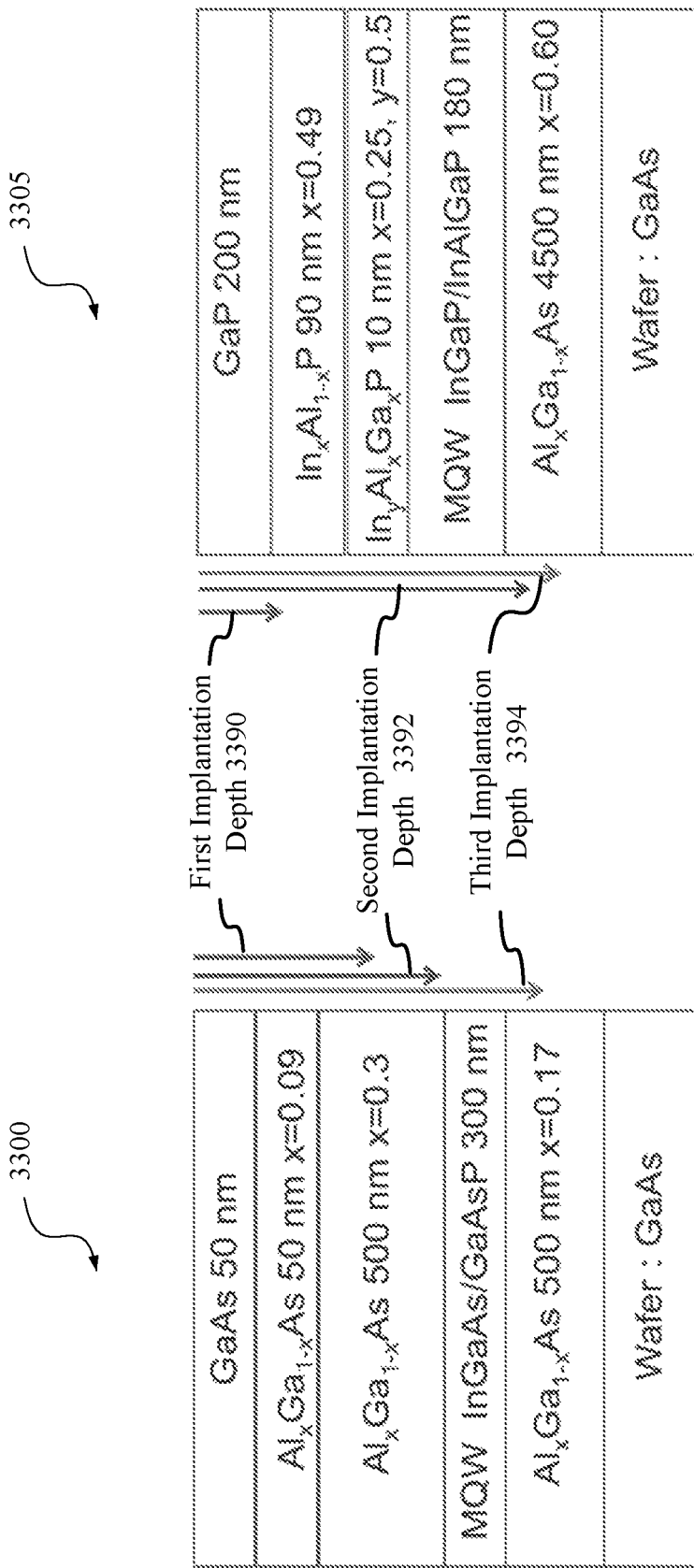
FIGS. 33A, 33B, and 34 show various ion implantation depths for micro-LEDs according to certain embodiments.

FIG. 32 illustrates an example of ion implantation that may be performed according to certain embodiments. The method illustrated in FIG. 32 may reduce lateral carrier mobility and surface recombination by using ion implantation to disrupt the semiconductor lattice outside of a central portion of the micro-LED. The ion implantation reduces the number of electrons that reach the outer surface of the micro-LED, and therefore reduces the amount of surface recombination. Bombarding the semiconductor material with high-energy ions has two effects. First, the lattice of the semiconductor material becomes less electrically conductive, so the current does not spread through the entire structure in all directions, and instead is funneled vertically through the central region. Second, the diffusivity is reduced in the bombarded region, such that the electrons do not move as far laterally. Both the diffusivity D and the electron diffusion length L are reduced by the ion implantation.

FIG. 32 shows a micro-LED 3200 that undergoes ion implantation 3280 before a mesa structure is formed from the semiconductor layer stack. As shown in FIG. 32, the micro-LED 3200 includes an n-side semiconductor layer 3210, a p-side semiconductor layer 3215, and an active light emitting layer 3220. Together the n-side semiconductor layer 3210, the p-side semiconductor layer 3215, and the active light emitting layer 3220 form a semiconductor layer stack 3290. The semiconductor layer stack 3290 may include any suitable material, such as a group III nitride, a group III phosphide, or a group III arsenide. The n-side semiconductor layer 3210 may be formed on a substrate 3225, and may have a light outcoupling surface 3230. The diameter of the light outcoupling surface 3230 may be less than 10 μm. A p-contact 3240 may be formed on a top surface of the p-side semiconductor layer 3215, and a resist 3250 may be formed on a top surface of the p-contact 3240. The p-contact 3240 may be made of a metal, such as titanium or gold.

The p-contact 3240 and the resist 3250 may be used as a mask to define an outer region of the semiconductor layer stack 3290 where the ions are implanted. The outer region will include the portions of the semiconductor layer stack 3290 that are not shaded by the mask during ion implantation. If the ions are incident at an angle of 0° with respect to an axis that is normal to a plane of the mask (i.e. the plane of the mask is along the horizontal direction in FIG. 32), the outer region will include the portions of the semiconductor layer stack 3290 that are not directly beneath the mask. On the other hand, if the ions are incident at an angle that is greater than 0° with respect to the axis that is normal to a plane of the mask, the outer region will include the portions of the semiconductor layer stack 3290 that are not shaded by the mask, thereby forming an outer region having interior edges that are sloped at the angle of implantation. For example, the ions may be implanted at an angle between 0° and 7° with respect to the axis that is normal to the plane of the mask.

As shown in FIG. 32, ion implantation 3280 may be performed before the semiconductor layer stack 3290 is formed into a mesa shape. The mesa shape may be planar, vertical, conical, semi-parabolic, and/or parabolic. Alternatively, ion implantation may be performed after the semiconductor layer stack 3290 is formed into the mesa shape. In this example, the energy of the ions would be reduced.

Various ions may be used, such as H or He ions. The implantation pattern may be controlled by adjusting the implantation angle, the ion energy, the types of ions, and/or the masking of the implantation region. For example, the depth to which the ions are implanted may be varied by changing the energy of the ions. H and He ions may be implanted with an energy between 20 keV and 140 keV. For example, for red micro-LEDs, a 20 keV implantation energy may result in an implantation depth of 200 nm, an 80 keV implantation energy may result in an implantation depth of 600 nm, and a 140 keV implantation energy may result in an implantation depth of 1000 nm. The implantation energy for thinner p-side micro-LEDs, such as blue and green GaN-based micro-LEDs, may range from 5 keV to 120 keV. On the other hand, the implantation energy for thicker p-side micro-LEDs, such as infrared (IR) micro-LEDs, may range from 80 keV to 400 keV. The implantation dose of the ions may be between $1\times10^{14}$ cm$^{-2}$ and $1\times10^{16}$ cm$^{-2}$. The lateral carrier diffusion in the outer region of the semiconductor layer stack 3290 may be reduced to less than 1 cm$^2$/s by performing ion implantation.

Figure 34:
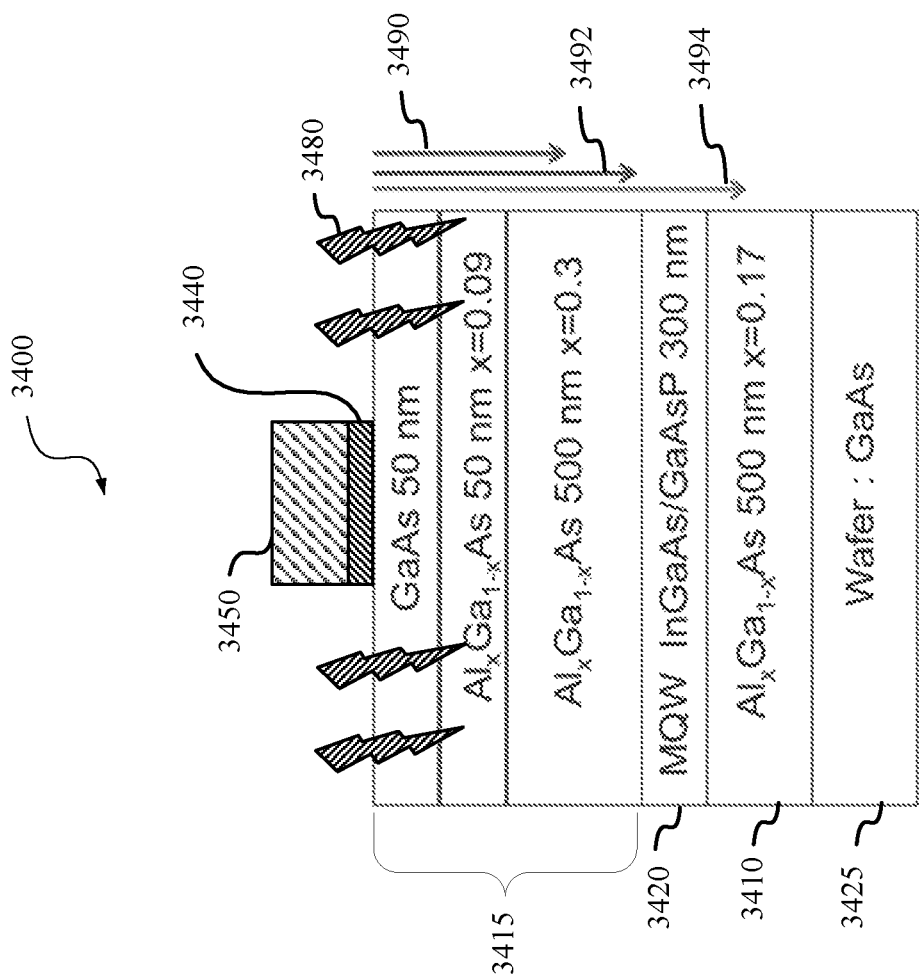

FIGS. 33A, 33B, and 34 show various ion implantation depths for micro-LEDs according to certain embodiments. FIG. 34 shows additional details of the micro-LED shown in FIG. 33A. FIG. 33A shows an infrared micro-LED 3300 that emits light at 940 nm, and FIG. 33B shows a red micro-LED 3305 that emits light at 630 nm. In the examples shown in FIGS. 33A and 33B, the first implantation depth 3390 is 200 nm, the second implantation depth 3392 is 600 nm, and the third implantation depth 3394 is 1000 nm. FIG. 34 shows an infrared micro-LED 3400 that is the same as the infrared micro-LED 3300 shown in FIG. 33A.

As shown in FIGS. 33A and 34, the semiconductor layer stack of the micro-LED 3300/3400 includes a p-side semiconductor layer 3415 that has a 50 nm thick GaAs layer, a 50 nm thick $Al_{0.09}Ga_{0.91}As$ layer, and a 500 nm thick $Al_{0.3}Ga_{0.7}As$ layer. The semiconductor layer stack of the micro-LED 3400 also includes a 300 nm thick InGaAs/GaAsP multiple quantum well (MQW) layer 3420 that is an active light emitting layer, and an n-side semiconductor layer 3410 that has a 500 nm thick $Al_{0.17}Ga_{0.83}As$ layer. The semiconductor layer stack is formed on a GaAs substrate 3425. The first implantation depth 3490 extends from the top of the p-side semiconductor layer 3415 through a depth within the 500 nm thick $Al_{0.3}Ga_{0.7}As$ layer. The second implantation depth 3492 extends from the top of the p-side semiconductor layer 3415 through the interface between the p-side semiconductor layer 3415 and the active light emitting layer 3420. The third implantation depth 3494 extends from the top of the p-side semiconductor layer 3415 through a depth within the n-side semiconductor layer 3410. The micro-LED 3400 includes a p-contact 3440 and a resist 3450 that are used as a mask during ion implantation 3480.

As shown in FIG. 33B, the semiconductor layer stack of the micro-LED 3305 includes a p-side semiconductor layer that has a 200 nm thick GaP layer, a 90 nm thick $In_{0.49}Al_{0.51}P$ layer, and a 10 nm thick $In_{0.5}Al_{0.25}Ga_{0.25}P$ layer. The semiconductor layer stack of the micro-LED 3305 also includes a 180 nm thick InGaP/InAlGaP MQW layer that is an active light emitting layer, and an n-side semiconductor layer that has a 4500 nm thick $Al_{0.6}Ga_{0.4}As$ layer. The semiconductor layer stack is formed on a GaAs substrate. The first implantation depth 3390 extends from the top of the p-side semiconductor layer to the interface between the p-side semiconductor layer and the active light emitting layer. The second implantation depth 3392 and the third implantation depth 3394 extend from the top of the p-side semiconductor layer through different depths within the n-side semiconductor layer.

As shown in FIGS. 33A and 33B, the ions may be implanted to various depths within the micro-LED. For example, the ions may be implanted from a top surface of the p-side semiconductor layer to a depth within the p-side semiconductor layer. Alternatively, the ions may be implanted from a top surface of the p-side semiconductor layer to a depth within the active light emitting layer. As another option, the ions may be implanted from a top surface of the p-side semiconductor layer to a depth within the n-side semiconductor layer.

Figure 35B:
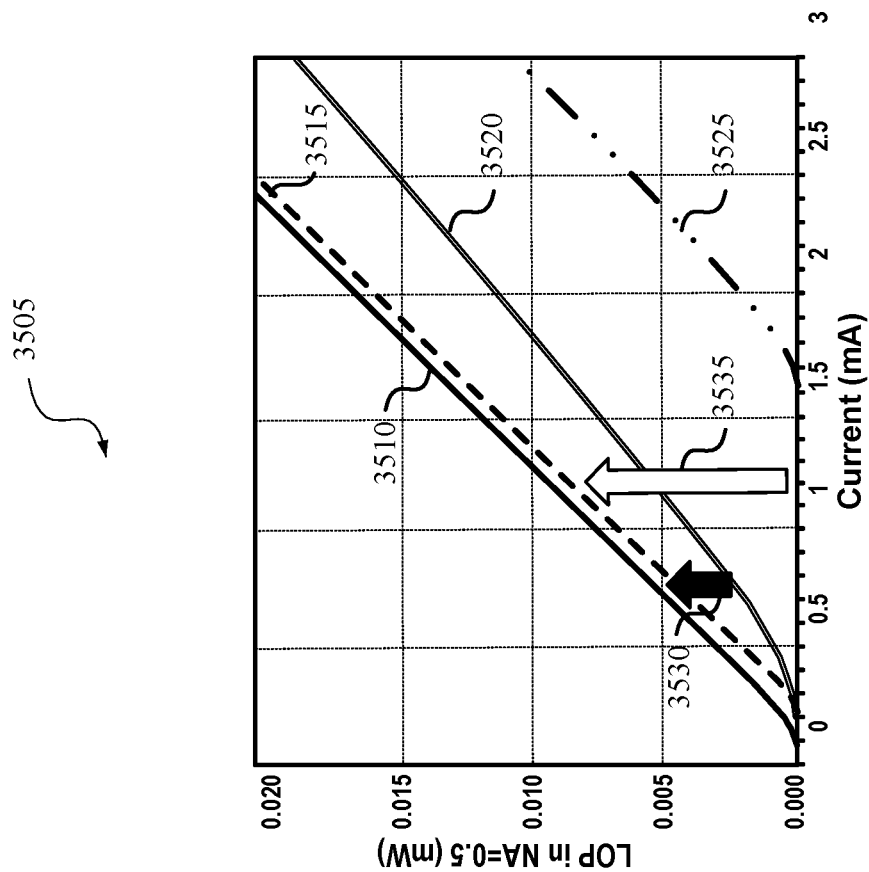
FIGS. 35A and 35B show measurements of characteristics of micro-LEDs for which ion implantation has been performed according to certain embodiments.
Figure 35A:
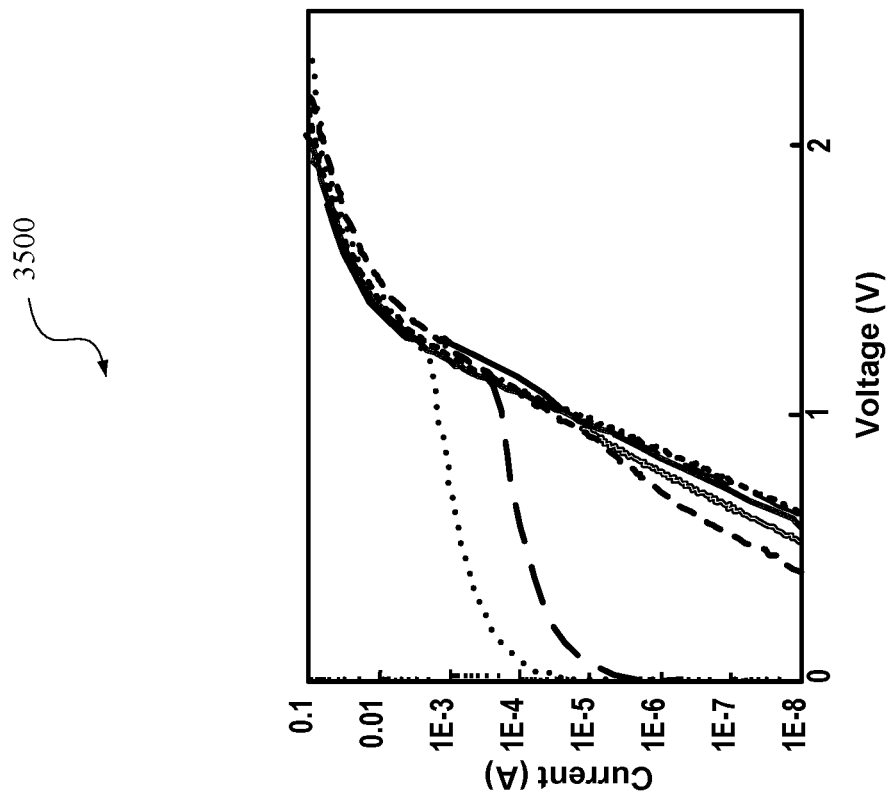

FIGS. 35A and 35B show measurements of characteristics of micro-LEDs for which ion implantation has been performed according to certain embodiments. Specifically, measurements were performed on infrared micro-LEDs that were implanted with H ions to a depth within the active light emitting layer. FIG. 35A shows a plot 3500 of the current as a function of the voltage. FIG. 35B shows a plot 3505 of the LOP in a numerical aperture (NA) of 0.5 as a function of the current. Curve 3510 represents the LOP of a micro-LED having a parabolic mesa shape that was implanted with H ions, and curve 3515 represents the LOP of a micro-LED having a planar mesa shape that was implanted with H ions. In contrast, curve 3520 represents the LOP of a micro-LED having a parabolic mesa shape that was not implanted with H ions, and curve 3515 represents the LOP of a micro-LED having a planar mesa shape that was not implanted with H ions. Arrow 3530 indicates the improvement in LOP for the micro-LED having the parabolic mesa shape, and arrow 3535 indicates the improvement in LOP for the micro-LED having the planar mesa shape. As shown in FIG. 35B, each of the micro-LEDs demonstrated a two-fold increase in LOP at higher currents.

Figure 36A:
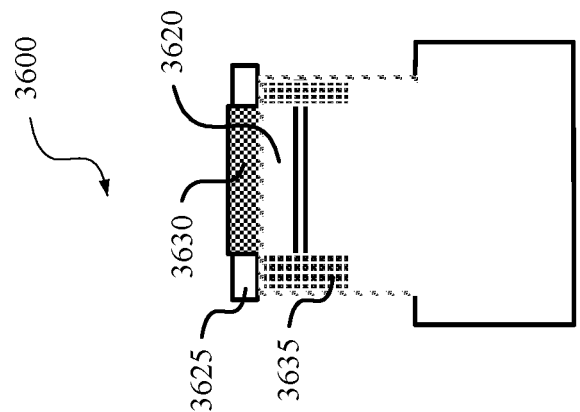
FIGS. 36A-36C illustrate an example of quantum well intermixing that may be performed according to certain embodiments.
Figure 36B:
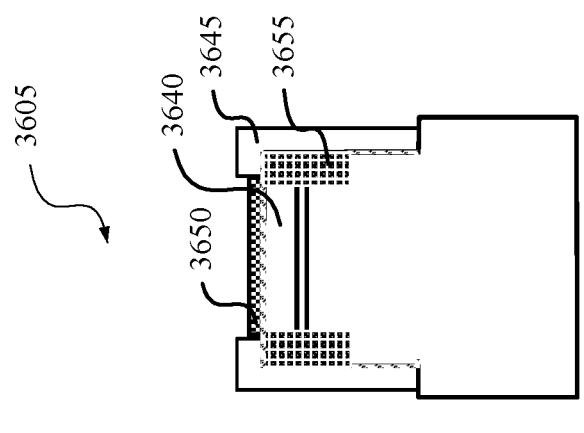
Figure 36C:
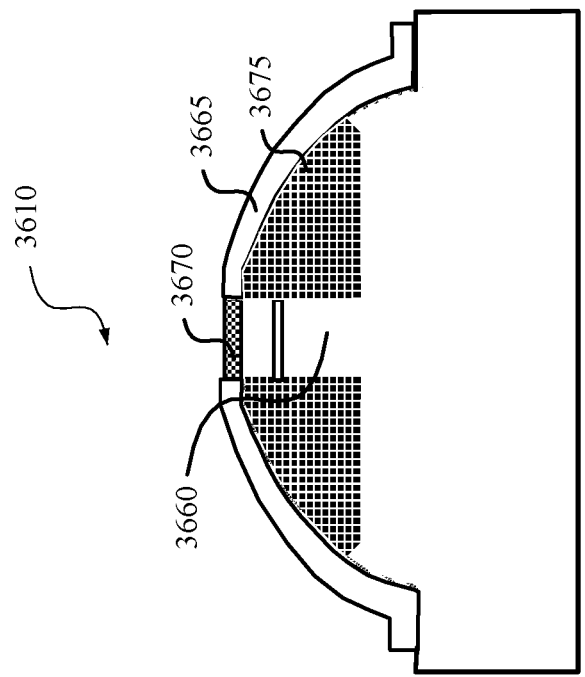

FIGS. 36A-36C illustrate an example of quantum well intermixing that may be performed according to certain embodiments. The method shown in FIGS. 36A-36C may reduce lateral carrier mobility and surface recombination by using quantum well intermixing to change the composition of areas of the semiconductor layer stack outside of the central portion of the micro-LED. The quantum well intermixing reduces the number of electrons that reach the outer surface of the micro-LED, and therefore reduces the amount of surface recombination.

As shown in FIG. 36A, a micro-LED 3600 may include an outer region 3635 where quantum well intermixing is performed, along with a central region 3620 where quantum well intermixing is not performed. In some examples, quantum well intermixing may be used to increase the bandgap in the outer region 3635 of the semiconductor layer stack by implanting ions in the outer region 3635 of the semiconductor layer stack and subsequently annealing the outer region 3635 of the semiconductor layer stack to intermix the ions with atoms within the outer region 3620 of the semiconductor layer stack. The ions may be implanted according to the methods discussed above with regard to FIG. 32. The outer region 3620 of the semiconductor layer stack may be defined by a mask, such as the p-contact 3240 and the resist 3250 described above with reference to FIG. 32. For quantum well intermixing, various ions may be used, such as Al ions. The Al ions may be implanted with an energy of approximately 400 keV, which may result in an implantation depth of approximately 460 nm. More generally, the Al ions may be implanted with an energy between 80 keV and 400 keV.

For example, if the semiconductor layer stack is made of AlInGaP, extra Al may be added at the edges of the quantum wells in the outer region 3635. This increases the bandgap at the edges of the quantum wells, such that the band structure is flat in the center, the conduction band bends upward at the edges, and/or the valence band bends downward at the edges. Accordingly, when electrons are injected from the top of the p-side semiconductor layer, they can freely diffuse in the lateral direction, but are repelled by the higher band structure at the edges, which prevents them from escaping from the side of the structure. For example, the concentration of Al may be increased from 0.3 to 0.5 at the edges of the outer region 3635. The outer region 3635 may form a cross-sectional annular shape. The electrons may be partly or entirely confined to a central area of the light emitting region corresponding to the central region 3620 of the semiconductor layer stack.

In other examples, the micro-LED 3600 may include a cap layer 3630 that is unstrained or lightly strained. The cap layer 3630 may have a diameter of approximately 1 µm. In addition, the micro-LED 3600 may include a dielectric layer 3625 that is highly strained. For example, the dielectric layer 3625 may have a higher level of strain than the cap layer 3630. The dielectric layer 3625 may include a dielectric material such as SiN or $SiO_2$. Quantum well intermixing may be performed by impurity-free vacancy disordering (IFVD), the strained dielectric layer 3625, and annealing. This provides strain-induced quantum well intermixing of Al within the outer region 3635. Another example of a method of quantum well intermixing is impurity-induced disordering (IID) with Zn-diffusion and intermixing, in which Zn-diffusion is performed with an As-overpressure in a chamber, such as an MOVPE reactor or a glass furnace. Yet another example of a method of quantum well intermixing is creating strained SiN by mixed frequency SiN-PECVD. The low frequency (LF) may be 680 kHz while the high frequency (HF) may be 13.56 MHz.

As shown in FIG. 36B, a micro-LED 3605 may include an outer region 3655 where quantum well intermixing is performed, along with a central region 3640 where quantum well intermixing is not performed. In addition, the micro-LED may include a cap layer 3650 that is unstrained or lightly strained, and a dielectric layer 3645 that is highly strained. For example, the dielectric layer 3645 may have a higher level of strain than the cap layer 3650. These components may be similar to those discussed above with regard to FIG. 36A, except that the cap layer 3650 may be thinner than the cap layer 3630, and the dielectric layer 3645 may extend down the sides of the semiconductor layer stack.

As shown in FIG. 36C, a micro-LED 3610 may include an outer region 3675 where quantum well intermixing is performed, along with a central region 3660 where quantum well intermixing is not performed. In addition, the micro-LED may include a cap layer 3670 that is unstrained or lightly strained, and a dielectric layer 3665 that is highly strained. For example, the dielectric layer 3665 may have a higher level of strain than the cap layer 3670. These components may be similar to those discussed above with regard to FIG. 36A, except that the cap layer 3670 may be narrower than the cap layer 3630, and the dielectric layer 3665 may extend down the sides of the semiconductor layer stack. Also, the semiconductor layer stack may have a parabolic mesa shape instead of a vertical mesa shape.

Embodiments disclosed herein may be used to implement components of an artificial reality system or may be implemented in conjunction with an artificial reality system. Artificial reality is a form of reality that has been adjusted in some manner before presentation to a user, which may include, for example, a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including an HMD connected to a host computer system, a standalone HMD, a mobile device or computing system, or any other hardware platform capable of providing artificial reality content to one or more viewers.

Figure 37:
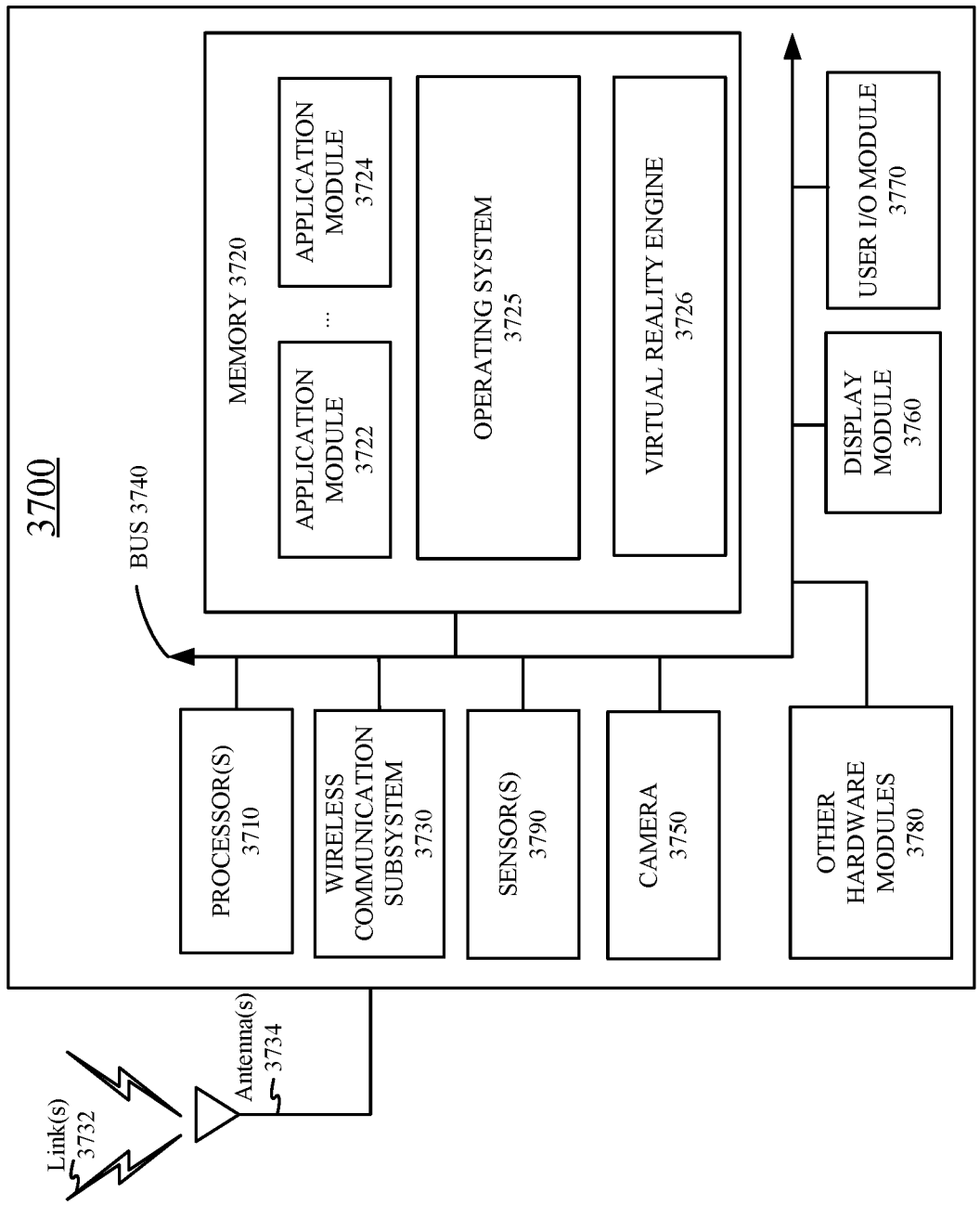
FIG. 37 is a simplified block diagram of an electronic system of an example of a near-eye display according to certain embodiments.

FIG. 37 is a simplified block diagram of an example electronic system 3700 of an example near-eye display (e.g., HMD device) for implementing some of the examples disclosed herein. Electronic system 3700 may be used as the electronic system of an HMD device or other near-eye displays described above. In this example, electronic system 3700 may include one or more processor(s) 3710 and a memory 3720. Processor(s) 3710 may be configured to execute instructions for performing operations at a number of components, and can be, for example, a general-purpose processor or microprocessor suitable for implementation within a portable electronic device. Processor(s) 3710 may be communicatively coupled with a plurality of components within electronic system 3700. To realize this communicative coupling, processor(s) 3710 may communicate with the other illustrated components across a bus 3740. Bus 3740 may be any subsystem adapted to transfer data within electronic system 3700. Bus 3740 may include a plurality of computer buses and additional circuitry to transfer data.

Memory 3720 may be coupled to processor(s) 3710. In some embodiments, memory 3720 may offer both short-term and long-term storage and may be divided into several units. Memory 3720 may be volatile, such as static random access memory (SRAM) and/or dynamic random access memory (DRAM) and/or non-volatile, such as read-only memory (ROM), flash memory, and the like. Furthermore, memory 3720 may include removable storage devices, such as secure digital (SD) cards. Memory 3720 may provide storage of computer-readable instructions, data structures, program modules, and other data for electronic system 3700. In some embodiments, memory 3720 may be distributed into different hardware modules. A set of instructions and/or code might be stored on memory 3720. The instructions might take the form of executable code that may be executable by electronic system 3700, and/or might take the form of source and/or installable code, which, upon compilation and/or installation on electronic system 3700 (e.g., using any of a variety of generally available compilers, installation programs, compression/decompression utilities, etc.), may take the form of executable code.

In some embodiments, memory 3720 may store a plurality of application modules 3722 through 3724, which may include any number of applications. Examples of applications may include gaming applications, conferencing applications, video playback applications, or other suitable applications. The applications may include a depth sensing function or eye tracking function. Application modules 3722-3724 may include particular instructions to be executed by processor(s) 3710. In some embodiments, certain applications or parts of application modules 3722-3724 may be executable by other hardware modules 3780. In certain embodiments, memory 3720 may additionally include secure memory, which may include additional security controls to prevent copying or other unauthorized access to secure information.

In some embodiments, memory 3720 may include an operating system 3725 loaded therein. Operating system 3725 may be operable to initiate the execution of the instructions provided by application modules 3722-3724 and/or manage other hardware modules 3780 as well as interfaces with a wireless communication subsystem 3730 which may include one or more wireless transceivers. Operating system 3725 may be adapted to perform other operations across the components of electronic system 3700 including threading, resource management, data storage control and other similar functionality.

Wireless communication subsystem 3730 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 3700 may include one or more antennas 3734 for wireless communication as part of wireless communication subsystem 3730 or as a separate component coupled to any portion of the system. Depending on desired functionality, wireless communication subsystem 3730 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 3730 may permit data to be exchanged with a network, other computer systems, and/or any other devices described herein. Wireless communication subsystem 3730 may include a means for transmitting or receiving data, such as identifiers of HMD devices, position data, a geographic map, a heat map, photos, or videos, using antenna(s) 3734 and wireless link(s) 3732. Wireless communication subsystem 3730, processor(s) 3710, and memory 3720 may together comprise at least a part of one or more of a means for performing some functions disclosed herein.

Embodiments of electronic system 3700 may also include one or more sensors 3790. Sensor(s) 3790 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 3790 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or any combination thereof. The position sensors may be located external to the IMU, internal to the IMU, or any combination thereof. At least some sensors may use a structured light pattern for sensing.

Electronic system 3700 may include a display module 3760. Display module 3760 may be a near-eye display, and may graphically present information, such as images, videos, and various instructions, from electronic system 3700 to a user. Such information may be derived from one or more application modules 3722-3724, virtual reality engine 3726, one or more other hardware modules 3780, a combination thereof, or any other suitable means for resolving graphical content for the user (e.g., by operating system 3725). Display module 3760 may use LCD technology, LED technology (including, for example, OLED, ILED, µ-LED, AMO-LED, TOLED, etc.), light emitting polymer display (LPD) technology, or some other display technology.

Electronic system 3700 may include a user input/output module 3770. User input/output module 3770 may allow a user to send action requests to electronic system 3700. An action request may be a request to perform a particular action. For example, an action request may be to start or end an application or to perform a particular action within the application. User input/output module 3770 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 3700. In some embodiments, user input/output module 3770 may provide haptic feedback to the user in accordance with instructions received from electronic system 3700. For example, the haptic feedback may be provided when an action request is received or has been performed.

Electronic system 3700 may include a camera 3750 that may be used to take photos or videos of a user, for example, for tracking the user's eye position. Camera 3750 may also be used to take photos or videos of the environment, for example, for VR, AR, or MR applications. Camera 3750 may include, for example, a complementary metal-oxide-semiconductor (CMOS) image sensor with a few millions or tens of millions of pixels. In some implementations, camera 3750 may include two or more cameras that may be used to capture 3-D images.

In some embodiments, electronic system 3700 may include a plurality of other hardware modules 3780. Each of other hardware modules 3780 may be a physical module within electronic system 3700. While each of other hardware modules 3780 may be permanently configured as a structure, some of other hardware modules 3780 may be temporarily configured to perform specific functions or temporarily activated. Examples of other hardware modules 3780 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 3780 may be implemented in software.

In some embodiments, memory 3720 of electronic system 3700 may also store a virtual reality engine 3726. Virtual reality engine 3726 may execute applications within electronic system 3700 and receive position information, acceleration information, velocity information, predicted future positions, or any combination thereof of the HMD device from the various sensors. In some embodiments, the information received by virtual reality engine 3726 may be used for producing a signal (e.g., display instructions) to display module 3760. For example, if the received information indicates that the user has looked to the left, virtual reality engine 3726 may generate content for the HMD device that mirrors the user's movement in a virtual environment. Additionally, virtual reality engine 3726 may perform an action within an application in response to an action request received from user input/output module 3770 and provide feedback to the user. The provided feedback may be visual, audible, or haptic feedback. In some implementations, processor(s) 3710 may include one or more GPUs that may execute virtual reality engine 3726.

In various implementations, the above-described hardware and modules may be implemented on a single device or on multiple devices that can communicate with one another using wired or wireless connections. For example, in some implementations, some components or modules, such as GPUs, virtual reality engine 3726, and applications (e.g., tracking application), may be implemented on a console separate from the head-mounted display device. In some implementations, one console may be connected to or support more than one HMD.

In alternative configurations, different and/or additional components may be included in electronic system 3700. Similarly, functionality of one or more of the components can be distributed among the components in a manner different from the manner described above. For example, in some embodiments, electronic system 3700 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A device comprising:
   a first component comprising a semiconductor layer stack including an n-side semiconductor layer, an active light emitting layer, and a p-side semiconductor layer, wherein the semiconductor layer stack comprises a III-V semiconductor material; and
   a second component comprising a passive or an active matrix integrated circuit within a Si layer, wherein:
   a first dielectric material of the first component has been bonded to a second dielectric material of the second component,
   the first dielectric material and the second dielectric material are configured to become bonded at a first temperature,
   first contacts of the first component are substantially aligned with and have been bonded to second contacts of the second component,
   the first contacts and the second contacts comprise materials that are configured to become bonded at a second temperature higher than the first temperature,
   the first contacts form a first pattern within the first dielectric material of the first component,
   the second contacts form a second pattern within the second dielectric material of the second component,
   the III-V semiconductor material has a higher thermal expansion coefficient than the Si layer,
   the first contacts and the second contacts have higher thermal expansion coefficients than the first dielectric material and the second dielectric material,
   an overlay exists between at least some of the first contacts and the second contacts due to expansion of the first contacts and the second contacts during bonding at the second temperature, and
   a maximum overlay between any contact of the first contacts and a corresponding one of the second contacts is less than 200 nm.

2. The device of claim 1, wherein a surface of at least one of the first contacts, the second contacts, the first dielectric material, or the second dielectric material is planarized.

3. The device of claim 1, wherein a thickness of the semiconductor layer stack is less than 2 µm.

4. The device of claim 1, wherein the first dielectric material of the first component is bonded to the second dielectric material of the second component by a dielectric bond.

5. The device of claim 4, wherein the first dielectric material and the second dielectric material comprise at least one of $SiCN$, $SiO_2$, $SiN$, $Al_2O_3$, $HfO_2$, $ZrO_2$, or $Ta_2O_5$.

6. The device of claim 5, wherein at least one of the first dielectric material or the second dielectric material comprises SiCN.

7. The device of claim 1, wherein the first contacts of the first component are bonded to the second contacts of the second component by a metal-to-metal bond.

8. The device of claim 1, wherein the first contacts of the first component and the second contacts of the second component comprise at least one of Cu, Au, Al, W, Mo, Ag, Ni, Ti, Pt, or Pd.

9. The device of claim 1, wherein the semiconductor layer stack comprises at least one of (AlGaIn)P, (AlGaIn)AsP, (AlGaIn)AsN, (AlGaIn)PAs, (Eu:InGa)N, or (AlGaIn)N.

10. The device of claim 1, wherein the first dielectric material and the second dielectric material have a bond energy between 2,000 $mJ/m^2$ and 3,000 $mJ/m^2$ at temperatures equal to or greater than an ambient temperature.

11. The device of claim 1, wherein the second contacts include:
   a p-contact that is configured to, in combination with an n-contact of the second component, drive a one-dimensional or two-dimensional array of micro-LEDs of the first component; or
   an n-contact that is configured to, in combination with a p-contact of the second component, drive a one-dimensional or two-dimensional array of micro-LEDs of the first component.

12. The device of claim 1, wherein the first temperature is an ambient temperature, and wherein the second temperature is 250° C. or higher.

13. The device of claim 1, further comprising:
   a plurality of light emitting diode (LED) mesas formed from the semiconductor layer stack, wherein the plurality of LED mesas includes at least two mesas that are separated by a trench extending through the n-side semiconductor layer, the active light emitting layer, and the p-side semiconductor layer.

14. The device of claim 13, wherein the trench extends from a surface of the n-side semiconductor layer opposite the second component to the Si layer of the second component.

15. The device of claim 14, wherein the trench extends through one of the second contacts.

16. The device of claim 1, further comprising:
a thermal expansion coefficient (TEC) compensation layer formed on a surface of the first component or a surface of the second component, wherein the TEC compensation layer comprises a material with a thermal expansion coefficient higher than that of the III-V semiconductor material and the Si layer.

* * * * *